(12) United States Patent
Kim et al.

(10) Patent No.: US 11,056,054 B2
(45) Date of Patent: *Jul. 6, 2021

(54) DISPLAY DEVICE

(71) Applicant: SAMSUNG DISPLAY CO., LTD., Yongin-si (KR)

(72) Inventors: Yang Wan Kim, Yongin-si (KR); Sun Ja Kwon, Yongin-si (KR); Byung Sun Kim, Yongin-si (KR); Hyun Ae Park, Yongin-si (KR); Su Jin Lee, Yongin-si (KR); Jae Yong Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/690,205

(22) Filed: Nov. 21, 2019

(65) Prior Publication Data

US 2020/0090584 A1 Mar. 19, 2020

Related U.S. Application Data

(63) Continuation of application No. 15/398,391, filed on Jan. 4, 2017, now Pat. No. 10,490,122.

(30) Foreign Application Priority Data

| Feb. 29, 2016 | (KR) | 10-2016-0024701 |
| Apr. 4, 2016 | (KR) | 10-2016-0041327 |
| May 25, 2016 | (KR) | 10-2016-0064116 |

(51) Int. Cl.
*G09G 3/30* (2006.01)
*G09G 3/3225* (2016.01)
(Continued)

(52) U.S. Cl.
CPC ......... *G09G 3/3225* (2013.01); *G09G 3/3233* (2013.01); *G09G 3/3266* (2013.01);
(Continued)

(58) Field of Classification Search
CPC .. G09G 3/3225; G09G 3/3233; G09G 3/3266; G09G 2300/0842;
(Continued)

(56) References Cited

U.S. PATENT DOCUMENTS

| 6,774,414 B2 | 8/2004 | Chang |
| 7,579,624 B2 | 8/2009 | Takasugi et al. |

(Continued)

FOREIGN PATENT DOCUMENTS

| CN | 1628263 | 6/2005 |
| CN | 1836269 | 9/2006 |

(Continued)

OTHER PUBLICATIONS

Non-Final Office Action issued in corresponding U.S. Appl. No. 15/712,657 dated Jan. 11, 2019.

(Continued)

Primary Examiner — Adam R. Giesy
(74) Attorney, Agent, or Firm — F. Chau & Associates, LLC

(57) ABSTRACT

A display device includes a substrate including a first pixel region and a second pixel region having a smaller area than the first pixel region. The second pixel region is connected to the first pixel region. A first pixel is provided in the first pixel region and a second pixel is provided in the second pixel region. A first line is connected to the first pixel and a second line is connected to the second pixel. A dummy unit overlaps at least one of the first line and the second line, and compensates for a difference in load values between the first and second lines.

20 Claims, 30 Drawing Sheets

(51) Int. Cl.
  *H01L 27/12* (2006.01)
  *G09G 3/3233* (2016.01)
  *G09G 3/3266* (2016.01)
  *H01L 27/32* (2006.01)

(52) U.S. Cl.
  CPC ........ *H01L 27/124* (2013.01); *H01L 27/3223* (2013.01); *H01L 27/3262* (2013.01); *H01L 27/3276* (2013.01); *G09G 2300/0413* (2013.01); *G09G 2300/0426* (2013.01); *G09G 2300/0842* (2013.01); *G09G 2300/0861* (2013.01); *G09G 2310/0262* (2013.01)

(58) Field of Classification Search
  CPC ... G09G 2300/0861; G09G 2310/0262; G09G 2300/0413; G09G 2300/0426; H01L 27/124; H01L 27/3223; H01L 27/3262; H01L 27/3276; H01L 27/3244
  See application file for complete search history.

(56) References Cited

U.S. PATENT DOCUMENTS

| | | | |
|---|---|---|---|
| 7,911,423 | B2 | 3/2011 | Kim et al. |
| 8,325,116 | B2 | 12/2012 | Takasugi et al. |
| 8,350,972 | B2 | 1/2013 | Taneda et al. |
| 8,665,249 | B2 | 3/2014 | Suh |
| 8,736,525 | B2 | 5/2014 | Kawabe |
| 9,305,508 | B2 | 4/2016 | Park et al. |
| 9,716,132 | B2 | 7/2017 | Kinoshita |
| 9,837,022 | B2 | 12/2017 | Lee et al. |
| 10,115,780 | B2 | 10/2018 | Kim et al. |
| 10,229,964 | B2 | 3/2019 | Kim et al. |
| 10,354,578 | B2 | 7/2019 | Ka et al. |
| 10,403,193 | B2 | 9/2019 | Kim et al. |
| 10,418,597 | B2 | 9/2019 | Li et al. |
| 10,467,958 | B2 | 11/2019 | Kim et al. |
| 10,490,119 | B2 | 11/2019 | Kim et al. |
| 10,490,122 | B2 | 11/2019 | Kim et al. |
| 10,504,446 | B2 | 12/2019 | Kim et al. |
| 10,516,016 | B2 | 12/2019 | Kim et al. |
| 10,636,859 | B2 | 4/2020 | Park et al. |
| 10,748,472 | B2 | 8/2020 | Kim et al. |
| 2003/0030630 | A1 | 2/2003 | Bayot et al. |
| 2004/0012744 | A1 | 1/2004 | Ishige et al. |
| 2004/0125258 | A1 | 7/2004 | Moon et al. |
| 2006/0244387 | A1 | 11/2006 | Park et al. |
| 2006/0290618 | A1 | 12/2006 | Goto |
| 2007/0080433 | A1 | 4/2007 | Lai |
| 2008/0218450 | A1 | 9/2008 | Park |
| 2009/0102758 | A1 | 4/2009 | Anzai et al. |
| 2009/0102824 | A1 | 4/2009 | Tanaka et al. |
| 2009/0303260 | A1 | 12/2009 | Takasugi |
| 2009/0303404 | A1 | 12/2009 | Kretz |
| 2010/0020059 | A1 | 1/2010 | Suh |
| 2010/0039604 | A1 | 2/2010 | Kim |
| 2010/0073335 | A1 | 3/2010 | Min et al. |
| 2010/0177024 | A1 | 7/2010 | Choi |
| 2010/0187533 | A1 | 7/2010 | Chang |
| 2011/0084955 | A1 | 4/2011 | Kim |
| 2013/0106817 | A1 | 5/2013 | Gang et al. |
| 2015/0022513 | A1 | 1/2015 | Kim |
| 2015/0325593 | A1 | 11/2015 | Shih et al. |
| 2015/0331290 | A1 | 11/2015 | Jung et al. |
| 2016/0012768 | A1 | 1/2016 | In et al. |
| 2016/0019856 | A1 | 1/2016 | Tanaka et al. |
| 2016/0027380 | A1 | 1/2016 | Kim et al. |
| 2016/0035811 | A1 | 2/2016 | Choi et al. |
| 2016/0086977 | A1 | 3/2016 | Go et al. |
| 2016/0190166 | A1 | 6/2016 | Kim et al. |
| 2016/0111040 | A1 | 7/2016 | Kim et al. |
| 2016/0240141 | A1 | 8/2016 | Lee et al. |
| 2016/0321992 | A1 | 11/2016 | Kim et al. |
| 2017/0249896 | A1 | 8/2017 | Kim et al. |
| 2018/0005585 | A1 | 1/2018 | Kim et al. |
| 2018/0075804 | A1 | 3/2018 | Kim et al. |
| 2018/0090061 | A1 | 3/2018 | Kim et al. |
| 2018/0151660 | A1 | 5/2018 | Kim et al. |
| 2018/0151663 | A1 | 5/2018 | Kim et al. |
| 2018/0240856 | A1 | 8/2018 | Kim et al. |
| 2019/0035876 | A1 | 1/2019 | Kim et al. |
| 2020/0090584 | A1 | 3/2020 | Kim et al. |
| 2020/0098310 | A1 | 3/2020 | Kim et al. |

FOREIGN PATENT DOCUMENTS

| | | |
|---|---|---|
| CN | 101561992 | 10/2009 |
| CN | 101578649 | 11/2009 |
| CN | 101313349 | 12/2010 |
| CN | 102396020 | 3/2012 |
| CN | 103579221 | 2/2014 |
| CN | 104077998 | 10/2014 |
| CN | 105204248 | 12/2015 |
| CN | 106711180 | 5/2017 |
| EP | 1063630 | 12/2000 |
| EP | 2085952 | 8/2009 |
| EP | 3232431 | 10/2017 |
| EP | 3264405 | 1/2018 |
| JP | 2007-232981 | 9/2007 |
| KR | 10-0672792 | 1/2007 |
| KR | 1020080060886 | 7/2008 |
| KR | 10-2009-0005651 | 1/2009 |
| KR | 10-1054327 | 8/2011 |
| KR | 10-1064425 | 9/2011 |
| KR | 10-1101070 | 12/2011 |
| KR | 10-1376664 | 3/2014 |
| KR | 10-1416529 | 7/2014 |
| KR | 10-1432126 | 8/2014 |
| KR | 10-2016-0099770 | 8/2016 |
| KR | 10-2017-0102147 | 9/2017 |
| KR | 10-2018-0003747 | 1/2018 |
| KR | 10-2018-0029133 | 3/2018 |
| KR | 10-2018-0033373 | 4/2018 |
| KR | 10-2018-0061565 | 6/2018 |
| WO | 2007069187 | 6/2007 |

OTHER PUBLICATIONS

European Office Action issued in European patent application No. 17166354.5 dated Jun. 3, 2019.

Extended European Search issued in European Patent Application No. 17158534.2 dated Jul. 14, 2017.

Office Action dated May 17, 2018 issued in corresponding U.S. Appl. No. 15/434,196.

Office Action dated May 25, 2018 issued in corresponding U.S. Appl. No. 15/611,297.

European Result of consultation dated Jul. 13, 2020 issued in corresponding European Patent Application No. 17166354.5 corresponding to U.S. Pat. No. 10,354,578.

Uchida Yoshihiro et al., "Parasitic capacitance modeling for TFT liquid crystal displays", Essderc, 03. 33rd Conference on European Solid-State Device Research, Oct. 2004, pp. 453-456.

Zhou Lei et al., "Design Analysis of Large Size Metal Oxide TFT Panel", Chinese Journal of Luminescence, vol. 36, No. 5, May 2015, pp. 577-582.

DISPLAY DEVICE

CROSS-REFERENCE TO RELATED APPLICATIONS

This application is a continuation of U.S. patent application Ser. No. 15/398,391 filed Jan. 4, 2017, which claims priority under 35 U.S.C. § 119 to Korean Patent Application No. 10-2016-0024701, filed on Feb. 29, 2016, in the Korean Intellectual Property Office, Korean Patent Application No. 10-2016-0041327, filed on Apr. 4, 2016, in the Korean Intellectual Property Office, and Korean Patent Application No. 10-2016-0064116, filed on May 25, 2016, in the Korean Intellectual Property Office, the disclosures of which are incorporated by reference herein in their entireties.

TECHNICAL FIELD

Exemplary embodiments of the present invention relate to a display device, and more particularly, to a display device including regions having different shapes and/or sizes.

DISCUSSION OF THE RELATED ART

An organic light emitting display device may include a plurality of pixels. Each pixel may include an organic light emitting diode. The organic light emitting diode may include two electrodes and an organic light-emitting layer interposed therebetween. Excitons are formed by combining electrons injected from one electrode with holes injected from another electrode on the organic light emitting layer. The excitons emit light while releasing energy.

The organic light emitting display device is a self-emitting device. Each pixel of the organic light emitting display device includes wire lines and a plurality of transistors connected to the wire lines for driving the organic light emitting diode connected thereto. The wire lines may have different degrees of load values depending on the lengths thereof. Accordingly, a final image displayed by the organic light emitting display device may have different brightness levels due to a difference of the load values.

SUMMARY

Exemplary embodiments of the present invention relate to a display device having a uniform brightness across a display area of the display device.

According to an exemplary embodiment of the present invention, a display device includes a substrate including a first pixel region and a second pixel region having a smaller area than the first pixel region, wherein the second pixel region is connected to the first pixel region, a first pixel provided in the first pixel region and a second pixel provided in the second pixel region, a first line connected to the first pixel and a second line connected to the second pixel, and a dummy unit overlapping at least one of the first line and the second line, and compensating for a difference in load values between the first and second lines.

According to an exemplary embodiment of the present invention, a display device includes a substrate including a first pixel region, a second pixel region connected to the first pixel region, and a third pixel region spaced apart from the second pixel region, wherein the second pixel region is smaller than the first pixel region, a first pixel is provided in the first pixel region, a second pixel is provided in the second pixel region and a third pixel is provided in the third pixel region, a first scan line is connected to the first pixel, a second scan line is connected to the second pixel and a third scan line is connected to the third pixel, and a first dummy unit is overlapped with the second scan line and a second dummy unit is overlapped with the third scan line, wherein the first and second dummy units compensate for a difference in load values between the first, second and third scan lines.

According to an exemplary embodiment of the present invention, a display device includes a first pixel region and a second pixel region, wherein the first and second pixel regions have different shapes or sizes with respect to each other, a first peripheral region disposed adjacent to the first pixel region and a second peripheral region disposed adjacent to the second pixel region, a first pixel provided in the first pixel region, a second pixel and a third pixel provided in the second pixel region, a first scan line connected to the first pixel and partially disposed in the first peripheral region, a second scan line connected to the second pixel and partially disposed in the second peripheral region, and a third scan line connected to the third pixel and partially disposed in the second peripheral region, wherein at least two of the first, second and third scan lines have different lengths, and a first dummy line overlapping at least one of the first, second and third scan lines in the first and second peripheral regions to generate a capacitance difference between the first dummy line and the at least two of the first, second and third scan lines that have different lengths.

BRIEF DESCRIPTION OF THE DRAWINGS

The above and other features of the present invention will become more apparent by describing in detail exemplary embodiments thereof in conjunction with the accompanying drawings, in which.

DETAILED DESCRIPTION OF THE EMBODIMENTS

Figure 1:
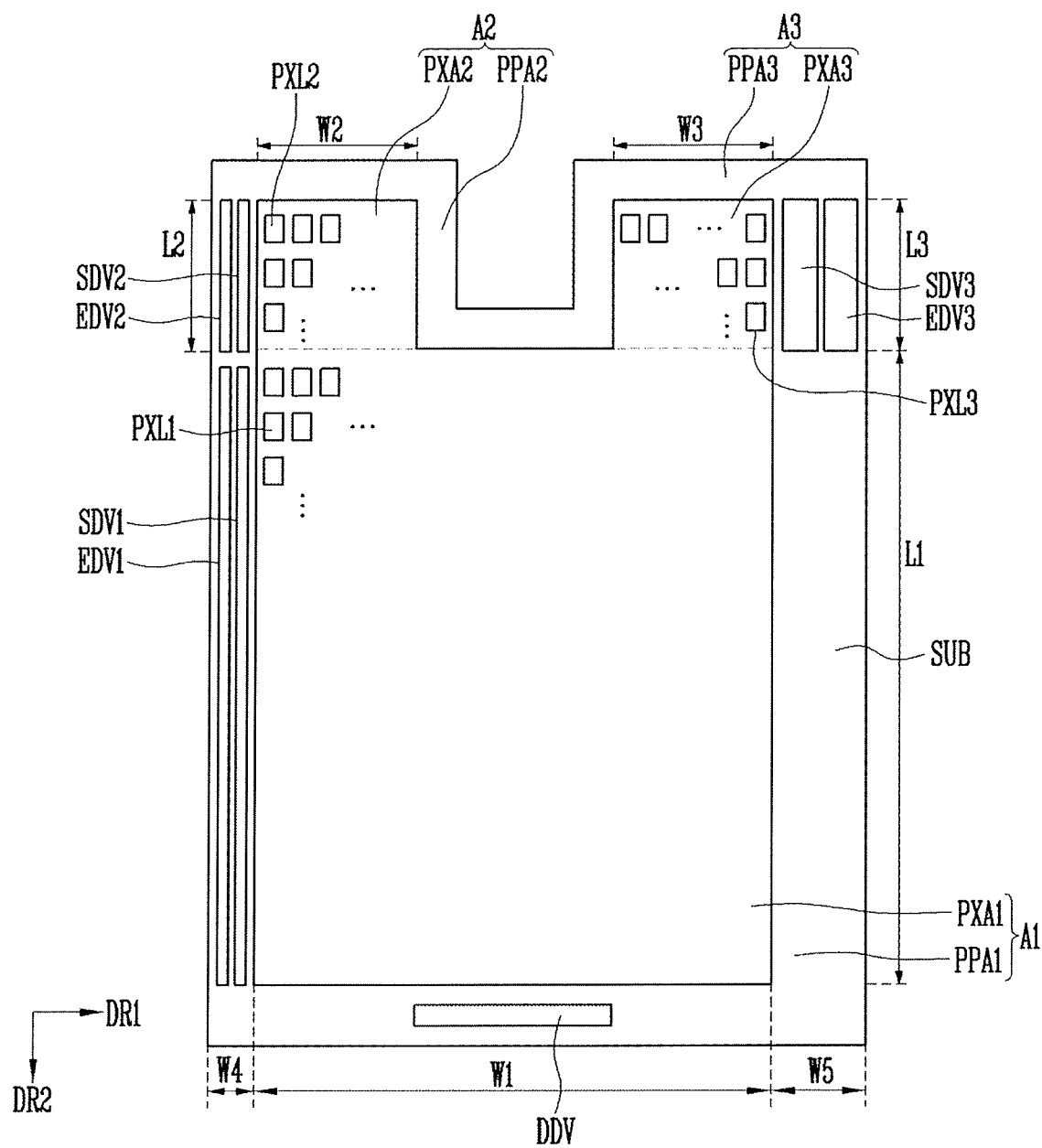
FIG. 1 is a plan view illustrating a display device in accordance with an exemplary embodiment of the present invention.

Hereinafter, exemplary embodiments of the present invention will be explained in detail with reference to the accompanying drawings. The present invention may be embodied in various different forms, and should not be construed as being limited only to the illustrated exemplary embodiments thereof described below.

Like reference numerals may denote like elements throughout the attached drawings and the specification. The relative sizes of elements, layers, and regions may be exaggerated for clarity. The description of an element in the singular form may include the plural form as well, unless the context clearly indicates otherwise.

In addition, it will be understood that when an element, a layer, a region, or a substrate is referred to as being "on" another element, layer, region or substrate, it may be directly disposed on the other element, layer, region or substrate, or intervening elements, layers, regions or substrates may be disposed therebetween.

Hereinafter, exemplary embodiments of the present invention will be described in detail with reference to the accompanying drawings.

FIG. 1 is a plan view illustrating a display device in accordance with an exemplary embodiment of the present invention.

Referring to FIG. 1, a display device according to an exemplary embodiment of the present invention may include a substrate SUB, a plurality of pixels PXL provided on the substrate SUB and including, for example, pixels PXL1, PXL2 and PXL3, a driver provided on the substrate SUB and driving the pixels PXL, and a wire unit connecting the pixels PXL to the driver.

The substrate SUB may include a plurality of regions, and at least two of the plurality of regions may be different from each other in size and/or shape. When the substrate SUB includes, for example, two regions, the two regions may have different sizes and/or shapes. When the substrate SUB includes, for example, three regions, all three regions may have different sizes and/or shapes from each other, or only two of the three regions may have different sizes and/or shapes from each other. In addition, the substrate SUB may include four or more regions.

In the following example, for convenience of explanation, the substrate SUB includes three regions, for example, a first region A1, a second region A2 and a third region A3.

Each of the first to third regions A1 to A3 may have a roughly rectangular shape. In an exemplary embodiment of the present invention, any of the first to third regions A1 to A3 may have a polygonal shape or a curved edge.

The first to third regions A1, A2 and A3 may include pixel regions PXA1, PXA2, and PXA3 (hereinafter, PXA), and peripheral regions PPA1, PPA2 and PPA3 (hereinafter, PPA). The pixel regions PXA include the pixels PXL for displaying an image. The pixels PXL may be not provided in peripheral regions PPA. Accordingly, an image is not displayed in the peripheral regions PPA. The driver for driving the pixels PXL and the wire lines of a wire unit for connecting the pixels PXL to the driver may be disposed at least partially on the peripheral regions PPA. The wire lines of the wire unit may be referred to as the wire lines. The peripheral regions PPA may correspond to a bezel of a display device. Accordingly, a width of the bezel may depend on the width of the peripheral regions PPA.

The first to third regions A1 to A3, respectively, are described as follows.

The first region A1 may include the largest area among the first to third regions A1 to A3. The first region A1 may include the first pixel region PXA1 for displaying an image and the first peripheral region PPA1 surrounding at least a portion of the first pixel region PXA1.

The first pixel region PXA1 may be provided in a shape corresponding to a shape of the first region A1. In an exemplary embodiment of the present invention, the first pixel region PXA1 may have a first width W1 in a first direction DR1 and a first length L1 in a second direction DR2 intersecting the first direction DR1.

The first peripheral region PPA1 may be provided on at least one side of the first pixel region PXA1. In an exemplary embodiment of the present invention, the first peripheral region PPA1 may surround a periphery of the first pixel region PXA1, except for a portion in which a second region A2 and a third region A3 are disposed. In an exemplary embodiment of the present invention, the first peripheral region PPA1 may include a horizontal unit extending in a width direction (e.g., the first direction DR1) and a vertical unit extending in a longitudinal direction (e.g., the second direction DR2). Vertical units of the first peripheral region PPA1 may be provided in pairs to be spaced apart from each other along the width direction of the first pixel region PXA1.

The second region A2 may have a smaller area than the first region A1. The second region A2 may include a second pixel region PXA2 and a second peripheral region PPA2 surrounding at least a portion of the second pixel region PXA2.

The second pixel region PXA2 may be provided in a shape corresponding to the shape of the second region A2. In an exemplary embodiment of the present invention, the second pixel region PXA2 may have a second width W2 smaller than the first width W1 of the first region A1. The second pixel region PXA2 may have a second length L2 smaller than a first length L1 of the first region A1. The second pixel region PXA2 may be provided in the form of a protrusion protruding from the first pixel region PXA1, and directly connected to the first pixel region PXA1. In other words, an edge of the second pixel region PXA2 closest to the first pixel region PXA1 may coincide with a portion of an edge of the first pixel region PXA1.

The second peripheral region PPA2 may be provided on at least one side of the second pixel region PXA2. In an exemplary embodiment of the present invention, the second peripheral region PPA2 may surround a periphery of the second pixel region PXA2, but it is not provided on a portion of the second pixel region PXA2 to which the first pixel region PXA1 is connected. In an exemplary embodiment of the present invention, the second peripheral region PPA2 may also include a horizontal unit extending in the width direction and a vertical unit extending in the longitudinal direction. Vertical units of the second peripheral region PPA2 may be provided in pairs to be spaced apart from each other along the width direction of the second pixel region PXA2.

The third region A3 may have a smaller area than the first region A1. The third region A3 has an area that may be the same as or different from the area of the second region A2. The third region A3 may include a third pixel region PXA3 and a third peripheral region PPA3 surrounding at least a portion of the third pixel region PPA3. The third pixel region PPA3 may display an image.

The third pixel region PXA3 may be provided in a shape corresponding to the shape of the third region A3. In an exemplary embodiment of the present invention, the third pixel region PXA3 may have a third width W3 smaller than the first width W1 of the first region A1. The third pixel region PXA3 may have a third length L3 smaller than the first length L1 of the first region A1. The second width W2 and the third width W3 may be equal to each other, and the second length L2 and the third length L3 may be equal to each other. In addition, the second width W2 and the third width W3 may be different from each other, and the second length L2 and the third length L3 may be different from each other.

The third pixel region PXA3 may be provided in the form of a protrusion protruding from the first pixel region PXA, and directly connected to the pixel region PXA1. In other words, an edge of the third pixel region PXA3 closest to the first pixel region PXA1 may coincide with a portion of an edge of the first pixel region PXA1.

The third peripheral region PPA3 may be provided on at least one side of the third pixel region PXA3. In an exemplary embodiment of the present invention, the third peripheral region PPA3 may surround a periphery of the third pixel region PXA3, but it is not provided to a portion in which the first pixel region PXA1 is connected to the third pixel region PXA3. In an exemplary embodiment of the present invention, the third peripheral region PPA3 may include a horizontal unit extending in the width direction and a vertical unit extending in the longitudinal direction. Vertical units of the third peripheral region PPA3 may also be provided with in pairs to be spaced apart from each other along the width direction of the first pixel region PXA1.

In an exemplary embodiment of the present invention, the third region A3 may have a shape that is line-symmetric with the second region A2. In this case, the arrangement of the components provided in the third region A3 may be substantially the same as the arrangement of the components provided in the second region A2.

In an exemplary embodiment of the present invention, the vertical unit of the first peripheral region PPA1 may be connected to portions of the vertical units of the second peripheral region PPA2 and the third peripheral region PPA3, respectively. For example, a vertical unit on the left side of the first peripheral region PPA1 may be connected to a vertical unit on the left side of the second peripheral region PPA2. A vertical unit on the right side of the first peripheral region PPA1 may be connected to a vertical unit on the right side of the third peripheral unit PPA3. In addition, the left side vertical unit of the first peripheral region PPA1 and the left side vertical unit of the second peripheral region PPA2 have widths W4 which may be equal to each other. The right side vertical unit of the first peripheral region PPA1 and the right side vertical unit of the third peripheral region PPA3 have widths W5 which may be equal to each other.

The widths W4 may be different from the widths W5. For example, the widths W4 may be smaller than the widths W5.

The pixels PXL may be provided in the pixel region PXA of the substrates SUB, for example, in the first to third pixel regions on the PXA1, PXA2 and PXA3. Each pixel PXL may be provided in a plural number for displaying an image. The pixels PXL may include an organic light-emitting diode (OLED) for emitting colored light. Each pixel PXL may emit color of one of red, green, blue, and white. However, the present invention is not limited thereto. For example, each pixel PXL may also emit color of one of cyan, magenta, yellow, etc.

The pixels PXL may include first pixels PXL1 arranged in the first pixel region PXA1, second pixels PXL2 arranged in the second pixel region PXA2, and third pixels regions PXA3 arranged in the third pixel regions PXL3. In an exemplary embodiment of the present invention, the first to third pixels PXL1, PXL2 and PXL3 each may be provided in plural numbers and arranged in a matrix. For example, the first to third pixels PXL1, PXL2 and PXL3 may be arranged along rows extending in the first direction DR1 and columns extending in the second direction DR2. However, the arrangement of the first to third pixels PXL1, PXL2 and PXL3 is not limited to that described above. For example, the first to third pixels PXL1, PXL2 and PXL3 may be variously arranged. The first pixels PXL1 may be arranged so that the first direction DR1 is a row direction. However, the second pixels PXL2 may be arranged in a direction that is different from the first direction DR1, for example, in a direction that is inclined with respect to the first direction DR1. In addition, the third pixels PXL3 may be arranged in a direction which is the same as or different from the direction along which the first pixels PXL1 and/or the second pixels PXL2 are arranged. Alternately, in an exemplary embodiment of the present invention, the row direction may be the second direction DR2 and the column direction may be the first direction DR1.

The driver may provide a signal to each pixel PXL through the wire unit, and the driver may control the driving of each pixel PXL accordingly. In FIG. 1, for convenience of explanation, the wire unit has been omitted. However, the wire unit will be described below.

Figure 4:
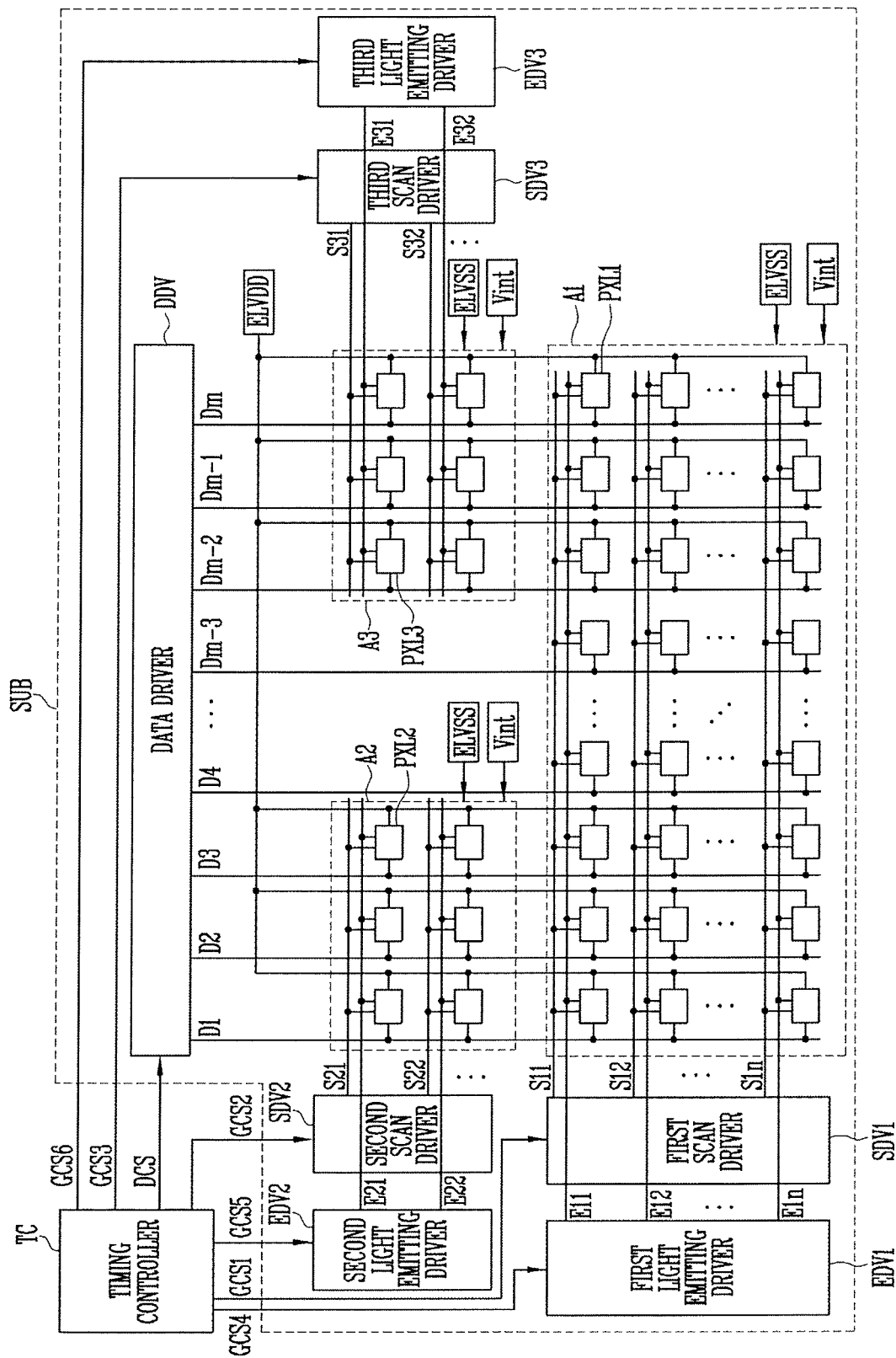
FIG. 4 is a block view illustrating a pixel and a driver in accordance with an exemplary embodiment of the present invention.

The driver may include a scan driver SDV1, SDV2, and SDV3 (hereafter, SDV), light-emitting drivers EDV1, EDV2 and EDV3 (hereafter, EDV) that provide a light emitting control signal to each pixel PXL along a light emitting control line, a data driver DDV for providing a data signal to each pixel PXL along a data line, and a timing controller TC (see FIG. 4). The timing controller may control the scan driver SDV, the light emitting driver EDV, and the data driver DDV.

In an exemplary embodiment of the present invention, the scan driver SDV may include a first scan driver SDV1 connected to the first pixels PXL1, a second scan driver SDV2 connected to the second pixels PXL2, and a third scan driver SDV3 connected to the third pixels PXL3. In an exemplary embodiment of the present invention, the light-emitting driver EDV may include a first light-emitting driver EDV1 connected to the first pixels PXL1, a second light emitting driver EDV2 connected to the second pixels PXL2, and a third light emitting driver EDV3 connected to the third pixels PXL3.

The first scan driver SDV1 may be disposed in the vertical unit of the first peripheral region PPA1. Since the vertical unit of the first peripheral region PPA1 may be provided in a pair that is spaced apart from each other along the width direction of the first pixel region PXA1, the first scan driver SDV1 may be elongated along the longitudinal direction of the first peripheral region PPA1.

The second scan driver SDV2 may be arranged in the second peripheral region PPA2, and the third scan driver SDV3 may be arranged in the third peripheral region PPA3. In an exemplary embodiment of the present invention, the scan driver SDV may be directly mounted on the substrate SUB. When the scan driver SDV is directly mounted on the substrate SUB, the scan driver SVB may be formed in a process of forming the pixels PXL. However, a location or method of providing the scan driver SDV may be not limited thereto. For example, the scan driver SDV may be formed on the substrate SUB as a chip-on-glass type, or mounted on a printed circuit substrate SUB to be connected to the substrate SUB through a connection member. In addition, the first light-emitting driver EDV1 may be arranged in the vertical unit of the first peripheral region PPA1 in a similar manner as the first scan driver SDV1. The first light emitting driver EDV1 may be arranged on at least one side of the vertical unit of the first peripheral region PPA1. The first light-emitting driver EDV1 may be elongated in the longitudinal direction of the first peripheral region PPA1.

The second light-emitting driver EDV2 may be arranged in the second peripheral region PPA2 and the third light emitting driver EDV3 may be disposed in the third peripheral region PPA3.

In an exemplary embodiment of the present invention, the light-emitting driver EDV may be directly on mounted the substrate SUB. When the light-emitting driver EDV is directly mounted on the substrate SUB, the light-emitting driver EDV may be formed simultaneously with the pixels PXL. However, the location or the method of providing the light-emitting drive EDV may be not limited thereto. For example, the light-emitting driver EDV may be formed on the substrate SUB as a chip-on-glass type, or mounted on a printed circuit substrate SUB to be connected to the substrate SUB through a connection member.

In an exemplary embodiment of the present invention, it is illustrated that the scan driver SDV and the light-emitting driver EDV may be adjacent to each other, and formed on one side of the pairs of the vertical units of the peripheral regions PPA. However, the present invention is not limited thereto, and the arrangement may be modified in various ways. For example, the first scan driver SDV1 may be provided on one side of the vertical unit of the first light-emitting driver EDV1, and the first light emitting driver EDV1 may be provided on another side of the vertical unit of the first peripheral region PPA1. In addition, the first scan driver SDV1 may be provided on both sides of the vertical unit of the first peripheral region PPA1, and the first light-emitting driver EDV1 may be provided on one side of the vertical unit of the first peripheral region PPA1.

The data driver DDV may be disposed in the first peripheral region PPA1. For example, the data driver DDV may be disposed in the horizontal unit of the first peripheral region PPA1. The data driver DDV may be elongated in the width direction of the first peripheral region PPA1.

In an exemplary embodiment of the present invention, positions of the scan driver SDV, the light-emitting driver EDV, and/or the data driver DDV may be changed as needed.

The timing controller may be connected to the first to third scan driver SDV1, SDV2, and SDV3, the first to third light-emitting drivers EDV1, EDV2, and EDV3, and the data driver DDV through the wire lines. The timing controller may be disposed on various locations of the display device. For example, the timing controller may be mounted on a flexible printed circuit substrate, and be connected to the first to third scan driver SDV1, SDV2, and SDV3, the first to third light-emitting drivers EDV1, EDV2, and EDV3, and the data driver DDV through the flexible printed circuit substrate. In this case, the flexible printed circuit substrate may be arranged in a variety of positions, for example, on a side of the substrate SUB or the back side of the substrate SUB.

Figure 2A:
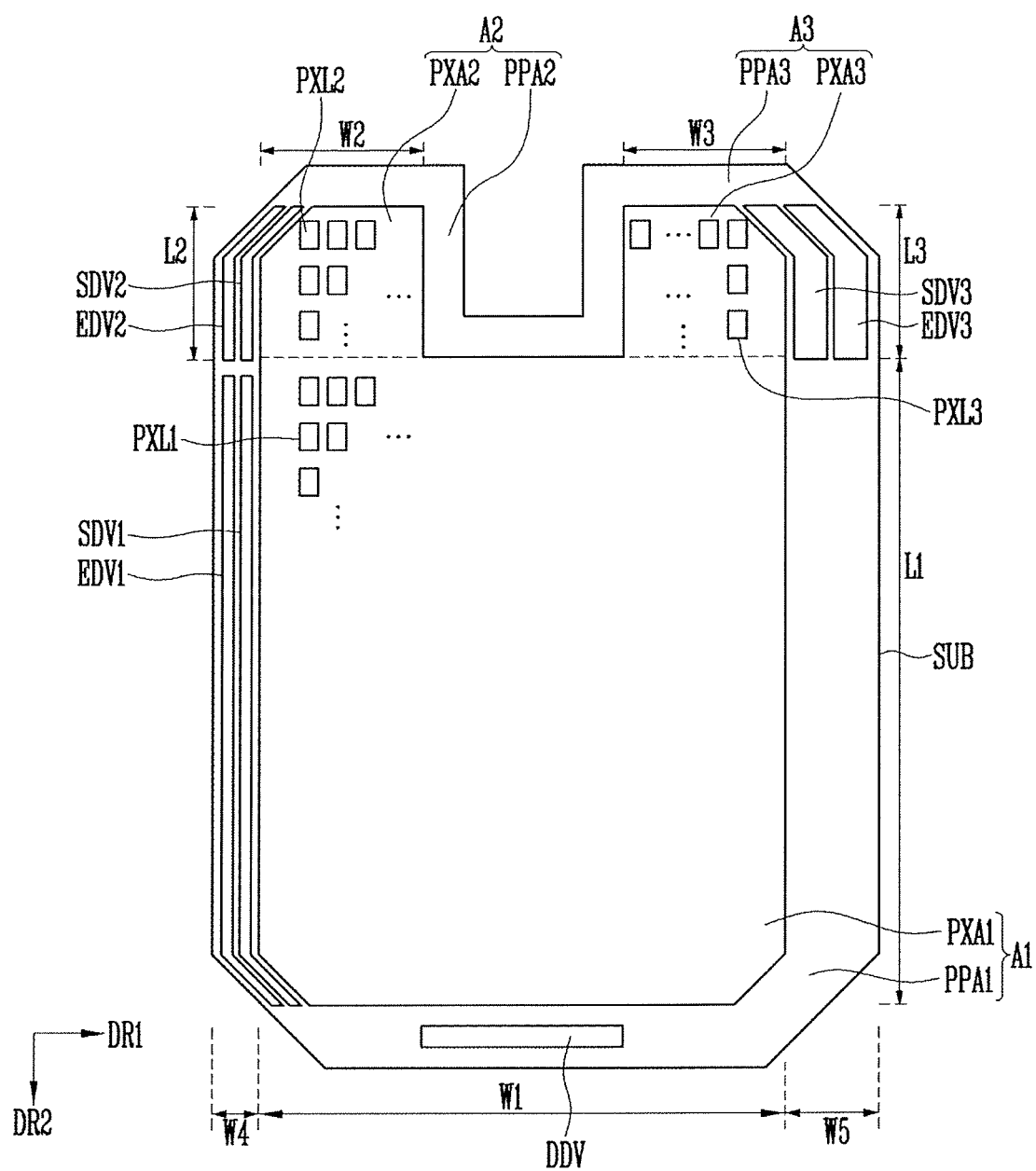
FIG. 2A is a plan view illustrating a display device in accordance with an exemplary embodiment of the present invention.
Figure 2B:
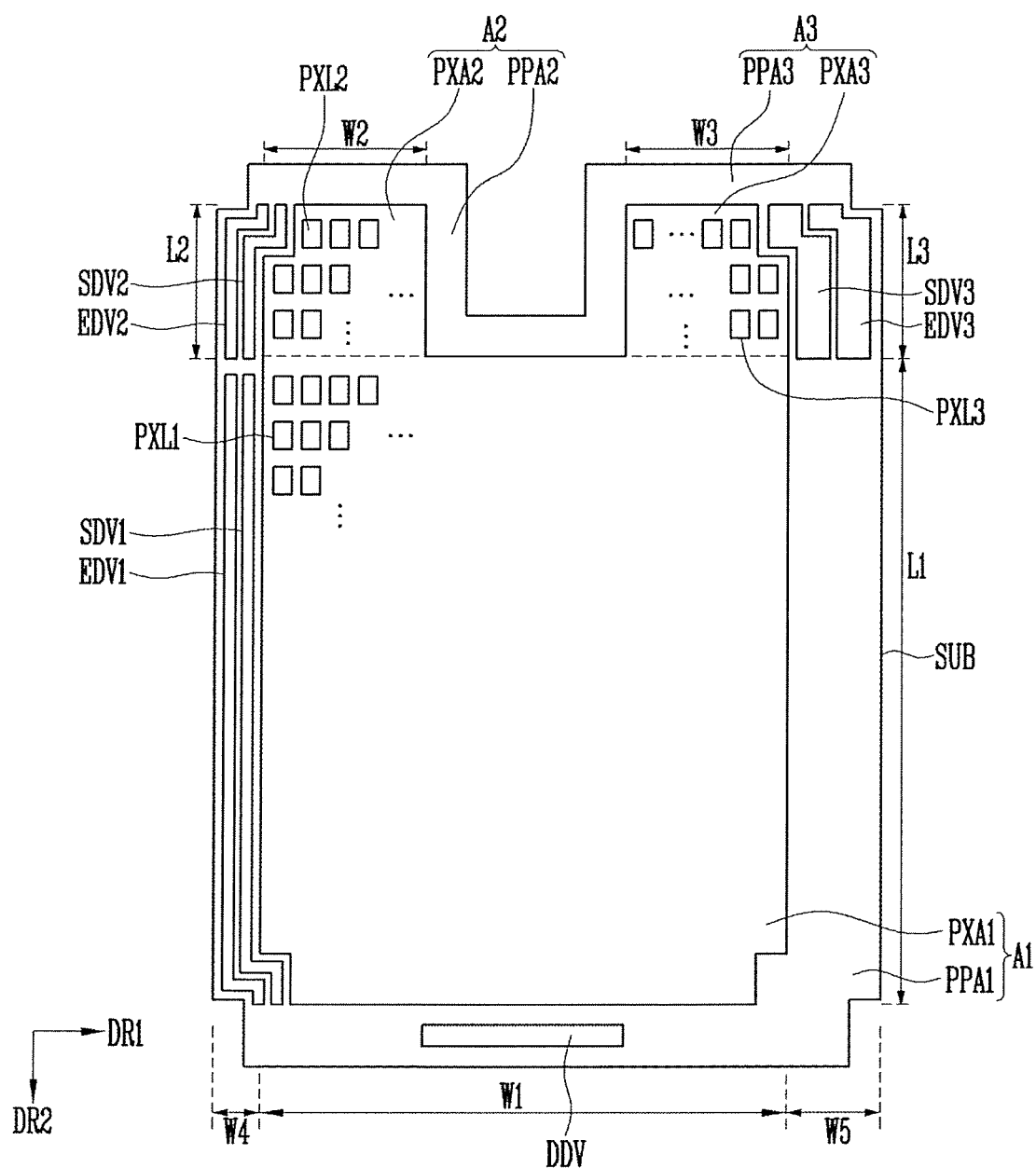
FIG. 2B is a plan view illustrating a display device in accordance with an exemplary embodiment of the present invention.

In an exemplary embodiment of the present invention, the shape of the substrate SUB may be changed in various ways. FIG. 2A is a plan view illustrating a display device in accordance with an exemplary embodiment of the present invention. FIG. 2B is a plan view illustrating a display device in accordance with an exemplary embodiment of the present invention. The display devices of FIGS. 2A and 2B have different shapes from that of the display device of FIG. 1. A description of elements that have already been described may be omitted for brevity.

Referring to FIGS. 2A and 2B, each of the first to third regions A1 to A3 may have various shapes. For example, each of the first to third regions A1 to A3 may have a polygonal shape in a closed form and including a straight line, a circle, an ellipse including a straight portion and a curved portion, a semi-elliptical shape, a curved shape, and/or a combination thereof, etc.

In an exemplary embodiment of the present invention, each of the first to third regions A1 to A3 has a roughly rectangular shape, and a portion of at least one of the corners of the rectangular shape of each of the first to third regions A1 to A3 may be removed. This can be seen in FIGS. 1A and 1B. The first to third regions A1 to A3 may include a first sub-region corresponding to the removed portion of at least one of the corners, and a second sub-region corresponding to the remainder of the first to third regions A1 to A3. A width of the first sub-region may be greater than a width of the second sub-region.

The removed portions of the corners of the first to third regions A1 to A3 may have a triangular shape or a rectangular shape. For example, as shown in FIGS. 1A and 1B, a side corresponding to a removed portion of the first to third regions A1 to A3 may include shapes having an oblique line inclined to one side of the rectangular shape or an angled line shape.

In an exemplary embodiment of the present invention, each of the first to third pixel regions PXA1 to PXA3 provided in the first to third regions A1 to A3 may have different shapes, for example, a polygonal shape in a closed form and including a straight line, a circle, an ellipse including a straight portion and a curved portion, a semi-elliptical shape, a curved shape, and/or a combination thereof, etc. In an exemplary embodiment of the present invention, each of the first to third pixel regions PXA1 to PXA3 may have the shape corresponding to the first to third regions A1 to A3, respectively. Each of the first to third pixel regions PXA1 to PXA3 may have a corresponding width W1, W2 and W3, respectively, and a corresponding length L1, L2 and L3, respectively, in the first and second directions DR1 and DR2. In an exemplary embodiment of the present invention, as shown in FIGS. 2A and 2B, the widths W1 to W3 and the lengths L1 to L3 of the first to third pixel regions PXA1 to PXA3 may indicate a maximum width or a maximum length of the first to third pixel regions PXA1 to PXA3, respectively, along the first and second directions DR1 and DR2.

Figure 3:
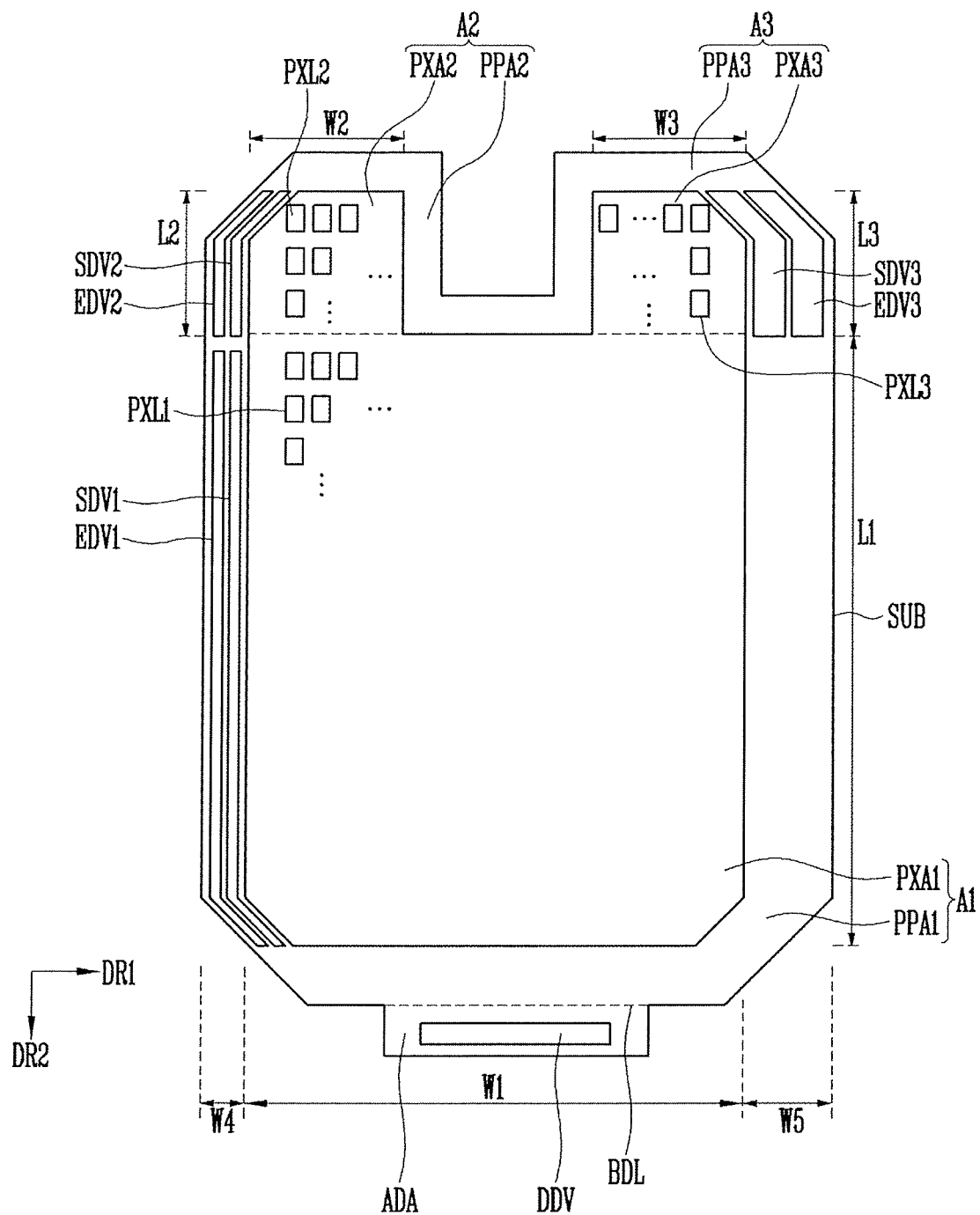
FIG. 3 is a plan view illustrating a display device in accordance with an exemplary embodiment of the present invention.

According to an exemplary embodiment of the invention, the substrate SUB may have different shapes depending on the arrangement of the components thereof. FIG. 3 is a plan view illustrating a display device in accordance with an exemplary embodiment of the present invention.

Referring to FIG. 3, the substrate SUB may further include an additional region ADA protruding from the third region A3.

In an exemplary embodiment of the present invention, the additional region ADA may be protruded from the first region A1. For example, the additional region ADA may have a shape protruding from the horizontal unit of the first peripheral region PPA1. The additional region ADA may be bent at a folding line BDL, which corresponds to a boundary of the first region A1. In this case, the additional region ADA may be bent or folded, thereby reducing the width of the bezel of the first region A1.

The additional region ADA may include various constituent components of the display device. For example, the additional region ADA may include the data driver DDV. However, the components that may be included in the additional region ADA are not limited thereto. In an exemplary embodiment of the present invention, the additional region ADA may also be provided in the first to third regions A1 to A3, in a shape similar to or different from the shape of the additional region ADA shown in FIG. 3. Accordingly, since the components of the display device may be disposed on the one or more additional regions ADA, and the additional regions ADA can be bent or folded, the width of the bezel of the display device may be reduced.

FIG. 4 is a block view illustrating a pixel and a driver in accordance with an exemplary embodiment of the present invention;

Referring to FIG. 4, the display device, according to an exemplary embodiment of the present invention, includes the pixels PXL, the driver and the wire unit.

The pixels PXL may include the first to third pixels PXL1 to PXL3, and the driver may include the first to third scan drivers SDV1 to SDV3, the first to third light emitting drivers EDV1 to EDV3, the data driver DDV, and the timing controller TC. In FIG. 4, the positions of the first to third scan driver SDV1 to SDV3, the first to third light emitting drivers EDV1 to EDV3, the data driver DDV, and the timing controller TC are shown for convenience of explanation, and may be arranged in other positions of the display device. For example, the data driver DDV may be arranged closer to the second region A2 and the third region A3 than the first region A1, but the arrangement of the data driver DDV is not limited thereto. For example, the data driver DDV may be arranged in a position close to the first region A1.

The wire unit may provide a signal of the driver to each of the pixels PXL. The wire unit may include scan lines, data lines, light emitting control lines, power lines, and a reset power line. The scan lines may include first to third scan lines S11 to S1$n$ ($n$ representing a positive nonzero integer), S21 to S2$n$, and S31 to S3$n$, respectively connected to the first to third pixels PXL1 and PXL3. The light emitting control lines E11 to E1$n$, E21 to E2$n$, and E31 to E3$n$ may be respectively connected to the first to third pixels PXL1 to PXL3. The data lines D1 to Dm and the power line may be connected to the first to third pixels PXL1 to PXL3.

The first pixels PXL1 may be located in the first pixel region PXA1. The first pixels PXL1 may be connected to the first scan lines S11 to S1$n$, the first emitting control lines E11 to E1$n$ and the data lines D1 to Dm. The first pixels PXL1 may receive the data signal from the data lines D1 to Dm when the scan signal is supplied from the first scan lines S11 to S1$n$. The first pixels PXL1 receiving the data signal may control an amount of current flowing from a first power source ELVDD line to a second power source ELVSS line via the organic light emitting display device.

The second pixels PXL2 may be located in the second pixel region PXA2. The second pixels PXL2 may be connected to the second scan lines S21 and S22, the second light emitting control lines E21 and E22 and the data lines D1 to D3. The second pixels PXL2 may receive the data signal from the data lines D1 to D3 when the scan signal is supplied from the second scan lines S21 and S22. The second pixels PXL2 receiving the data signal may control the amount of current flowing from the first power source ELVDD line to the second power source ELVSS line through the OLEDs.

Additionally, in FIG. 4, it is illustrated that six of the second pixels PXL2 may be arranged in the second pixel region PXA2 and connected to two second scan lines S21 and S22, two second light emitting control lines E21 and E22, and three data lines D1 to D3, but the present invention is not limited thereto. For example, a plurality of second pixels PXL2 may be arranged in the second pixel region PXA2 depending on the size of the second pixel region PXA2, and the number of second scan lines S21 to S2$n$, the second emitting control lines E21 to E2n and the data lines D1 to Dm may be formed as needed based on the number of the second pixels PXL2.

The third pixels PXL3 may be arranged in the third pixel region PXA3. As shown in FIG. 4, the third pixels PXL3 may be connected to the third scan lines S31 and S32, the third light emitting control lines E31 and E32 and the data lines Dm−2 to Dm. The third pixels PXL3 may receive the data signal from the data lines Dm−2 to Dm when the scan signal is supplied from the third scan lines S31 and S32. The third pixels PXL3 that receive the data signal may control the amount of current flowing from the first power source ELVDD line to the second power source ELVSS line through the OLEDs.

Additionally, in FIG. 4, it is illustrated that six third pixels PXL3 are arranged in the third pixel region PXA3 and are connected to two third scan lines S31 and S32, two third light emitting control lines E31 and E32, and three of data lines Dm−2 to Dm, but the present invention is not limited thereto. For example, a plurality of third pixels PXL3 may be arranged in the third pixel region PXA3 depending on the size of the third pixel region PXA3, and the number of third scan lines S31 to S3n, the third emitting control lines E31 to E3n and the data lines D1 to Dm may be formed as needed based on the number of the third pixels PXL3.

The first scan driver SDV1 may supply the scan signal to the first scan lines S11 to S1n in response to a first gate control signal GCS1 from the timing controller TC. For example, the first scan driver SDV1 may sequentially supply the scan signal to the first scan lines S11 to S1n. When the scan signals are sequentially supplied to the first scan lines S1 to S1n, the first pixels PXL1 may be sequentially selected by a horizontal line unit. In other words, the first pixels PXL1 may be selected based on a given number of pixels PXL1 connected to a same horizontal scan line of the first scan lines S11 to S1n.

The second scan driver SDV2 may supply the scan signal to the second scan lines S21 and S22 in response to a second gate control signal GCS2 from the timing controller TC. For example, the second scan driver SDV2 may sequentially supply the scan signals to the second scan lines S21 and S22. When the scan signal is sequentially supplied to the second scan lines S21 and S22, the second pixels PXL2 are sequentially selected by the horizontal line unit. In other words, the second pixels PXL2 may be selected based on a given number of pixels PXL2 connected to a same horizontal scan line of the second scan lines S21 to S2n.

The third scan driver SDV3 may supply the scan signal to the third scan lines S31 and S32 corresponding to a third gate control signal GCS3 from the timing controller TC. For example, the third scan driver SDV3 may sequentially supply the scan signal to the third scan lines S31 and S32. When the scan signal is sequentially supplied to the third scan lines S31 and S32, the third pixels PXL3 may be sequentially selected by the horizontal line unit. In other words, the third pixels PXL3 may be selected based on a given number of pixels PXL3 connected to a same horizontal scan line of the third scan lines S31 to S3n.

The first light-emitting driver EDV1 may supply the light emitting control signal to the first light emitting control lines E11 to E1n in response to a fourth gate control signal GCS4 from the timing controller TC. For example, the first light-emitting driver EDV1 may sequentially supply the light emitting control signal to the first emitting control lines E11 to E1n.

The light emitting control signal may be determined to have a greater width than the scan signal. For example, the light emitting control signal supplied to an ith (e.g., i is a natural number) first light emitting control line E1i may be supplied to be overlapped with the scan signal supplied to an (i−1)th first scan line S1i−1 and the scan signal supplied to an ith first scan line S1i for a partial period of time.

The second light emitting driver EDV2 may supply the light emitting control signal to the second light emitting control lines E21 and E22 in correspondence with a fifth gate control signal GCS5 from the timing controller TC. For example, the second light emitting driver EDV2 may sequentially supply the light emitting control signal to the second light emitting control lines E21 and E22.

The third light emitting driver EDV3 may supply the light emitting control signal to the third light emitting control lines E31 and E32 in correspondence with a sixth gate control signal GCS6 from the timing controller TC. For example, the third light emitting driver EDV3 may sequentially supply the light emitting control signal to the third light emitting control lines E31 and E32.

Additionally, the light emitting control signal may be determined to be a gate off voltage (for example, a high voltage), so that the transistors included in the pixels PXL may be turned off, and the scan signal may be determined to be a gate on voltage (for example, a low voltage), so that the transistors included in the pixels PXL may be turned on.

The data driver DDV may supply the data signal to the data lines D1 to Dm in response to a data control signal DCS. The data signal supplied to the data lines D1 to Dm may be supplied to the pixels PXL using the scan signals.

The timing controller TC may supply the gate control signals GCS1 to GCS6 generated based on the timing signals supplied from an external source to the scan drivers SDV and the light emitting drivers EDV, and the data control signal DCS to the data driver.

Each of the gate control signals GCS1 to GCS6 include a start pulse and a clock signal. The start pulse may control the timing of the first scan signal or the first light emitting control signal. The clock signals may be used to shift the start pulse.

The data control signal DCS may include a source start pulse and clock signals. The source start pulse may control a sampling start point of the data. The clock signals may be used for controlling a sampling operation.

When the display device is sequentially driven, the first scan driver SDV1 may receive the final output signal of the second scan driver SDV2 as the start pulse. In this case, the first scan driver SDV1 and the second scan driver SDV2 may share the control signals. In addition, the timing controller TC may supply a gate control signal GCS2 to the second scan driver SDV2 and may not supply the gate control signal GSC1 to the first scan driver SDV1.

When a separate scan driver is added for driving the first pixels PXL1 in the upper part of the third scan driver SDV3, the added scan driver and the third scan driver SDV3 may share the control signal. In addition, the added scan driver may receive the last scan signal of the third scan driver SDV3 as the start pulse.

In addition, when the display device is driven in sequence, the first light emitting driver EDV may receive the final output signal of the second light-emitting driver EDV2 as the start pulse. In this case, the first light-emitting driver EDV1 and the second light-emitting driver EDV2 may share the control signal. In addition, the timing controller TC may supply the gate control signal GCS5 to the second light emitting driver EDV2, and may not supply the gate control signal GCS4 to the first light-emitting driver EDV1.

When a separate light emitting driver is added for driving the first pixels PXL1 in the upper part of the third light emitting driver EDV3, the added light emitting driver and the third light emitting driver EDV3 may share the control signal. In addition, the added light emitting driver may receive the last light emitting control signal of the third light emitting driver EDV3 as the start pulse.

Figure 5:
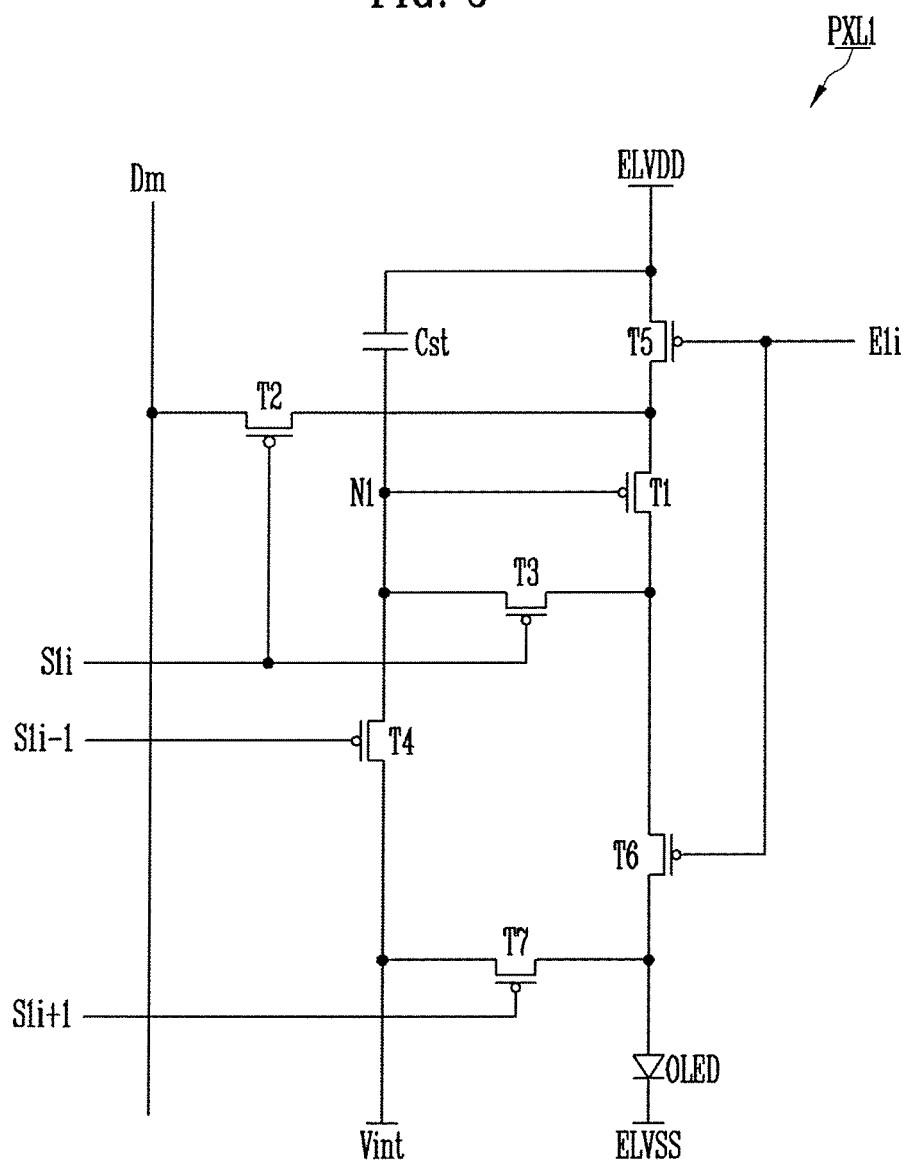
FIG. 5 is an equivalent circuit diagram of a pixel of FIG. 4 in accordance with an exemplary embodiment of the present invention.

FIG. 5 is an equivalent circuit diagram of a pixel PXL of FIG. 4 in accordance with an exemplary embodiment of the present invention. In FIG. 5, for convenience of explanation, a pixel PXL is shown to be connected to an $m^{th}$ data line Dm and an $i^{th}$ first scan line S1$i$.

Referring to FIG. 5, the first pixel PXL1, according to an exemplary embodiment of the present invention, may include an OLED, a first transistor T1 to a seventh transistor T7, and a storage capacitor Cst.

The anode of the OLED may be connected to the first transistor T1 via a sixth transistor T6, and the cathode may be connected to the second power supply ELVSS line. The OLED may generate light with a predetermined brightness in correspondence to the amount of current supplied from the first transistor T1.

The first power supply ELVDD line may be determined to have a higher voltage than the second power supply ELVSS line so that the current may flow through the OLED.

The seventh transistor T7 may be connected to a reset power Vint and the anode of the OLED. In addition, a gate electrode of the seventh transistor T7 is connected to the (i+1) th first scan line S1$i$+1. The seventh transistor T7 may be turned on when the scan signal is supplied to the (i+1)th first scan line S1$i$+1 and supply the voltage of the reset power Vint to the anode of the OLED. The reset power Vint may be determined to have a voltage lower than the data signal.

The sixth transistor T6 may be connected to the first transistor T1 and the OLED. In addition, the gate electrode of the sixth transistor T6 may be connected to the ith first emitting control line E1$i$. The sixth transistor T6 may be turned off when the emitting control signal is supplied to the ith first emitting control line E1$i$, and it may be turned on in other cases.

The fifth transistor T5 may be connected to the first power supply ELVDD line and the first transistor T1. A gate electrode of the fifth transistor T5 may be connected to the ith first emitting control line E1$i$. The fifth transistor T5 may be turned off when the emitting control signal is supplied to the ith first emitting control line E1$i$, and it may be turned on in other cases.

A first electrode of the first transistor T1, which may be a driving transistor, may be connected to the first power supply ELVDD line via the fifth transistor T5, and a second electrode may be connected to the anode of the OLED via the sixth transistor T6. A gate electrode of the first transistor T1 may be connected to the first node N1. The first transistor T1 may control the amount of current flowing from the first power supply ELVDD line to the second power supply ELVSS line via the OLED corresponding to the voltage of the first node N1.

The third transistor T3 may be connected to the second electrode of the first transistor T1 and the first node N1. A gate electrode of the third transistor T3 may be connected to the ith first scan line S1$i$. The third transistor T3 may be turned on when the scan signal is supplied to the ith first scan line S1$i$, and may electrically connect the second electrode of the first transistor T1 and the first node N1. Thus, when the third transistor T3 is turned on, the first transistor T1 may be connected in a diode form.

The fourth transistor T4 may be connected to the first node N1 and the reset power Vint. A gate electrode of the fourth transistor T4 may be connected to the (i−1)th first scan line S1$i$−1. The fourth transistor T4 may be turned on when the scan signal is supplied to the (i−1)th first scan line S1$i$−1, and may supply the voltage of the reset power Vint to the first node N1.

The second transistor T2 may be connected to the $m^{th}$ data line Dm and the first electrode of and the first transistor T1. A gate electrode of the second transistor T2 may be connected to the ith first scan line S1$i$. The second transistor T2 may be turned on when the scan signal is supplied to the ith first scan line S1$i$, and may electrically connect the m data line Dm to the first electrode of the first transistor T1.

The storage capacitor Cst may be connected to the first power supply ELVDD line and the first node N1. The storage capacitor Cst may store a voltage corresponding to the data signal and the threshold voltage of the first transistor T1.

The second pixels PXL2 and the third pixels PXL3 may be implemented with the same circuit as the first pixels PXL1. Therefore, a detailed description of the circuit diagram of the second pixels PXL2 and the third pixels PXL3 will be omitted for brevity.

As described above, according to an exemplary embodiment of the present invention, the pixels PXL may be disposed in the pixel regions A1, A2 and A3 having different sizes and/or shapes. A length of the scan lines that provide scan signals to the pixels PXL may vary depending on the size and/or shape of the regions A1, A2 and A3, and particularly, the size and/or shape of the pixel regions PXA. For example, a first width W1, (refer to FIG. 1) of the first pixel region PXA1, according to an exemplary embodiment of the invention, may be longer than a second width W2, (refer to FIG. 1) of the second pixel region PXA2. Accordingly, when the scan lines extend along the width direction, lengths of the first scan lines S11 to S1$n$ may be longer than lengths of the second scan lines S21 and S22. Differences in lengths of the scan lines may cause differences in load values of the scan lines. For example, the load values of the first scan lines S11 to S1$n$ may be greater than the load values of the second scan lines S21 and S22. The difference between the load values may cause a voltage drop of the scan signal supplied to each pixel PXL and result in a brightness difference between the first pixels PXL1 of the first pixel region PXA1 and the second pixels PXL2 of the second pixel regions PXA2.

In an exemplary embodiment of the present invention, an extension direction of the scan lines may be set to be, for example, longitudinal. For example, the scan lines may be extended in the longitudinal direction, and the lengths of the scan lines may be determined in correspondence to the first length L1 and the second length L2, respectively. In this case, the length difference between the scan lines may cause the difference between the load values of the scan lines and result in the brightness difference between the pixels PXL.

In an exemplary embodiment of the present invention, a structure with different parasitic capacitances may be employed by using a dummy unit for compensating the difference of the load values of each pixel region PXA. "The dummy unit" may refer to "a plurality of dummy units". In an exemplary embodiment of the present invention, the first pixel PXL1 will be used to describing the structure of the pixels PXL, and differences between the first pixels PXL1 and the second pixels PXL2 will be described below. In an exemplary embodiment of the present invention, since the third pixels PXL3 may have the same shape as the second pixels PXL, the description thereof will be omitted for brevity.

Figure 6:
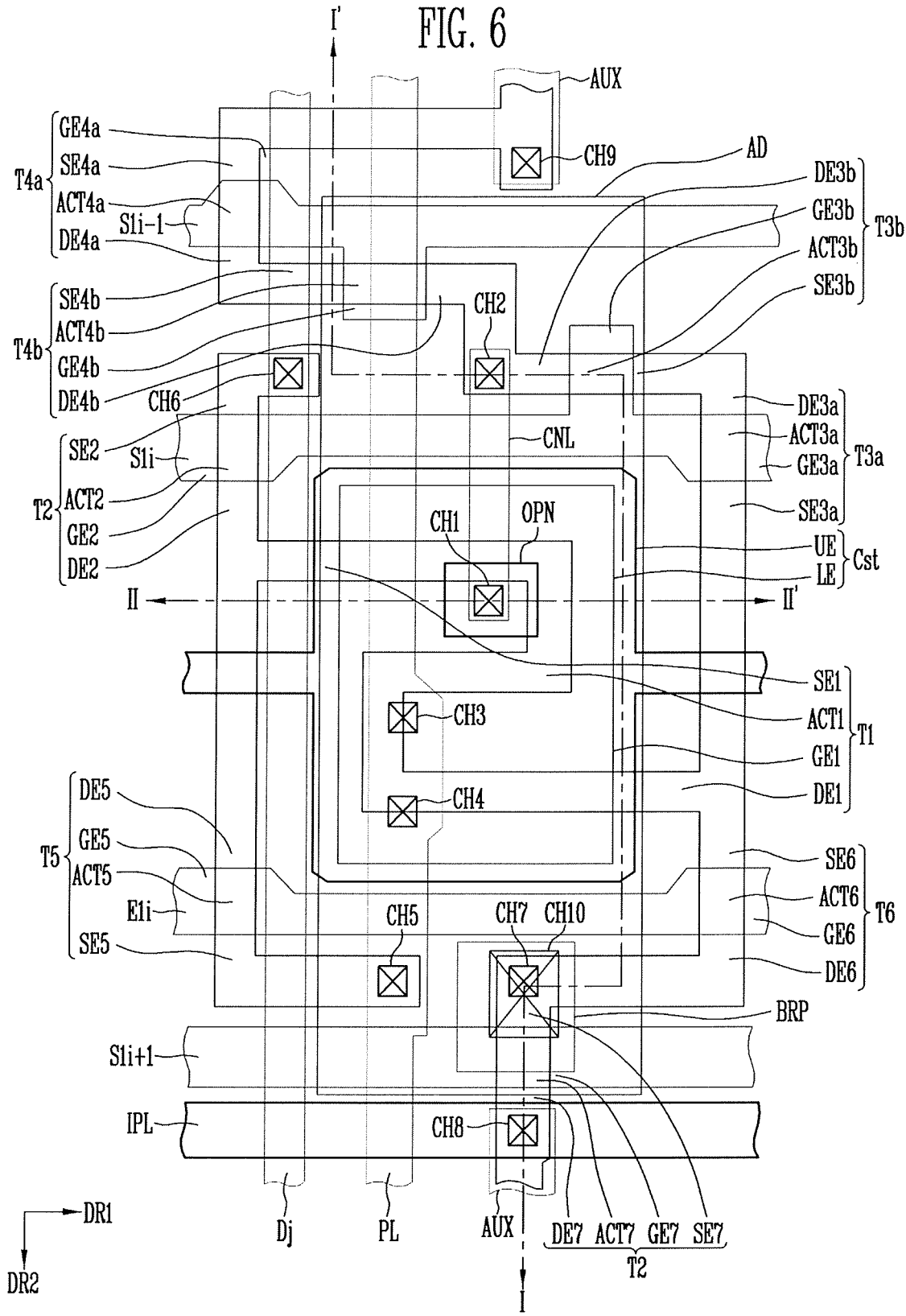
FIG. 6 is a plan view illustrating a structure of a first pixel of FIG. 4, in accordance with an exemplary embodiment of the present invention.
Figure 7A:
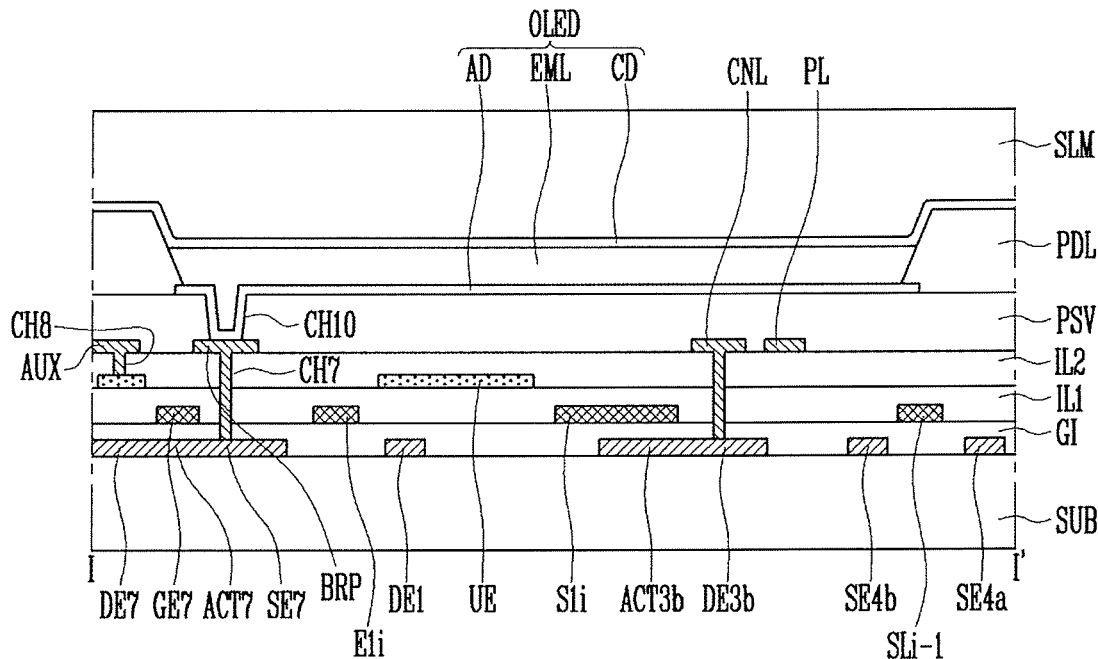
FIG. 7A is a cross-sectional view taken along line I-I' of FIG. 6 in accordance with an exemplary embodiment of the present invention.
Figure 7B:
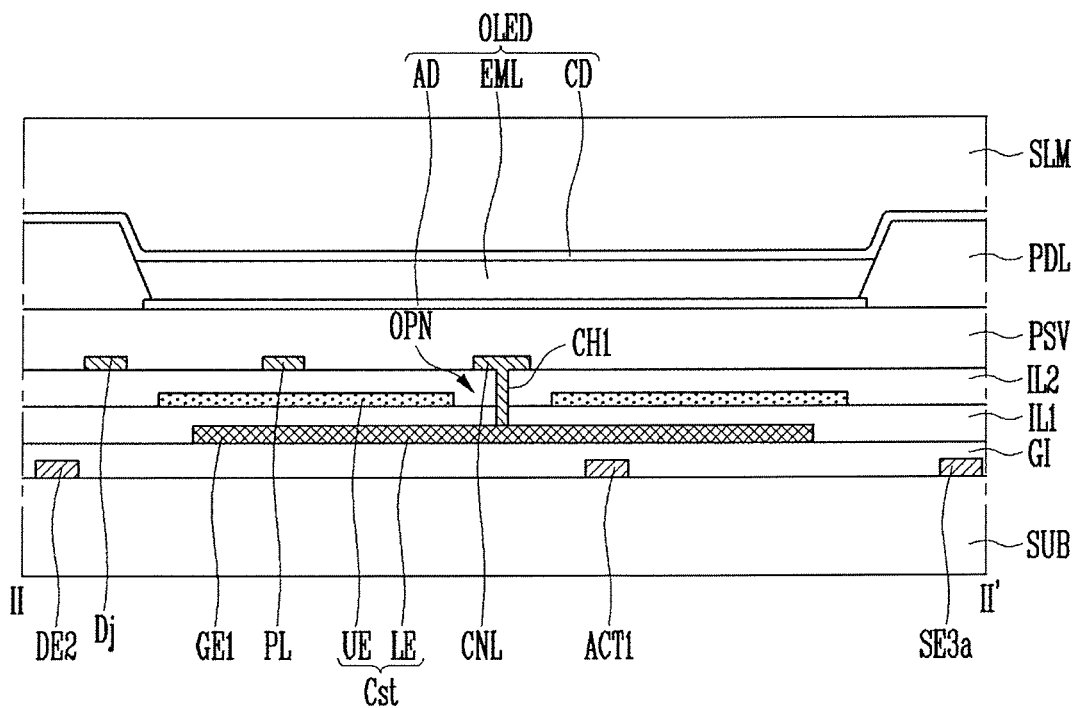
FIG. 7B is a cross-sectional view taken along line II-II' of FIG. 6 in accordance with an exemplary embodiment of the present invention.

FIG. 6 is a plan view illustrating a structure of a first pixel PXL1 of FIG. 4, in accordance with an exemplary embodiment of the present invention. FIG. 7A is a cross-sectional view taken along line I-I' of FIG. 6 in accordance with an exemplary embodiment of the present invention. FIG. 7B is a cross-sectional view taken along line II-II' of FIG. 6 in accordance with an exemplary embodiment of the present invention.

In FIGS. 6, 7A and 7B, on the basis of a single first pixel PXL1 disposed in an ith row and a jth column of the first pixel region PXA1, three of the first scan lines S1$i$−1, S1$i$, and S1$i$−1 may be connected to the first pixel PXL1. For example, the first light emitting control line E1$i$, the power line PL, and the data lines Dj are shown. In FIGS. 7A and 7B, for convenience of explanation, the (i−1)th first scan line in a (i−1)th row may be referred to as "the (i−1) first scan line S1$i$−1", the first scan line in the ith row may be referred to as "the ith first scan line S1$i$," the first scan line in the a (i+1)th row may be referred to as "the (i+1)th first scan line S1$i$+1," the light emitting control line in the ith row may be referred to as "the light emitting control line E1$i$," a data line in the jth column may be referred to as "the data line Dj," and the jth power line may be referred to as "the power line PL."

Referring to FIGS. 4 to 6, 7A and 7B, the display device may include the substrate SUB, the wire unit, and the pixels PXL.

The substrate SUB may include an insulating material such as glass, and resin. In addition, the substrate SUB may include a material having flexibility to be bent or folded, and may include a single layer structure or a multilayer structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, acetate propionate (cellulose acetate propionate). However, the material constituting the substrate SUB may be varied and may include a fiber reinforced plastic (FRP), or the like.

The wire unit may provide the signal to each first pixel PXL, and include the first scan lines S1$i$−1, S1$i$, and S1$i$+1, the data line Dj, the first light emitting control line E1$i$, the power line PL, and an initialization power line IPL.

The first scan lines S1$i$−1, S1$i$ and S1$i$+1 may extend in the first direction DR1 and include the (i−1)th first scan line S1$i$−1 sequentially arranged along the second direction DR2, the ith first scan line S1$i$, and the (i+1) th first scan line S1$i$+1. The scan signal is applied to the first scan lines S1$i$−1, S1$i$, and S1$i$+1, the (i−1)th scan signal to the (i−1)th first scan line S1$i$−1, the ith first scan line to the ith first scan line S1$i$, and the (i+1) th scan signal to the (i+1) th first scan line S1$i$+1.

The first light emitting control line E1$i$ may extend in the first direction DR1 and be arranged to be spaced apart from the ith first scan line S1$i$ and the (i+1)th first scan line S1$i$+1 between the ith first scan line S1$i$ and the (i+1) th first scan line S1$i$+1. The light emitting control signal may be applied to the first light emitting control line E1$i$.

The data line Dj may extend in the second direction DR2 and be sequentially arranged along the first direction DR1. The data signal may be applied to the data line Dj.

The power line PL may extend along the second direction DR2, and be arranged to be spaced apart from the data line Dj. The first power supply ELVDD line may be applied to the power line PL.

The initialization power line IPL may extend along the first direction DR1 and be provided between the (i+1) th first scan line S1$i$+1 and the (i−1)th first scan line S1$i$−1 in a subsequent row. The reset power source Vint may be applied to the initialization power line IPL.

Each first pixel PXL1 may include the first transistor T1 to a seventh transistor T7, the storage capacitor Cst, and the OLED.

The first transistor T1 may include a first gate electrode GE1, a first active pattern ACT1, a first source electrode SE1, a first drain electrode DE1, and a connecting line CNL.

The first gate electrode GE1 may be connected to a third drain electrode DE3 of a third transistor T3 and a fourth drain electrode DE4 of a fourth transistor T4. The connecting line CNL may connect the first gate electrode GE1, the third drain electrode DE3 and the fourth drain electrode DE4. One end of the connecting line CNL may be connected to the first gate electrode GE1 through a contact hole CH1 and the other end of the connecting line CNL may be connected the third drain electrode DE3 and the fourth drain electrode DE4 through a second contact hole CH2.

In an exemplary embodiment of the present invention, the first active pattern ACT1, the first source electrode SE1 and the first drain electrode DE1 may be formed in a semiconductor layer in which is either doped with impurities or not doped with impurities. The first source electrode SE1 and the first drain electrode DE1 may be formed in a semiconductor layer doped with the impurities, and the first active pattern ACT1 may be formed in a semiconductor layer that is not doped with the impurities.

The first active pattern ACT1 may have a pillar shape extended in a predetermined direction. In addition, the first active pattern ACT1 may have a shape where the first active pattern ACT1 is bent a plurality of times along the direction it is extended. In a plan view, the first active pattern ACT1 may overlap the first gate electrode GE1. A channel region of the first transistor T1 may be elongated since the first active pattern ACT1 is elongated. Accordingly, a driving range of the gate voltage applied to the first transistor T1 may become wider. Thus, a gray level of the light emitted from the OLED may be precisely controlled.

The first source electrode SE1 may be connected one side of the first active patterns ACT1, the second drain electrode DE2 of the second transistor T2 and the fifth drain electrode DE5 of the fifth transistor T5. The first drain electrode DE1 may be connected the other side of the first active patterns ACT1, a third source electrode SE3 of the third transistor T3 and a sixth source electrode SE6 of the sixth transistor T6.

The second transistor T2 may include a second gate electrode GE2, a second active pattern ACT2, a second source electrode SE2, a second drain electrode DE2.

The second gate electrode GE2 may be connected to the ith first scan line S1$i$. The second gate electrode GE2 may be provided as a portion of the ith first scan line S1$i$ or a shape protruding from the ith first scan line S1$i$. In an exemplary embodiment of the present invention, the second active pattern ACT2, the second source electrode SE2 and the second drain electrode DE2 may be formed of a semiconductor layer which may be doped or undoped with impurities. The second source electrode SE2 and the second drain electrode DE2 may be formed in a semiconductor layer that is doped with the impurities, and the second active pattern ACT2 may be formed in the semiconductor layer that is undoped with impurities. The second active pattern ACT2 may overlap the second gate electrode GE2. One side of the second source electrode SE2 may be connected to the second active pattern ACT2 and the other side of the second source electrode SE2 may be connected to the data line Dj through a sixth contact hole CH6. One side of the second drain electrode DE2 may be connected to the second active patterns ACT2 and the other side of the second drain electrode DE2 may be connected to the first source electrode SE1 of the first transistor T1 and the fifth drain electrode DE5 of the fifth transistor T5.

The third transistor T3 may have a double-gate structure to prevent leakage of current. In other words, the third transistor T3 may include a (3a)th transistor T3$a$ and a (3b)th transistor T3$b$. The (3a)th transistor T3$a$ may include a (3a)th gate electrode GE3$a$, a (3a)th active pattern ACT3$a$, a (3a)th source electrode SE3$a$, and a (3a)th drain electrode DE3$a$. The a (3b)th transistor T3$b$ may include a (3b)th gate electrode GE3$b$, a (3b)th active pattern ACT3$b$, a (3b)th source electrode SE3$b$, and a (3b)th drain electrode DE3$b$. Hereinafter, the (3a)th gate electrode GE3 and the a (3b)th gate electrode GE3$b$ will be indicated as the third gate electrode GE3, the (3a)th active pattern ACT3$a$ and the (3b)th active pattern ACT3$b$ as the third active pattern ACT3, the (3a)th source electrode SE3$a$ and the (3b)th source electrode SE3$b$ as the third source electrode SE3, and the (3a)th drain electrode DE3$a$ and the a (3b)th drain electrode DE3$b$ as the third drain electrode DE3.

The third gate electrode GE3 may be connected to the ith first scan line S1$i$. The third gate electrode GE3 may be a portion of the first scan line S1$i$ or a shape from protruding the ith first scan line S1$i$. In an exemplary embodiment of the present invention, the third active pattern ACT3, the third source electrode SE3 and the third drain electrode DE3 may be formed in a semiconductor layer that may be doped or undoped with impurities. The third source electrode SE3 and the third drain electrode DE3 may be formed of a semiconductor layer that is doped with impurities, and the third active pattern ACT3 may be formed of the semiconductor layer in which the impurities are not doped. The third active pattern ACT3 may overlap with the third gate electrode GE3.

One side of the third source electrode SE3 may be connected to the third active pattern ACT3, and the other side of the third source electrode SE3 may be connected to the first drain electrode DE1 of the first transistor T1 and the sixth source electrode SE6 of the sixth transistor 16. One side of the third drain electrode DE3 may be connected to the third active pattern ACT3, and the other side may be connected to the fourth drain electrode DE4 of the fourth transistor T4. The third drain electrode DE3 may be connected to the first gate electrode GE1 of the first transistor T through the connecting line CNL, the second contact hole CH2 and the first contact hole CH1.

The fourth transistor T4 may have a double-gate structure to prevent leakage of current. In other words, the fourth transistor T4 may include a (4a)th transistor and a (4b)th transistor. The (4a)th transistor may include a (4a)th electrode GE4$a$, a (4a)th active pattern ACT4$a$, a (4a)th source electrode SE4$a$, and a (4a)th drain electrode DE4$a$. The (4b)th transistor may include a (4b)th gate electrode GE4$b$, a (4b)th active pattern 4$b$ ACT4$b$, a (4b) source electrode SE4$b$, and a (4b)th drain electrode DE4$b$. Hereinafter, the (4a)th electrode GE4$a$ and the (4b)th gate electrode GE4$b$ may be referred to as the fourth gate electrode GE4, the (4a)th active pattern ACT4$a$ and the (4b)th active pattern 4$b$ ACT4$b$ as the fourth active pattern ACT4, the (4a)th source electrode SE4$a$ and the (4b) source electrode SE4$b$ as the fourth source electrode SE4, and the (4a)th drain electrode DE4$a$ and the (4b)th drain electrode DE4$b$ to the fourth drain electrode DE4.

The fourth gate electrode GE4 may be connected to the (i−1)th first scan line S1$i$−1. The fourth gate electrode GE4 may be a portion of the (i−1)th first scan line S1$i$−1 or a shape protruding from the (i−1)th first scan line S1$i$−1. The fourth active pattern ACT4, the fourth source electrode SE4 and the fourth drain electrode DE4 may be formed in the semiconductor layer which may be doped or undoped with impurities. The fourth source electrode SE4 and the fourth drain electrode DE4 may be formed of a semiconductor layer doped with impurities, and the fourth active pattern ACT4 may be formed of a semiconductor layer that is not doped with impurities. The fourth active pattern ACT4 may overlap with the fourth gate electrode GE4.

One side of the fourth source electrode SE4 may be connected to the fourth active pattern ACT4 and the other side may be connected to the initialization power line IPL and a seventh drain electrode DE7 of the seventh transistor T7 of a pixel in the previous row. Since an auxiliary connecting line AUX may be provided between the fourth source electrode SE4 and the reset power line, one side of the auxiliary connecting line AUX may be provided to the fourth source electrode SE4 through a ninth contact hole CH9 and the other side of the auxiliary connecting line AUX may be connected to the initialization power line IPL in the previous row through an eighth contact hole CH8. One side of the fourth drain electrode DE4 may be connected to the fourth active pattern ACT4 and the other side may be connected to the third drain electrode DE3 of the third transistor T3. The fourth drain electrode DE4 may be connected to the first gate electrode GE1 of the first transistor T1 through the connecting line CNL, the second contact hole CH2 and the first contact hole CH1.

The fifth transistor T5 may include a fifth gate electrode GE5, a fifth active pattern ACT5, a fifth source electrode SE5, and a fifth drain electrode DE5.

The fifth gate electrode GE5 may be connected to the first light emitting control line E1$i$. The fifth gate electrode GE5 may be a portion of the first light emitting control line E1$i$ or a shape protruding from the first light emitting control line E1$i$. The fifth source electrode SE5 and the fifth drain electrode DE5 may be formed of a semiconductor layer which may be doped or undoped with impurities. The fifth source electrode SE5 and the fifth drain electrode DE5 may be formed of the semiconductor layer doped with impurities, and the fifth active pattern ACT5 may be formed of the semiconductor layer that is not doped with impurities. The fourth active pattern ACT4 may overlap with the fourth gate electrode GE4.

The fifth active pattern ACT5 may correspond to a portion overlapped with the fifth gate electrode GE5. One side of the fifth source electrodes SE5 may be connected to the fifth active pattern ACT5 and the other side may be connected to the power line PL through a fifth contact hole CH5. One side of the fifth drain electrode DE5 may be connected to the fifth active pattern ACT5 and the other side may be connected to the first source electrode SE1 of the first transistor T1 and the second drain electrode DE2 of the second transistor T2.

The sixth transistor T6 may include a sixth gate electrode GE6, a sixth active pattern ACT6, a sixth source electrode SE6, and a sixth drain electrode DE6.

The sixth gate electrode GE6 may be connected to the first light emitting control line E1$i$. The sixth gate electrode GE6 may be a portion of the first light emitting control line E1$i$ or a shape protruding from the first light emitting control line E1$i$. The sixth active pattern ACT6, the sixth source electrode SE6 and the sixth drain electrode DE6 may be formed of a semiconductor layer which may be doped or undoped with impurities. The sixth source electrode SE6 and the sixth drain electrode DE6 may be formed in the semiconductor layer that is doped with the impurities, and the sixth active pattern ACT6 may be formed in the semiconductor layer that is not doped with the impurities.

The sixth active pattern ACT6 may be a portion overlapped with the sixth gate electrode GE6. One side of the sixth source electrode SE6 may be connected to the sixth active pattern ACT6 and the other side may be connected to the first drain electrode DE1 of the first transistor T1 and the third source electrode SE3 of the third transistor T3. One side of the sixth drain electrode DE6 may be connected to the sixth active pattern ACT6 and the other side may be connected the seventh source electrode SE7 of the seventh transistor T7.

The seventh transistor T7 may include a seventh gate electrode GE7, a seventh active pattern ACT7, a seventh source electrode SE7, and the drain electrode DE7.

The seventh gate electrode GE7 may be connected to the (i+1)th first scan line S1$i$+1. The seventh gate electrode GE7 may be a portion of the (i+1)th first scan line S1$i$+1 or a shape protruding from the (i+1)th first scan line S1$i$+1. The seventh active pattern ACT7, the seventh source electrode SE7 and the seventh drain electrode DE7 may be formed in a semiconductor layer that is not doped with impurities. The seventh source electrode SE7 and the seventh drain electrode DE7 may be formed in a semiconductor layer that is doped with the impurities, and the seventh active pattern ACT7 may be formed in the semiconductor layer that is not doped with the impurities.

The seventh active pattern ACT7 may correspond to a portion overlapped with the seventh gate electrode GE7. One side of the seventh source electrode SE7 may be connected to the seventh active pattern ACT7 the other end may be connected to the sixth drain electrode DE6 of the sixth transistor T6. One side of the seventh drain electrode DE7 may be connected to the seventh active pattern ACT7 and the other side may be connected to the initialization power line IPL. The seventh drain electrode DE7 may be connected to the fourth source electrode SE4 of the fourth transistor T4 of the pixel row. The seventh drain electrode DE7 and the initialization power line IPL may be connected through the auxiliary line, an eighth contact hole CH8, and a ninth contact hole CH9.

The storage capacitor Cst may include a lower electrode LE and an upper electrode UE. The lower electrode LE may be formed of the first gate electrode GE1 of the first transistor T1.

The upper electrode UE may be overlapped with the first gate electrode GE1, and cover the lower electrode LE when viewed in plan view. By increasing an overlapping region of the upper electrode UE and the lower electrode LE, capacitance of the storage capacitor Cst may increase. The upper electrode UE may be extended in the first direction DR1. In an exemplary embodiment of the present invention, a voltage of the same level as the first power supply ELVDD line may be applied to the upper electrode UE. The upper electrode UE may include an opening OPN in a region where the first contact hole CH1 is formed to be contacted with the first gate electrode GE1 and the connecting line CNL.

The OLED may include an anode AD, a cathode CD, and an emitting layer EML provided between and the anode AD and the cathode CD.

The anode AD may be provided in the pixel area of each of the pixels PXL. The anode AD may be connected to the seventh source electrode SE7 of the seventh transistor T7 and the sixth drain electrode DE6 of the sixth transistor T6 through the seventh contact hole CH7 and a tenth contact hole CH10. A bridge pattern BRP may be provided between the seventh contact hole CH7 and the tenth contact hole CH10, thereby connecting the sixth drain electrode DE6 and the seventh source electrode SE7 to the anode AD.

Referring to FIGS. 6, 7A and 7B, the active patterns ACT1 to ACT7 may be referred to as ACT. The active patterns ACT may be provided on the base substrate SUB. The first active pattern ACT1 to the seventh active pattern ACT7 may be formed of a semiconductor material.

A buffer layer may be provided between the base substrate SUB and the first active pattern ACT1 to the seventh active pattern ACT7.

The gate insulating layer GI may be provided on the base substrate SUB in which the first active pattern ACT1 to the seventh active pattern ACT7 are formed.

The (i−1)th first scan line S1$i$−1 to the (i+1)th first scan line S1$i$+1, the light emitting control line E1$i$, the first gate electrode GE1 and the seventh gate electrode GE7 may be provided on the gate insulating layer GI. The first gate electrode GE1 may be the lower electrode LE of the storage capacitor Cst. The second gate electrode GE2 and the third gate electrode GE3 may be formed integrally with the ith first scan line S1$i$, the fourth gate electrode GE4 may be integrally with the (i−1)th first scan line (S1$i$−1), the fifth gate electrode GE5 and the sixth gate electrode GE6 may be formed integrally with the light emitting control line E1$i$, and the seventh gate electrode GE7 may be integrally formed with the (i+1)th first scan line S1$i$+1.

The first interlayer insulator IL1 may be provided on the base substrate SUB in which the (i−1)th scan line S1$i$−1 is formed.

The upper electrode UE of the storage capacitor Cst and the initialization power line IPL may be provided on the first interlayer insulating layer IL1. The upper electrode UE may cover the lower electrode LE and constitute the storage capacitor Cst with the lower electrode LE. The first insulating layer IL1 may be disposed between the upper and lower electrodes UE and LE.

A second interlayer insulating layer IL2 may be provided on the base substrate SUB in which the upper electrode UE is formed.

The data line Dj, the power line PL, the connecting line CNL, the auxiliary connecting line AUX, and the bridge pattern BRP may be provided on the second interlayer insulating layer IL2.

The data line Dj may be connected to the second source electrode SE2 through the sixth contact hole CH6 penetrating the first interlayer insulating layer IL1, the second interlayer insulating layer IL2, and the gate insulating layer GI. The power line PL may be connected to the upper electrode UE of the storage capacitor Cst through the third and fourth contact holes CH3 and CH4 penetrating the second interlayer insulating layer IL2.

The power line PL may be connected to the fifth source electrode SE5 through the fifth contact hole CH5 penetrating the first interlayer insulating layer IL1, the second interlayer insulating layer IL2, and the gate insulating layer GI.

The connecting line CNL may be connected to the first gate electrode GE1 through the first contact hole CH1 penetrating the first interlayer insulating layer IL1 and the second interlayer insulating layer IL2. The connecting line CNL may be connected to the third drain electrode DE3 and the fourth drain electrode DE4 through the second contact hole CH2 penetrating the first interlayer insulating layer IL1 and the second interlayer insulating layer IL2.

The auxiliary connecting line AUX may be connected to the initialization power line IPL through the eighth contact hole CH8 penetrating the second interlayer insulating layer IL2. The auxiliary connecting line AUX may be connected to the fourth source electrode SE4 and the seventh drain electrode DE7 in the previous row through the ninth contact hole CH9 penetrating the gate insulating layer GI, the first interlayer insulating layer IL1, and the second interlayer insulating layer IL2.

The bridge pattern BRP may be a pattern that is provided between the sixth drain electrode DE6 and the anode AD as a mediator to connect the sixth drain electrode DE6 and the anode AD. The bridge pattern BRP may be connected to the sixth drain electrode DE6 and the seventh source electrode SE7 through the seventh contact hole CH7 penetrating the gate insulating layer GI, the first interlayer insulating layer IL1, and the second interlayer insulating layer IL2.

The protective layer PSV may be provided on the base substrate SUB on which the the data line Dj is formed.

The anode AD may be provided on the protective layer PSV. The anode AD may be connected to the bridge pattern BRP through the tenth contact hole 10 CH10, which penetrates the protective layer PSV. Since the bridge pattern BRP is connected to the sixth drain electrode DE6 and the seventh source electrode SE7 through the contact hole CH7, the anode AD may be finally connected to the sixth drain electrode DE6 and the seventh source electrode SE7.

The pixel defining layer PDL for partitioning the pixel regions PA so as to correspond to each pixel PXL may be formed in the base substrate SUB. The pixel defining layer PDL may be formed on the base substrate SUB along the periphery of the pixel PXL and expose the upper surface of the anode AD.

The light emitting layer EML may be provided in the pixel regions PA surrounded by the pixel defining layer PDL, and the cathode CD may be provided on the light emitting layer EML.

A sealing layer SLM that covers the cathode CD may be provided on the cathode CD.

In an exemplary embodiment of the present invention, the second pixels PXL2 provided in the second pixel region PXA2 and the third pixels PXA3 provided in the third pixel region PXA3 may include substantially the same pixel structure with the first pixels PXL1, except for a dummy unit. Thus, the description thereof will be omitted for brevity.

The difference between the first pixel PXL1 and the second pixel PXL2 will be described below.

Figure 8A:
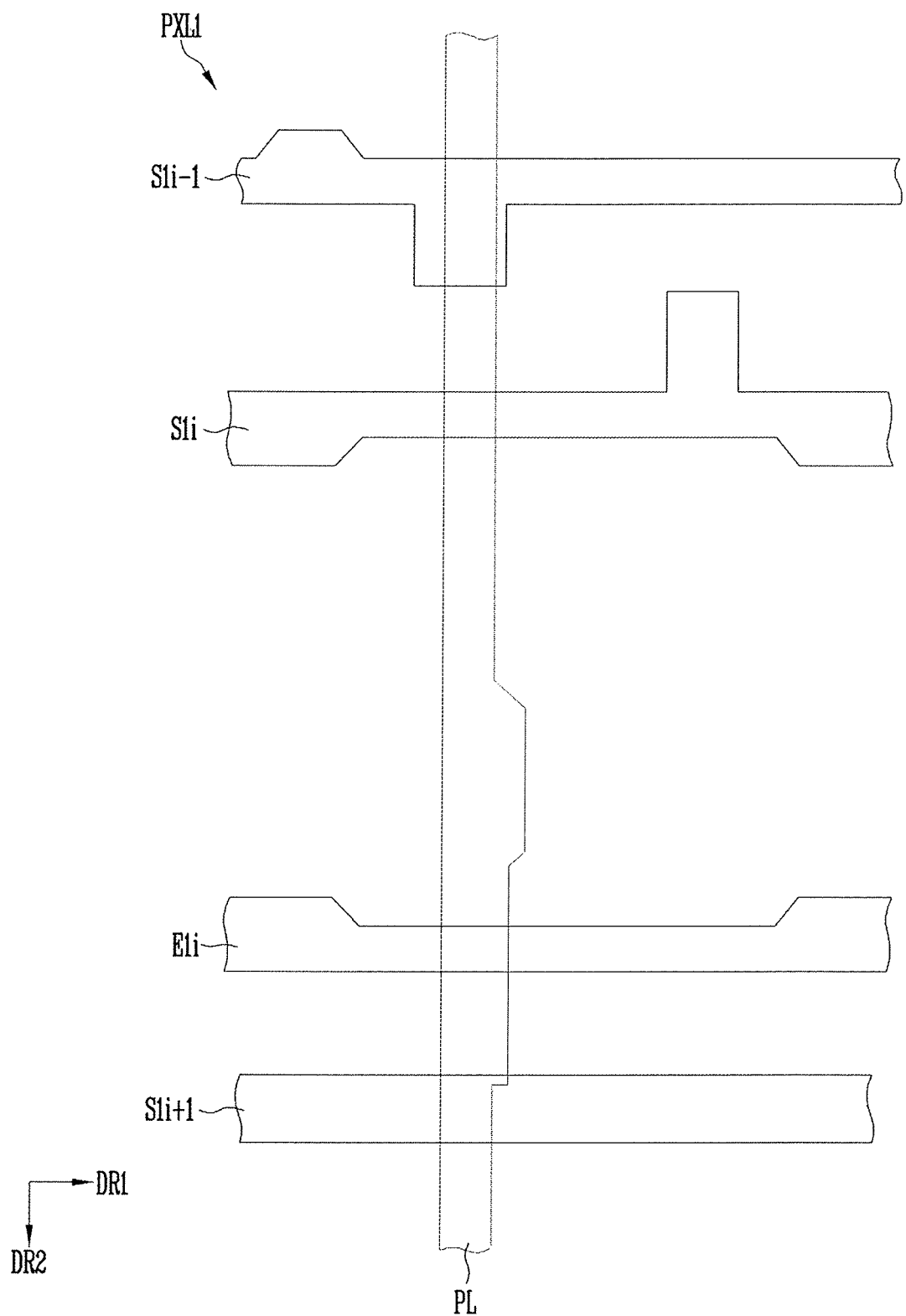
FIG. 8A is a plan view partially illustrating a first pixel in accordance with an exemplary embodiment of the present invention.
Figure 8B:
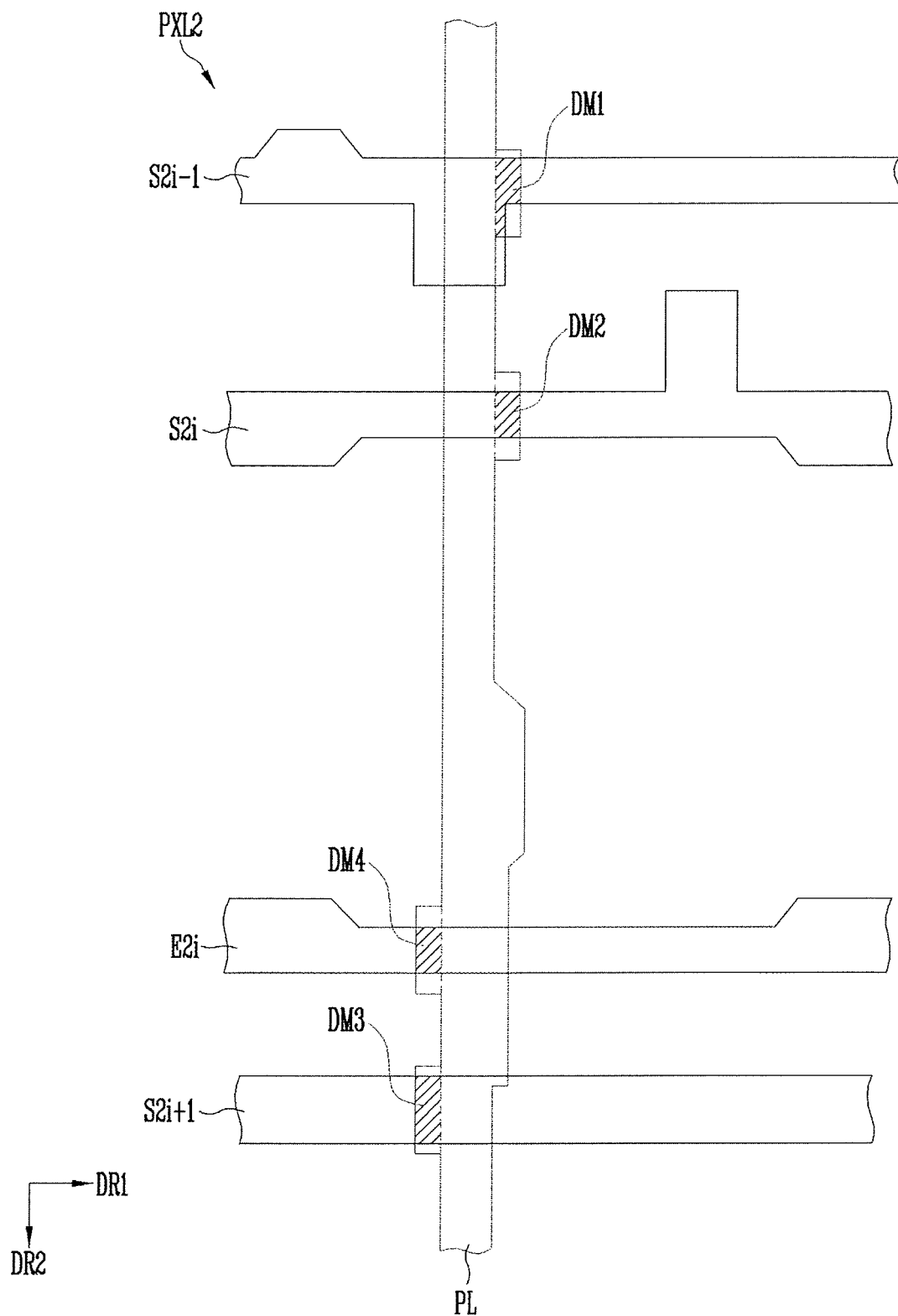
FIG. 8B is a plan view partially illustrating a second pixel in accordance with an exemplary embodiment of the present invention.

FIG. 8A is a plan view partially illustrating a first pixel PXL1 in accordance with an exemplary embodiment of the present invention. FIG. 8B is a plan view partially illustrating a second pixel PXL2 in accordance with an exemplary embodiment of the present invention. For convenience of explanation, partial constituent elements of one of the first pixels PXL1 and one of the second pixels PXL2 are shown. For example, in FIG. 8A, the first scan lines S1$i$−1, S1$i$ and S1$i$+1, the first light emitting control line E1$i$ and the power line PL are illustrated, and the second scan lines S2$i$−1, S2$i$ and S2$i$+1, the second light emitting control line E2$i$, the power line PL and the dummy unit are illustrated in FIG. 8B.

Referring to FIGS. 8A and 8B, unlike in the first pixels PXL1, the dummy unit may be provided in the second pixels PXL2. The dummy unit may include, for example, the dummy units DM1, DM2, DM3, DM4, etc.

The dummy units DM1, DM2, DM3, and DM4 may compensate for the difference between the load values of the scan lines in accordance with the pixel regions. The dummy unit may add a parasitic capacitance to a shorter scan line of the scan lines of first pixels PXL1 and the second pixels PXL2, for example, the scan line of one of the second pixels PXL2. By compensating the load values between the scan lines in different regions of the display device by using the parasitic capacitance, the dummy unit may cause the load values to be the same or substantially the same across the first to third substrate regions A1 to A3, regardless of the lengths of the scan lines S1$i$ to S1$n$, S21 to S2$n$, and S31 to S3$n$.

In an exemplary embodiment of the present invention, the dummy units DM1, DM2, DM3, and DM4 may be connected to the power line PL, may be provided in a shape protruding from the power line PL. The dummy units DM1, DM2, DM3, and DM4 may be provided integrally to be un-separated from the power line PL. The dummy units DM1, DM2, DM3, and DM4 may be formed by using the same process with the same material as the power line PL. Accordingly, dummy units DM1, DM2, DM3, and DM4 may be formed in the same layer as the power line PL and include the same material as the power line PL.

The dummy units DM1, DM2, DM3, and DM4 may be provided in a region of the display device in which the second scan lines S2$i$-1, S2$i$ and S2$i$+1 overlap the second light emitting control line E2$i$. As shown, dummy units DM1, DM2, DM3, and DM4 may include a first dummy pattern DM1, a second dummy pattern DM2, a third dummy pattern DM3, and a fourth dummy pattern DM4 respectively overlapping with an (i−1)th second scan line S2$i$−1, an ith second scan line S2$i$, an (i+1)th second scan line S2$i$+1, and the second light emitting control line E2$i$, among the second scan lines S2$i$−1, S2$i$ and S2$i$+1.

Further referring to FIGS. 6, 7A, and 7B, when viewed in cross-section, the first interlayer insulating layer IL1 and the second interlayer insulating layer IL2 may be interposed between. Accordingly, the parasitic capacitors may be formed between the (i−1)th scan line S1$i$−1, the ith first scan line S1$i$, the (i+1)th first scan line S1$i$+1, and the first light emitting control line E1$i$ and the power line PL. However, in an exemplary embodiment of the present invention, the dummy units DM1, DM2, DM3, and DM4 may be integrally formed with the power line PL and provided in an region in which the (i−1)th second scan line S2$i$−1, the ith second scan line S2$i$, and the (i+1)th second scan line S2$i$+1, and the second light emitting control line E2$i$ and the power line PL.

Accordingly, the dummy units DM1, DM2, DM3, and DM4 may increase parasitic capacitance between the (i−1)th second scan line S2$i$−1, the ith second scan line S2$i$, and the (i+1)th second scan line S2$i$+1, and the second light emitting control line E2$i$ and the power line PL by increasing an overlapping region of the (i−1)th second scan line S2$i$−1, the ith second scan line S2$i$, and the (i+1)th second scan line S2$i$+1, and the second light emitting control line E2$i$ and the power line PL.

In more detail, the first dummy patterns DM1 may be formed to be protruded from the power line PL at a position that intersect the (i−1)th second scan line S2$i$−1. A parasitic capacitance corresponding to the hatched portion may be added by the first dummy pattern DM1. In the same manner, the second dummy patterns DM2 may be formed to be protruded from the power line PL at the position that intersects the ith second scan line S2$i$, and A parasitic capacitance corresponding to the hatched portion may be added by the second dummy pattern DM2. The third dummy patterns DM3 may be formed to be protruded from the power line PL at the position that intersects the (i+1)th second scan line S2$i$+1. A parasitic capacitance corresponding to the hatched portion may be added by the third dummy pattern DM3.

Accordingly, when referring to the parasitic capacitance that is formed between the first scan lines S1$i$−1, S1$i$, and S1$i$+1, the first light emitting control line E1$i$ and the power line PL in the first pixels PXL1 as a first parasitic capacitance, and referring the parasitic capacitance formed between the second scan lines S2$i$−1, S2$i$ and S2$i$+1, the second light emitting control line E2$i$, and the power line PL as a second parasitic capacitance, the second parasitic capacitance may be larger than the first parasitic capacitance.

The second parasitic capacitance by the dummy unit may compensate the load values of the second scan lines S2$i$−1, S2$i$ and S2$i$+1 and the second light emitting control line E2$i$ by increasing loads of the second scan lines S2$i$−1, S2$i$ and S2$i$+1 and the second light emitting control line E2$i$. As a result, the second scan lines S2$i$−1, S2$i$ and S2$i$+1 and the second light emitting control line E2$i$ in the second pixel region PXA2, and the first scan lines S1$i$−1, S1$i$, and S1$i$+1 and the first light emitting control line E1$i$ in the first pixel region PXA1 may have the same or substantially the same load values as each other.

An additional parasitic capacitance may be determined depending on the load values of the scan lines to be compensated, and a desired load value may be achieved by varying the area of the overlapping portion of the dummy unit and the scan lines.

In an exemplary embodiment, for convenience of explanation, the first parasitic capacitance formed in the ith row of the first pixels PXL1 and the second parasitic capacitance formed in the ith row of the second pixels PXL2 are exemplified, but the present invention is not limited thereto. For example, the second parasitic capacitance formed in a k (k≠i) row of the second pixel region PXA2 may be greater than the first parasitic capacitance formed in the ith row of the first pixels PXL1. In addition, a parasitic capacitance formed in a l (l≠i) row of the third pixel region PXA3 may be greater than the first parasitic capacitance formed in the ith row of the first pixels PXL1.

In an exemplary embodiment of the present invention, when the lengths of the second scan lines S21 to S2$n$ and the second light emitting control lines E21 to E2$n$ in the second pixel region PXA2 are same as each other, the load values compensated by the dummy units DM1, DM2, DM3 and DM4 may be the same. In addition, when the lengths of the second scan lines S21 to S2$n$ and the second light emitting control lines E21 to E2$n$ in the second pixel region PXA2 are different from each other, the load values compensated by the dummy units DM1, DM2, DM3 and DM4 may be different.

According to an exemplary embodiment of the present invention, the difference of the load values caused by the third scan lines S3$i$−1, S3$i$ and S3$i$+1 and the third light emitting control line third pixel region PXA3 and the first scan lines S1$i$−1, S1$i$ and S1$i$+1 and the first light emitting control line E1$i$ in the first pixel region PXL1 may be compensated by the dummy units DM1, DM2, DM3 and DM4. Since the load values of the first to third scan lines S11 to S1$n$, S21 to S2$n$, and S31 to S3$n$ of the first to third pixel regions PXA1, PXA2 and PXA3, may be adjusted to be the same or substantially the same as each other, a brightness deviation of the image displayed in the first to third pixel regions PXA1, PXA2 and PXA3 may be reduced. Accordingly, the display device may display a high quality image.

According to an exemplary embodiment of the present invention, when lengths of the third scan lines S31 to S3$n$ and the third light emitting control lines E31 to E3$n$ in the third pixel region PXA3 are the same one another, the load values compensated by the dummy units DM1, DM2, DM3 and DM4 may be the same. In addition, when lengths of the third scan lines S31 to S3$n$ and the third light emitting control lines E31 to E3$n$ in the third pixel region PXA3 are the different from one another, the load values compensated by the dummy units DM1, DM2, DM3 and DM4 may be different.

In an exemplary embodiment of the present invention, the dummy unit may be implemented in various ways. In the exemplary embodiment described above, by using the parasitic capacitance between the scan lines and the power lines, the load values between the scan lines may be compensated, but the present invention is not limited thereto.

In an exemplary embodiment of the present invention, the dummy unit may compensate the load values between the scan lines by using the parasitic capacitance between the scan lines and the active pattern.

The second pixels PXL2 in the second pixel region PXA2 of FIGS. 2A, 2B and 3 will be described below.

Figure 9:
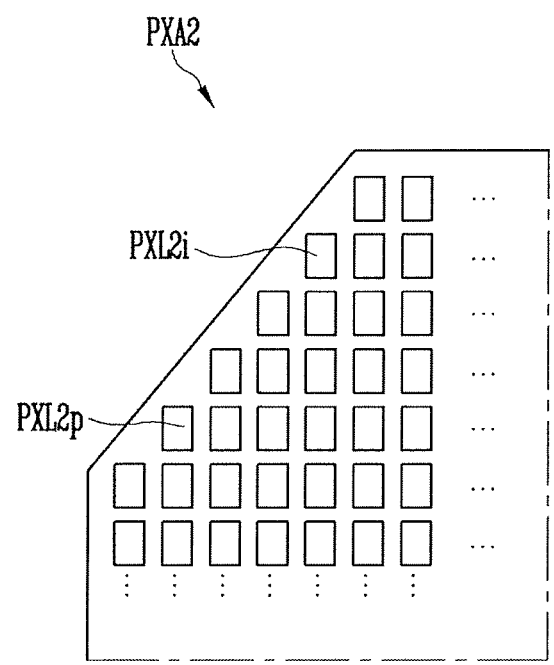
FIG. 9 is a plan view illustrating an arrangement of second pixels in an oblique edge region in a second region of FIGS. 2A and 3, in accordance with an exemplary embodiment of the present invention.
Figure 10A:
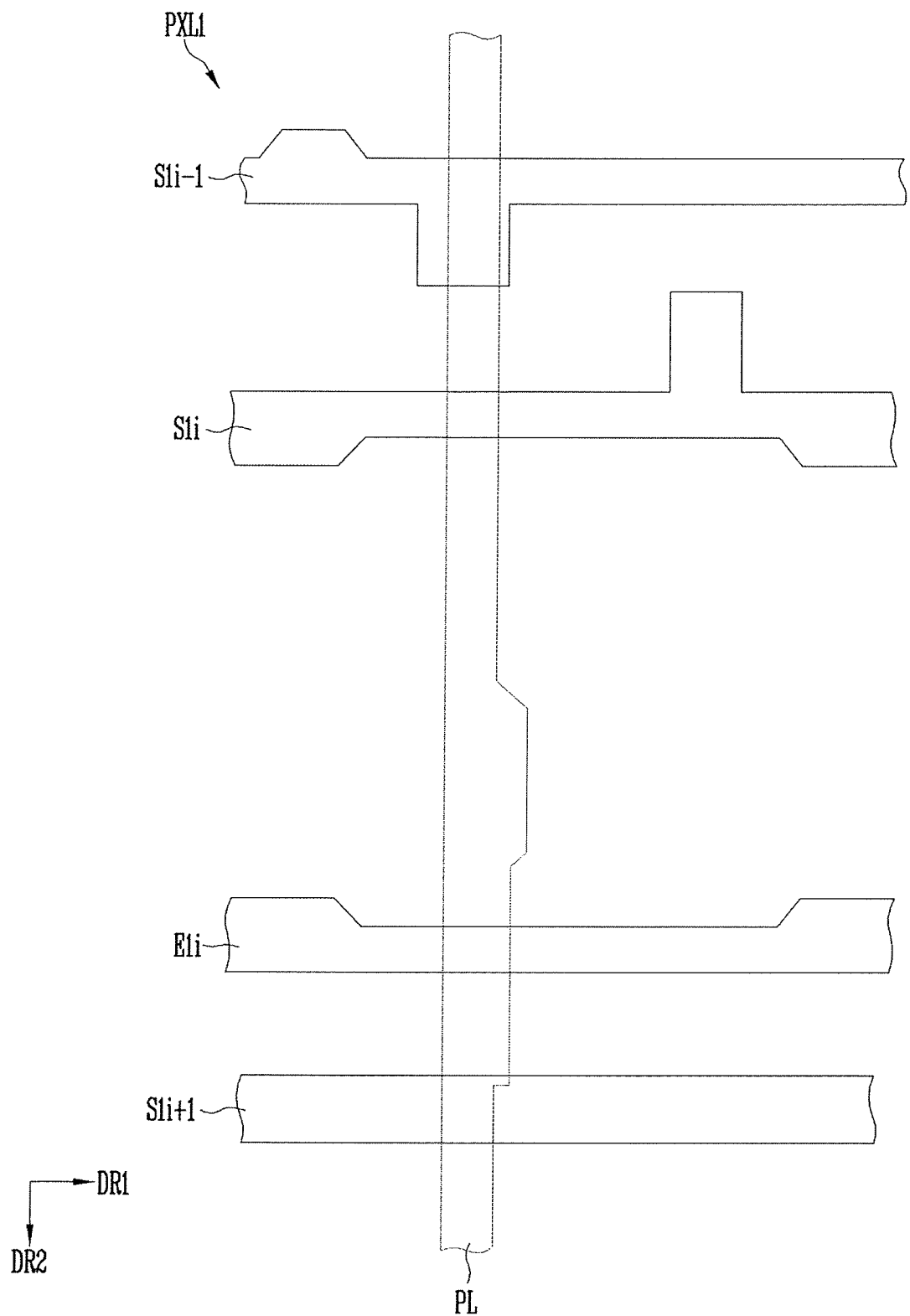
FIG. 10A is a plan view illustrating one of the first pixels in accordance with an exemplary embodiment of the present invention.
Figure 10B:
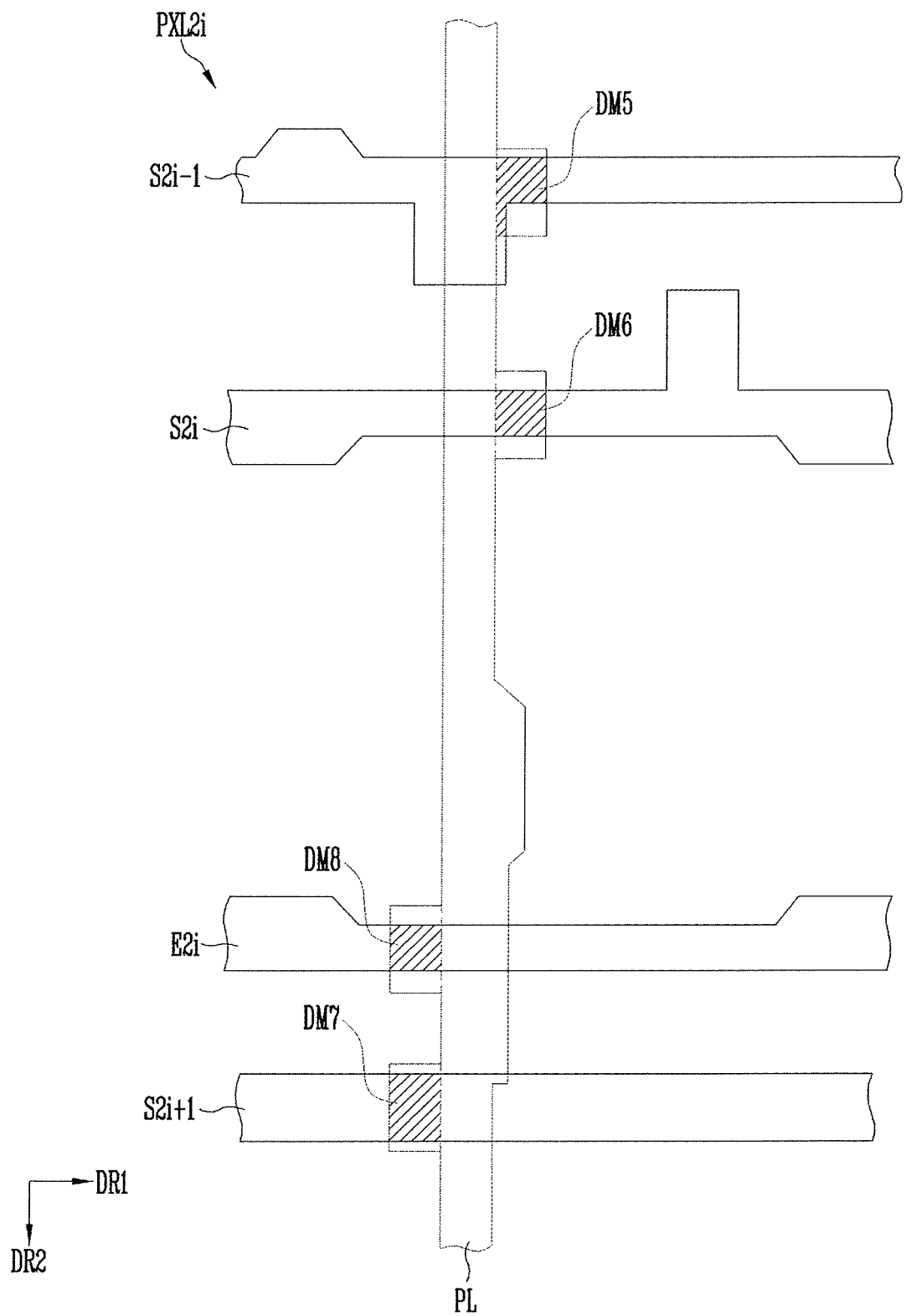
FIG. 10B is a plan view illustrating one of the second pixels in accordance with an exemplary embodiment of the present invention.
Figure 10C:
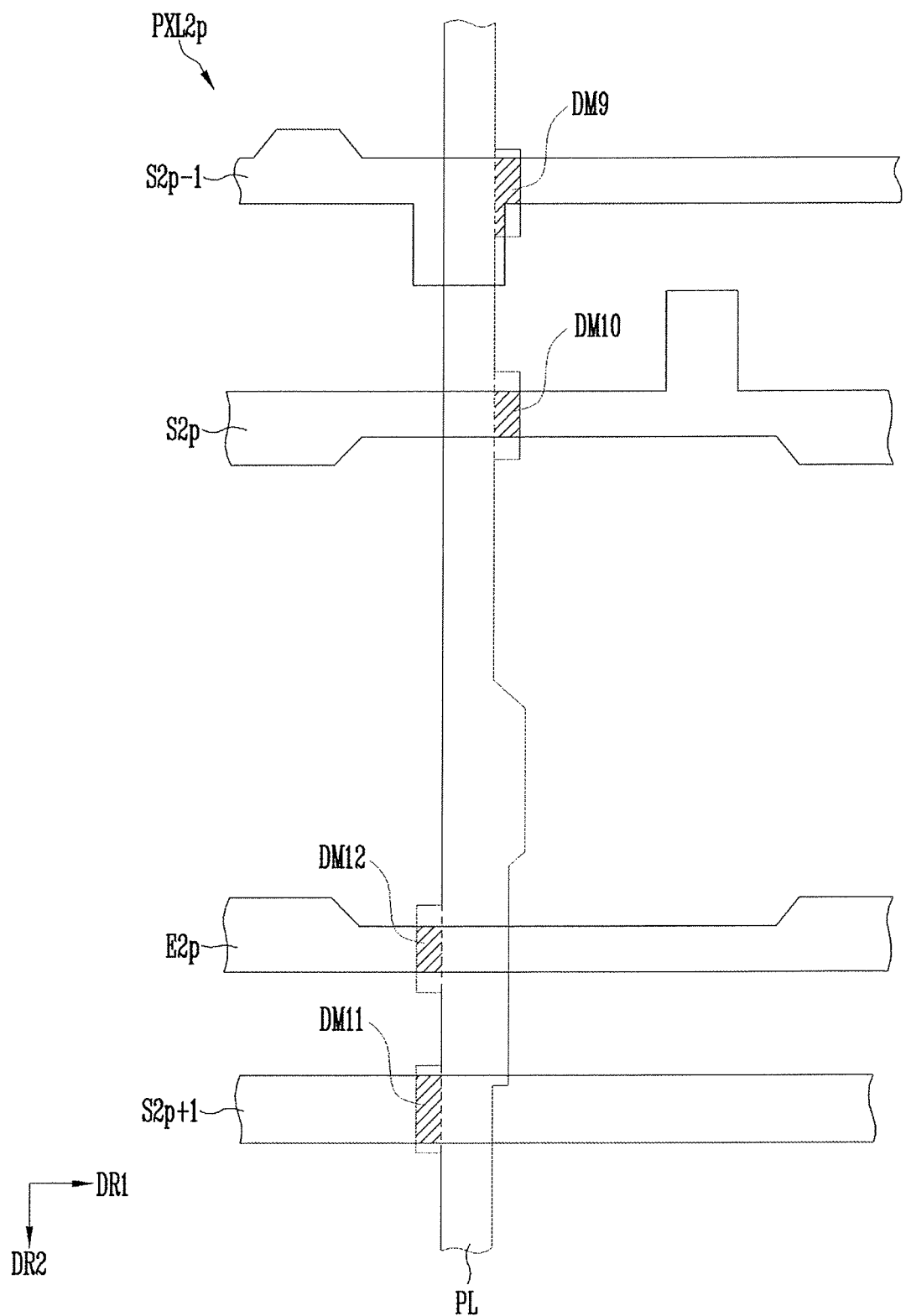
FIG. 10C is a plan view illustrating one of the second pixels in accordance with an exemplary embodiment of the present invention.

FIG. 9 is a plan view illustrating an arrangement of second pixels PXL2 in an oblique edge region in a second region of FIGS. 2A and 3, in accordance with an exemplary embodiment of the present invention. FIG. 10A is a plan view illustrating one of the first pixels PXL1 in accordance with an exemplary embodiment of the present invention. FIG. 10B is a plan view illustrating one of the second pixels PXL2 in accordance with an exemplary embodiment of the present invention. For example, FIG. 10B illustrates pixel PXL2$i$. FIG. 10C is a plan view illustrating one of the second pixels PXL2 in accordance with an exemplary embodiment of the present invention. For example, FIG. 10C illustrates pixel PXL2$p$ For convenience of explanation, partial constituent elements of the pixels PXL1 and PXL2 are shown. For example, the first scan lines S1$i$−1, S1$i$ and S1$i$+1, the first light emitting control line E1$i$ and the power line are shown in FIG. 10A. In FIG. 10B, three scan lines S2$i$−1, S2$i$ and S2$i$+1, arranged in the ith row and the jth column of the second pixel region PXA2, of the second scan lines S21 to S2$n$, are shown to be connected to one of the second pixels PXL2. In addition, in FIG. 10B, the second light emitting control line E2$i$ and the power line PL are shown. In FIG. 10C, three scan lines S2$p$−1, S2$p$ and S2$p$+1, arranged in the ith row and the jth column of the second pixel region PXA2, of the second scan lines S21 to S2$n$, are shown to be connected to the second pixel PXL2$p$. In addition, in FIG. 10C, the second light emitting control line E2$p$ and the power line PL are shown.

Referring to FIGS. 10B and 10C, for convenience of explanation, the second line in the (i−1)th row is referred to as "an (i−1)th second scan line S2$i$−1", the second scan line in the ith row is referred to as "an ith second scan line S2$i$", the second scan line in the (i+1)th row is referred to as "an (i+1)th second scan line S2$i$+1", the second scan line the the (p−1)th row is referred to as "a (p−1)th second scan line S2$p$−1", the second scan line of the pth row is referred to as "a pth second scan line S2$p$", and the second scan line in the (p+1)th row is referred to as "a (p+1)th second scan line S2$p$+$i$".

Referring to FIGS. 9 and 10A to 10C, unlike in one of the first pixels PXL1, the dummy unit may be provided in the second pixels PXL2. In addition, the sizes of the dummy units of the second scan lines S2$i$−1, S2$i$, S2$i$+1, S2$p$−1, S2$p$ and S2$p$+1 may be different from one another. The second scan lines S2$i$−1, S2$i$, S2$i$+1, S2$p$−1, S2$p$ and S2$p$+1 may have different lengths with respect to each other.

The dummy units DM5, DM6, DM7, DM8, DM9, DM10, DM11 and DM12 may compensate for the difference between the load values of the scan lines in accordance with the areas where the pixels PXL are disposed. The units DM5, DM6, DM7, DM8, DM9, DM10, DM11 and DM2 may add parasitic capacitance to a shorter scan line of the scan lines of the first pixel PXL1 and the second pixel PXL2, for example, the scan lines S21 to S2$n$ of the second pixel PXL2. The dummy units DM5, DM6, DM7, DM8, DM9, DM10, DM11 and DDM12 may cause the same or substantially the same load values in the scan lines S21 to S2$n$ of the second region A2 based on the lengths of the scan lines S21 to S2$n$ by compensating the load values between the scan lines S21 to S2$n$ in the different areas of the second region A2.

In an exemplary embodiment of the present invention, dummy units DM5, DM6, DM7, DM8, DM9, DM10, DM11 and DM12 may be connected to the power line PL or protrude from the power line PL.

The dummy units DM5, DM6, DM7, DM8, DM9, DM10, DM11 and DM12 may be provided at regions where the second scan lines S2$i$−1, S2$i$, S2$i$+1, S2$p$−1, S2$p$ and S2$p$+1 respectively overlap the power line PL, and at regions where the second emitting control lines E2$i$ and E2$p$ respectively overlap the power line PL. As shown, the dummy units DM5, DM6, DM7, DM8, DM9, DM10, DM11 and DM12 may include the ($i$−1)th second scan line S2$i$−1, the $i$th second scan line S2$i$, the ($i$+1)th second scan line S2$i$+1, the ($p$−1)th second scan line S2$p$−1, the $p$th second scan line S2$p$, the ($p$+1)th second scan line S2$p$+1 of the second scan lines S2$i$−1, S2$i$, S2$i$+1, S2$p$−1, S2$p$, S2$p$+1. In addition, the fifth dummy pattern DM5, the sixth dummy patterns DM6, the seventh dummy pattern DM7, the eighth dummy pattern DM8, the ninth dummy patterns DM9, the tenth dummy pattern DM10, the eleventh dummy pattern DM11 and the twelfth dummy pattern DM12 may each overlapped with the second light emitting control line E2$i$.

The second scan lines S2$i$−1, S2$i$, S2$i$+1, may be shorter than the second scan lines S2$p$−1, S2$p$ and S2$p$+1. In addition, the second light emitting control line E2$i$ may be shorter than the second light emitting control line E2$p$. Accordingly, the areas of the dummy units DM5, DM6, DM7 and DM8 may be greater than the areas of the dummy units DM9, DM10, DM11 and DM12. Therefore, the parasitic capacitance formed by the dummy units DM5, DM6, DM7 and DM8 may be greater than the parasitic capacitance formed by the dummy units DM9, DM10, DM11 and DM12.

Therefore, when accounting for the parasitic capacitance of the dummy units DM5 to DM12, the load values of the second scan lines S2$i$−1, S2$i$, S2$i$+1, S2$p$−1, S2$p$ and S2$p$+1 and the second light emitting control lines E2$i$ and E2$p$ may be equal to each other.

The parasitic capacitance may be set differently depending on the load values of the second scan lines S21 to S2$n$ and the second light emitting control lines E21 to E2$n$ to be compensated. The parasitic capacitance may be achieved by varying an overlapping region of the dummy unit and the second scan lines S21 to S2$n$, and an overlapping region of the dummy unit and the second light emitting control lines E21 to E2$n$.

In this exemplary embodiment, for convenience of explanation, the first pixels PXL1 in the $i$th row of the first pixel region PXA1, and the second pixels PXL2 in the $p$th row of the second pixel region PXL2 are illustrated, but the present invention is not limited thereto. For example, the parasitic capacitance may vary depending on the second pixels PXL2 in the $k$th ($k$≠$i$) row of the second pixel region PXA2, the second scan lines S21 to S2$n$ connected to the second pixel PXL2 in the $p$th row of the second pixel regions PXA2 and the overlapping region of the second light emitting control lines E21 to E2$n$ and the dummy unit.

In an exemplary embodiment of the present invention, the difference between the third scan lines S31 to S3$n$ and the third light emitting control lines E31 to E3$n$ of the third pixel region PXA3, and the first scan lines S21 to S2$n$ and the first light emitting control lines E11 to E1$n$ of the first pixel region PXA1 may be compensated by the dummy units DM5, DM6, DM7, DM8, DM9, DM10, DDM11 and DM12. The load values of the second and third scan lines S21 to S2$n$ and S31 to S3$n$ and the second and third light emitting control lines E21 to E2$n$ and E31 to E3$n$ of the second and third pixel regions PXA2 and PXA3 may be compensated. Accordingly, a brightness variation of an image that occurs due to a load difference of the scan lines in the same pixel region may be reduced.

In an exemplary embodiment of the present invention, the dummy unit may be implemented in various ways. According to the exemplary embodiment described above, the load values between the scan lines may be compensated by using the parasitic capacitance between the scan lines and the power lines, but the present invention is not limited thereto.

In an exemplary embodiment of the present invention, the dummy unit may compensate the load value between the scan lines by using the parasitic capacitance between the dummy scan lines and the active pattern.

Figure 11A:
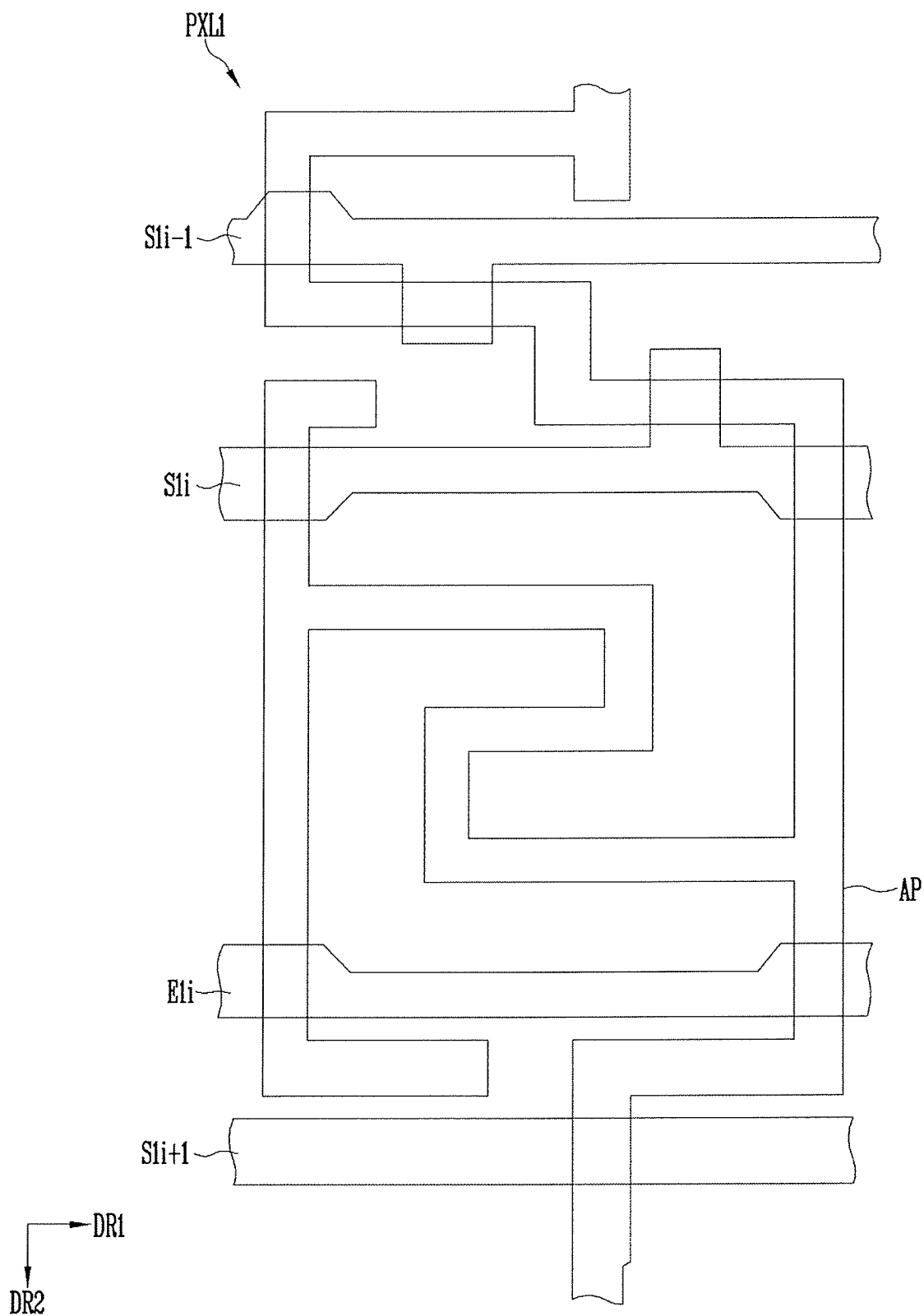
FIG. 11A is a plan view illustrating one of the first pixels in accordance with an exemplary embodiment of the present invention.
Figure 11B:
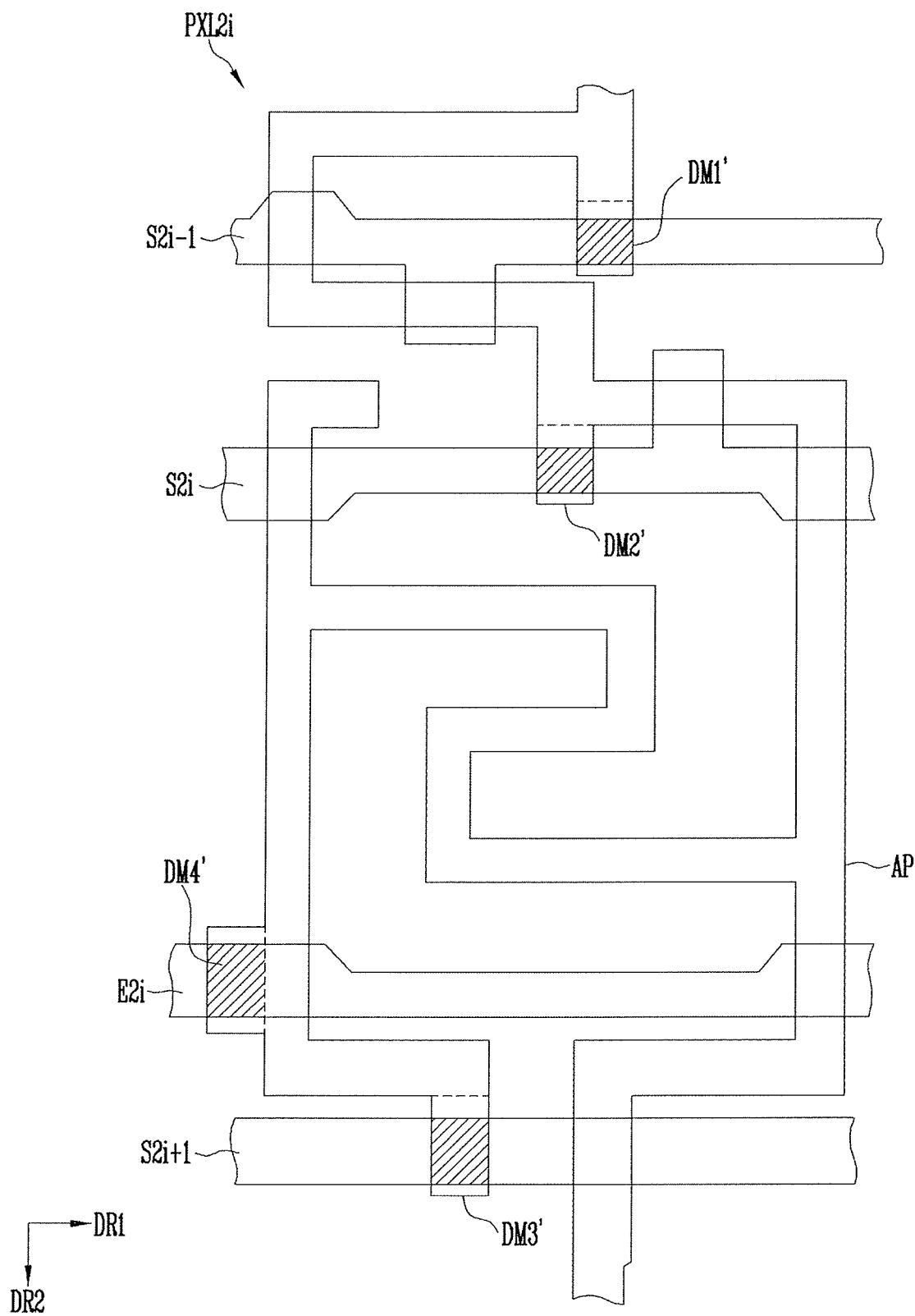
FIG. 11B is a plan view illustrating one of the second pixels in accordance with an exemplary embodiment of the present invention.

FIG. 11A is a plan view illustrating one of the first pixels PXL1 in accordance with an exemplary embodiment of the present invention. FIG. 11B is a plan view illustrating one of the second pixels PXL2 in accordance with an exemplary embodiment of the present invention. For example, FIG. 11B illustrates the second pixel PXL2$i$. For convenience of explanation, reference numerals of partial constituent elements of the pixels PXL are described. For example, in FIG. 11A, the first scan lines S1$i$−1, S1$i$ and S1$i$+1, the first light emitting control line E1$i$ and the active pattern AP are shown, and the second scan lines S2$i$−1, S2$i$ and S2$i$+1 and the second light control line E2$i$, the active pattern AP and the dummy units DM1', DM2', DM3' and DM4' (hereafter, DM') are shown in FIG. 11B.

Referring to FIGS. 11A and 11B, the dummy units DM1', DM2', DM3' and DM4' that compensate the difference of the load values of the scan lines in a second pixel PXL2$i$ of the second pixels PXL2 may be provided. As described above, the dummy units DM1', DM2', DM3' and DM4' may add the parasitic capacitance to the shorter scan line of the scan lines having the difference lengths, for example, the scan lines connected to the second pixel PXL2$i$. By compensating the load values between the scan lines in different regions, the dummy unit may cause the load values to be the same or substantially the same as each other by taking into consideration the lengths of the scan lines.

In an exemplary embodiment of the present invention, the dummy units DM1', DM2', DM3' and DM4' may be connected to an active pattern AP and provided with a shape protruding from the active pattern AP. The dummy units DM1', DM2', DM3' and DM4' may be provided integrally with the active pattern AP to not be separated from each other. The dummy units DM1', DM2', DM3' and DM4' may be formed by using the same process with the same material as the active pattern AP. Accordingly, the dummy units DM1', DM2', DM3' and DM4' may be formed on the same layer with the active pattern AP and include the same material. For example, the dummy units DM1', DM2', DM3' and DM4' may be formed of a semiconductor material that is undoped or doped.

The dummy units DM1', DM2', DM3' and DM4' may be provided in a region that is overlapped with the second scan lines S2$i$−1, S2$i$ and S2$i$+1 and the second light emitting control line E2$i$. As shown, the dummy units DM1', DM2', DM3' and DM4' may include the first dummy patterns DM1, the second dummy patterns DM2', the third dummy patterns DM3' and the fourth dummy pattern DM4' that are overlapped with the (i−1)th second scan line S2$i$−1, the i th second scan line S2$i$, the (i+1)th second scan line S2$i$+1 and the second light emitting control line E2$i$, respectively, the second scanning lines S2$i$−1, S2$i$, and S2$i$+1 and the second light emitting control line E2$i$.

Further referring to FIGS. 6, 7A, and 7B, when viewed in a cross-section, a gate insulating layer GI may be interposed between the (i−1)th first scan line S1$i$−1, the ith first scan line S1$i$, the (i+1)th first scan line S1$i$+1 and the first light emitting control line E1$i$ and the active pattern AP. Accordingly, the parasitic capacitance may be formed between the ith first scan line S1$i$, the (i+1)th first scan line S1$i$+1 and the first light emitting control line E1$i$ and the active pattern AP. According to an exemplary embodiment of the present invention, the dummy units DM1', DM2', DM3' and DM4' may be formed of the same material as the active pattern AP on the layer the active pattern AP is formed, and may overlap the ith second scan line S2$i$, the (i+1)th second scan line S2$i$+1 and the second light emitting control line E2$i$. Therefore, an additional parasitic capacitance may be formed between the ith second scan line S2$i$, the (i+1)th second scan line S2$i$+1 and the second light emitting control line E2$i$ and the dummy units DM1', DM2', DM3' and DM4'. The additional parasitic capacitance may cause the load values of the scan lines to be equal or substantially equal to each other.

In more detail, the first dummy pattern DM1' may be formed at an arbitrary position on the (i−1)th second scan line S2$i$−1 on the layer same with the active pattern AP, and the parasitic capacitance corresponding to the hatched portion may be added. The second dummy pattern DM2' may be formed at an arbitrary position on the ith second scan line S2$i$ on the layer same with the active pattern and the parasitic capacitance corresponding to the hatched portion may be added. The third dummy pattern DM3' may be formed at an arbitrary position on the (i+1)th second scan line S2$i$+1 on the layer same with the active pattern AP and the parasitic capacitance corresponding to the hatched portion may be added. The fourth dummy pattern DM4' may be formed at an arbitrary position on the second light emitting control line E2$i$ on the layer same with the active pattern AP and the parasitic capacitance corresponding to the hatched portion may be added.

Accordingly, when referring the parasitic capacitance formed by the scan lines S1$i$−1, S1$i$, and S1$i$+1 and the first light emitting control line E1$i$ in the first pixel PXL1 and the active pattern AP as the third parasitic capacitance, and referring to the parasitic capacitance formed by the scan lines S2$i$−1, S2$i$ and S2$i$+1 and the second light emitting control line E2$i$ in the second pixel PXL2, the active pattern AP and the dummy units DM1', DM2', DM3' and DM4' as the fourth parasitic capacitance, the fourth parasitic capacitance may be greater than the third parasitic capacitance.

The fourth parasitic capacitance may compensate the load value of the second scan lines S2$i$−1, S2$i$ and S2$i$+1 and the second light emitting control line E2$i$ by increasing the load of the second scan lines S2$i$−1, S2$i$ and S2$i$+1 and the second light emitting control line E2$i$. As a result, the load values of the second scan lines S2$i$−1, S2$i$ and S2$i$+1 and the second light emitting control line E2$i$ in the second pixel region PXA2 and the load values of the first scan lines S1$i$−1, S1$i$ and S1$i$+1 and the first light emitting control line E1$i$ in the first pixel region PXA1 may be the same or substantially the same as each other.

The additional parasitic capacitance may be set differently depending on the load values of the scan lines to be compensated, and the load value may be achieved by varying the area of the overlapping portion of the dummy unit and the scan lines.

In an exemplary embodiment of the present invention, the third parasitic capacitance formed in the ith row of the first pixels PXL1 in the first pixel region PXA1 and the fourth parasitic capacitance formed the ith row of the second pixels PXL2 in the second pixel region PXA2 are exemplified, but the present invention is not limited thereto. For example, the fourth parasitic capacitance formed in the kth (k≠i) row of the second pixels PXL2 in the second pixel region PXA2 may be greater than the third parasitic capacitance formed in the ith row of the first pixels PXL1 in the first pixel region PXA1.

Further, the parasitic capacitance formed in the lth (l≠i) row of the third pixels PXL3 in the third pixel region PXA3 may be greater than the third parasitic capacitance formed in the ith row of the first pixels PXL1 in the first pixel region PXA1.

In an exemplary embodiment of the present invention, when the lengths of the second scan lines S21 to S2$n$ and the second light emitting control lines in the second pixel region PXA2 are the same as each other, the load values compensated by the dummy units DM1', DM2', DM3' and DM4' may be the same. In addition, when the lengths of the second scan lines S21 to S2$n$ and the second light emitting control lines in the second pixel region PXA2 are different from each other, the load values compensated by the dummy units DM1', DM2', DM3' and DM4' may be different from each other In an exemplary embodiment of the invention, the difference of the load values between the third scan lines S31 to S3$n$ and the third light emitting control lines E31 to E3$n$ in the third pixel region PXA3 and the first scan lines S1$i$ 1, S1$i$ and S1$i$+1 and the first light emitting control line E1$i$ in the first pixel region PXA1 may be compensated by the dummy units DM1', DM2', DM3' and DM4'.

By compensating the load value of the second and third scan lines S21 to S2$n$ and S31 to S3$n$ and the second and third light emitting control lines E21 to E2$n$ and E31 to E3$n$ in the second and third pixel regions PXA2 and PXA3, the brightness deviation of the image in the first to third pixel regions PXA1 to PXA3 may be reduced. Accordingly, the display device may display a high quality image.

In an exemplary embodiment of the present invention, the dummy unit may be implemented in various ways. According to the above-described exemplary embodiment, the load values of the scan lines may be compensated by increasing the parasitic capacitance in the pixel regions PXA, but the present invention is not limited thereto.

In an exemplary embodiment of the present invention, the dummy units may compensate the load value between the scan lines by using the parasitic capacitor additionally provided in the peripheral region.

Figure 12:
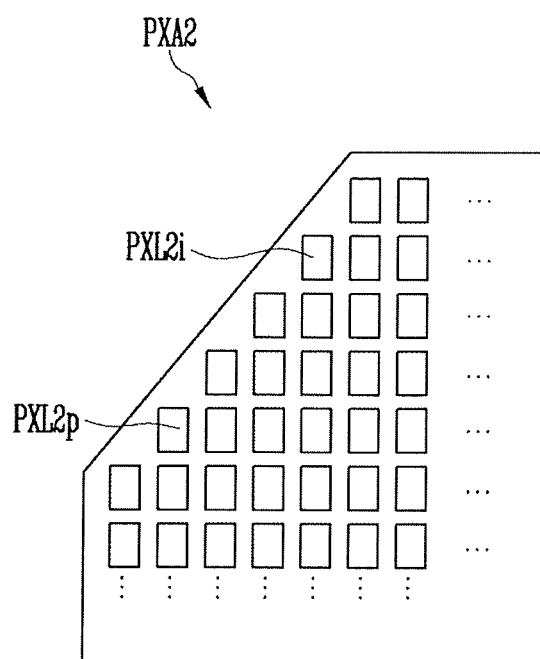
FIG. 12 is a plan view illustrating an arrangement of second pixels in an oblique edge region in a second region of FIGS. 2A and 3, in accordance with an exemplary embodiment of the present invention.
Figure 13A:
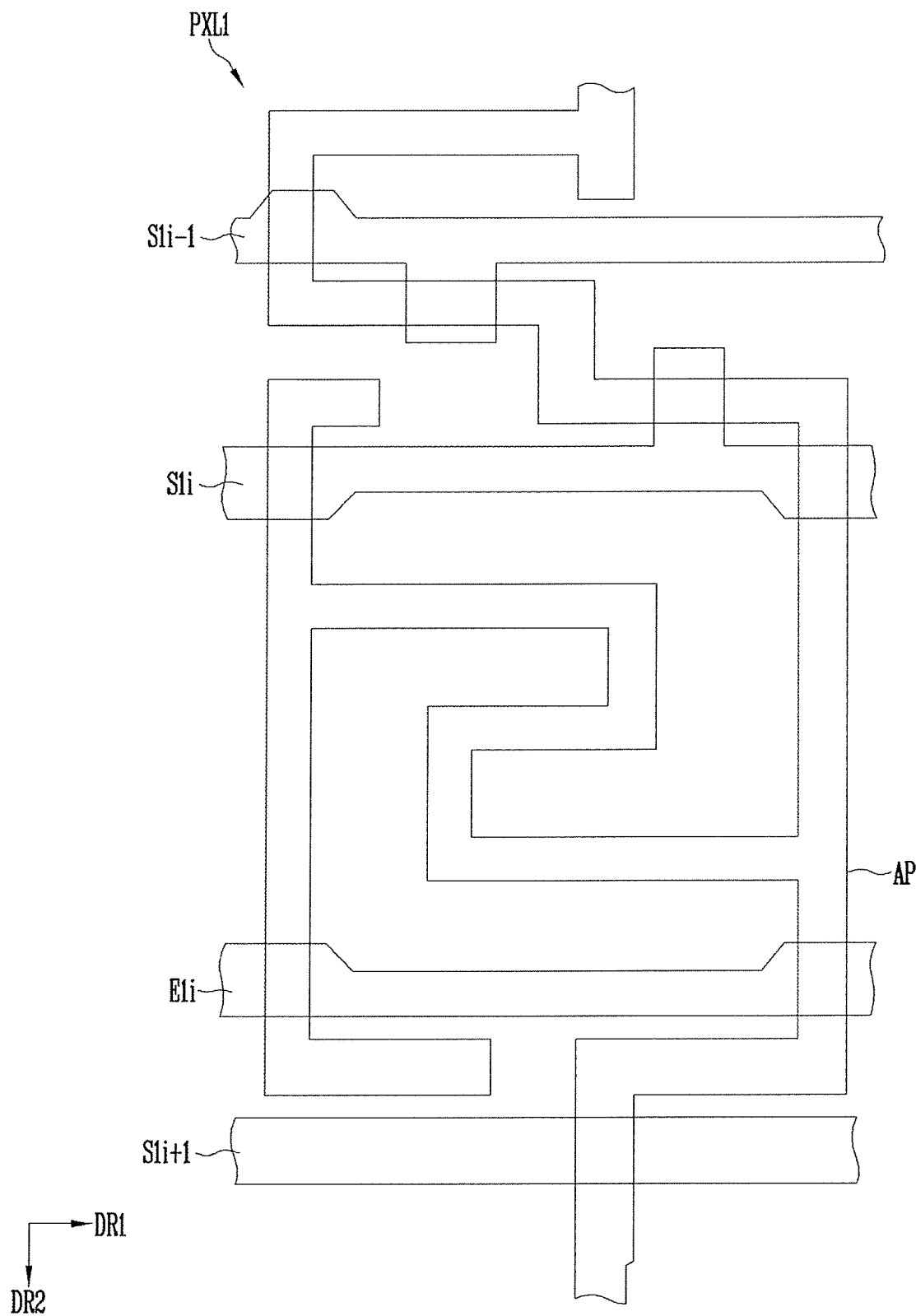
FIG. 13A is a plan view illustrating a first pixel in accordance with an exemplary embodiment of the present invention.
Figure 13B:
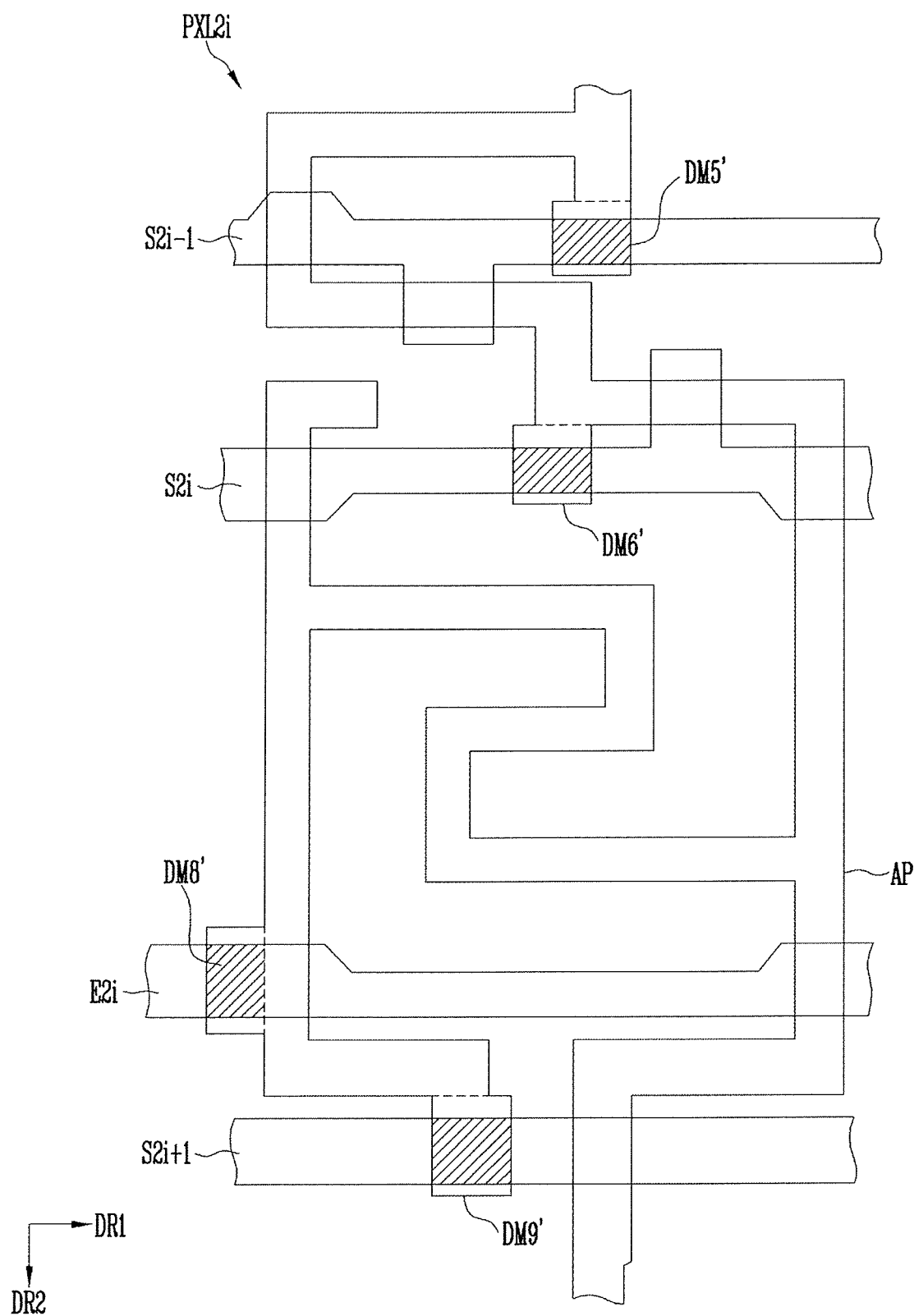
FIG. 13B is a plan view illustrating a second pixel in accordance with an exemplary embodiment of the present invention.
Figure 13C:
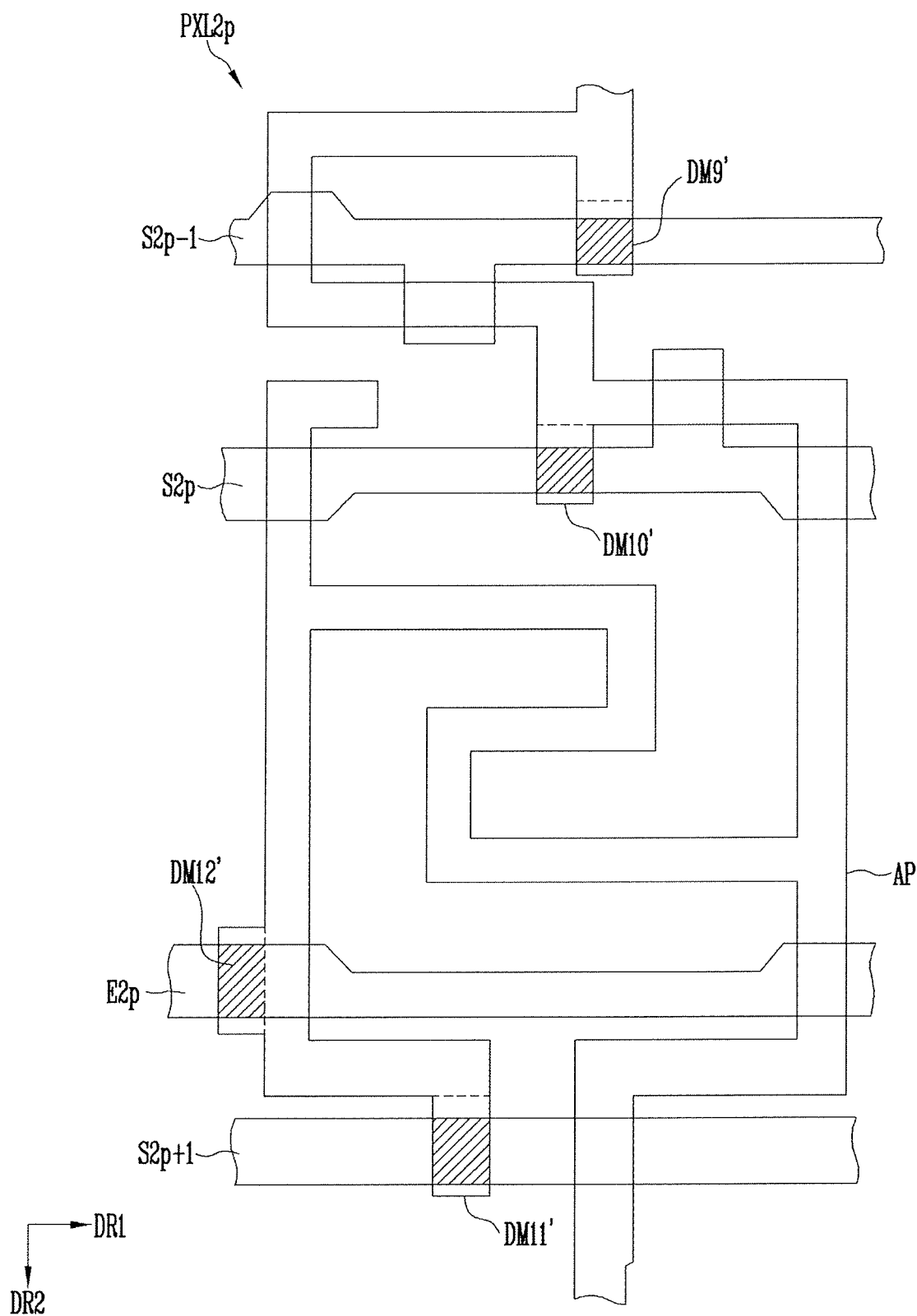
FIG. 13C is a plan view illustrating a second pixel in accordance with an exemplary embodiment of the present invention.

FIG. 12 is a plan view illustrating an arrangement of second pixels PXL2 in an oblique edge region in a second region of FIGS. 2A and 3, in accordance with an exemplary embodiment of the present invention. FIG. 13A is a plan view illustrating a first pixel PXL1 in accordance with an exemplary embodiment of the present invention. FIG. 13B is a plan view illustrating a second pixel PXL2$i$ in accordance with an exemplary embodiment of the present invention. FIG. 13C is a plan view illustrating a second pixel PXL2$p$ in accordance with an exemplary embodiment of the present invention. For convenience of explanation, reference numerals of partial constituent elements of the pixels PXL1 and PXL2 are shown. For example, in FIG. 13A, the first scan lines S1$i$−1, S1$i$ and S1$i$+1, the first light emitting control line E1$i$ and the active pattern AP are illustrated. The second scan lines S2$i$−1, S2$i$, S2$i$+1, S2$p$−1, S2$p$ and S2$p$+1, the second light emitting control lines E2$i$ and E2$p$, the active pattern AP, and the dummy units DM1', DM2' and DM3' (hereafter, DM') are illustrated in FIGS. 13B and 13C.

FIGS. 12 and 13A to 13C, illustrate the dummy units DM5', DM6', DM7', DM8, DM9', DM10, DM11' and DM12' for compensating the difference of the load value of the scan lines according to the pixel region PXA. The dummy units DM5', DM6', DM7', DM8, DM9', DM10, DM11' and DM12' may be provided in the second pixels PXL2. The sizes of the dummy units in the second pixels PXL2 with different lengths of the second scan lines S2$i$−1, S2$i$, S2$i$+1, S2$p$−1, S2$p$ and S2$p$+1 and the second light emitting control line E2$i$ and E2$p$ may be different from each other.

In an exemplary embodiment of the present invention, the dummy units DM5', DM6', DM7', DM8', DM9', DM10', DM1' and DM12' may be connected to the active pattern AP or may protrude from the active pattern AP.

The dummy units DM5', DM6', DM7', DM8', DM9', DM10', DM11' and DM12' may be provided in an region that overlaps with the second scan lines S2$i$−1, S2$i$, S2$i$+1, S2$p$−1, S2$p$ and S2$p$+1 and the second emitting control lines E2$i$ and E2$p$. As shown, the dummy portion DM5', DM6', DM7', DM8', DM9', DM10', DM11' and DM12' may include the fifth dummy patterns DM5', the sixth dummy patterns DM6', the seventh dummy pattern DM7', the eighth dummy pattern DM8', the ninth dummy pattern DM9', the dummy pattern DM10', the dummy pattern DM11' and the dummy pattern DM12' overlapping with the (i−1)th second scan line S2$i$−1, the i th second scan line S2$i$, the (i+1) th second scan line S2$i$+1, the (p−1)th second scan line S2$p$−1, the pth second scan line S2$p$, the (p+1)th second scan line S2$p$+1 of the second scan lines S2$i$−1, S2$i$, S2$i$+1, S2$p$−1, S2$p$ and S2$p$+1 and the second light emitting control lines E2$i$ and E2$p$.

The second scan lines S2$i$−1, S2$i$, S2$i$+1 may be shorter than the second scan lines S2$p$−1, S2$p$ and S2$p$+1. In addition, the second light emitting control line E2$i$ may be shorter than the second light emitting control line E2$p$. Accordingly, the areas of the dummy units DM5', DM6', DM7' and DM8' may be greater than the areas of the dummy units DM9', DM10, DM11' and DM12'. Thus, the parasitic capacitance formed by the dummy units DM5', DM6', DM7' and DM8' may be greater than the parasitic capacitance formed by the dummy units DM9', DM10, DM11' and DM12'.

Therefore, due to the parasitic capacitances of the dummy units DM5' to DM12', the load values of the second scan lines S2$i$−1, S2$i$ and S2$i$+1 and the second light emitting control lines E2$i$ may be same or substantially the same as the load values of the load value of the second scan lines S2$i$−1, S2$i$, S2$i$+1 and S2$p$−1 and the second light emitting control line E2$p$. The parasitic capacitances of the dummy units DM5', DM6', DM7' and DM8' and the dummy units DM9', DM10', DM11' and DM12' may be set differently depending on the load values of the second scan lines to be compensated. This may be done to achieve equal or substantially equal load values in the second scan lines S2$i$−1, S2$i$ and S2$i$+1, the second light emitting control lines E2$i$, the second scan lines S2$i$−1, S2$i$, S2$i$+1 and S2$p$−1 and the second light emitting control line E2$p$ by varying the overlapping region of the dummy unit and the scan lines.

In an exemplary embodiment of the exemplary embodiment, for convenience of explanation, the first pixel PXL1 in the ith row of the first pixel region PXA1, the second pixel PXA2$i$ in the ith row of the second pixel region PXA2, and the second pixel PXL2$p$ in the pth row of the second pixel region PXL2 were described. However, the present invention is not limited thereto. For example, the parasitic capacitance may vary depending on an region of the dummy unit overlapped with the second scan lines S21 to S2$n$ and the second light emitting control lines E21 to E2$n$ connected to the second pixel PXL2 in the kth (k≠i) row of the second pixel region PXA2 and the second pixel PXL2$p$ in the pth row of the second pixel region PXA2.

According to an exemplary embodiment of the present invention, the difference of the load values between the third scan lines S31 to S3$n$ and the third light emitting control lines E31 to E3$n$ in the third pixel region PXA3, and the first scan lines S1$i$−1, S1$i$ and S1$i$+1 and the first light emitting control line E1$i$ in the first pixel region PXA1 may be compensated by the dummy units DM5', DM6', DM7', DM8', DM9', DM10', DM11, and DM12.

In an exemplary embodiment of the present invention, the dummy unit may be implemented in a variety of ways. According to the above-described exemplary embodiment, the load values of the scan lines may be compensated by increasing the parasitic capacitance in an area of the substrate SUB occupied by each individual pixel PXL. However, the present invention is not limited thereto.

In an exemplary embodiment of the present invention, the dummy unit may compensate the load value between the scan lines by using the parasitic capacitance provided in the peripheral regions PPA.

Figure 14:
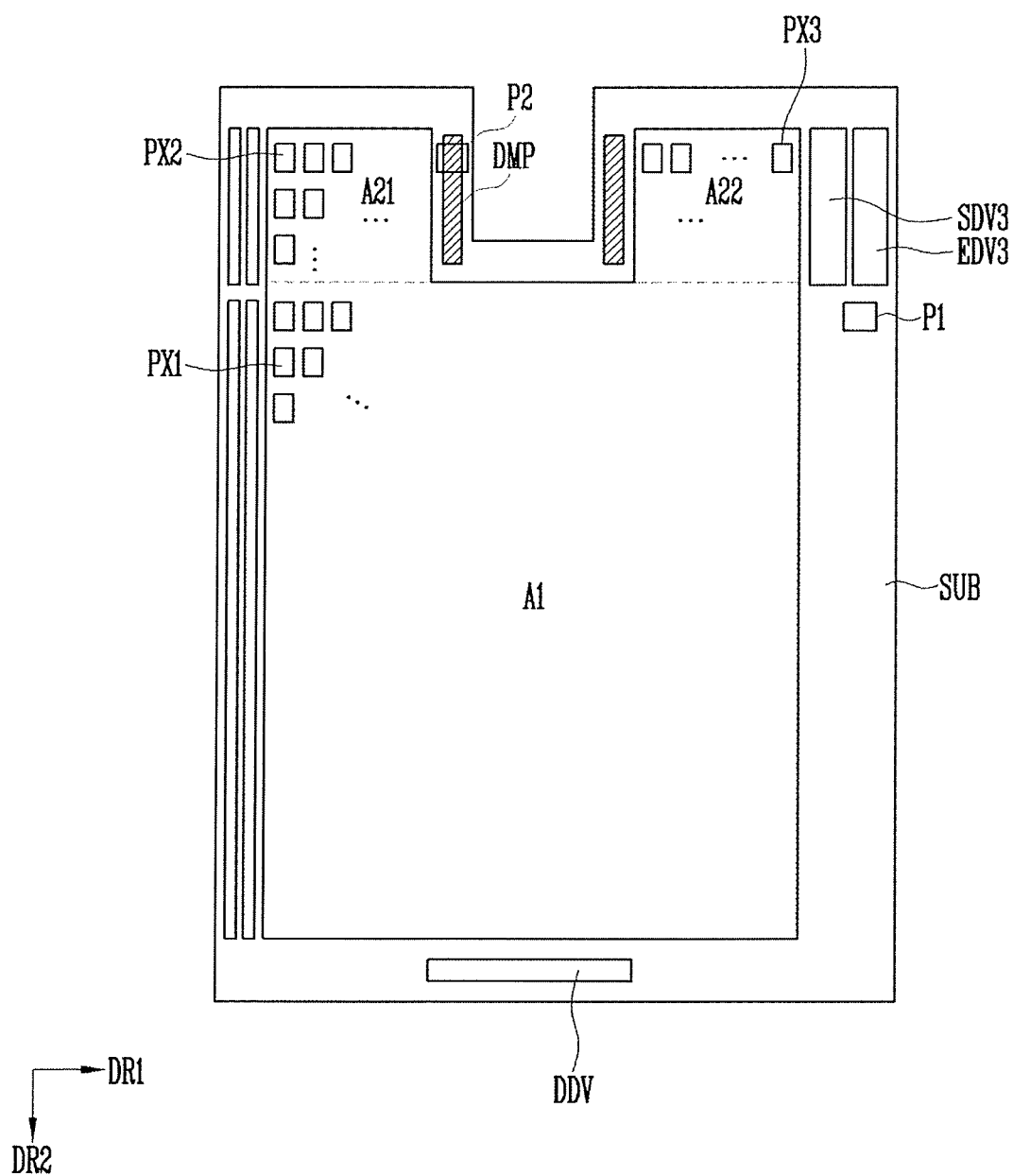
FIG. 14 is a plan view illustrating a display device in accordance with an exemplary embodiment of the present invention.
Figure 15A:
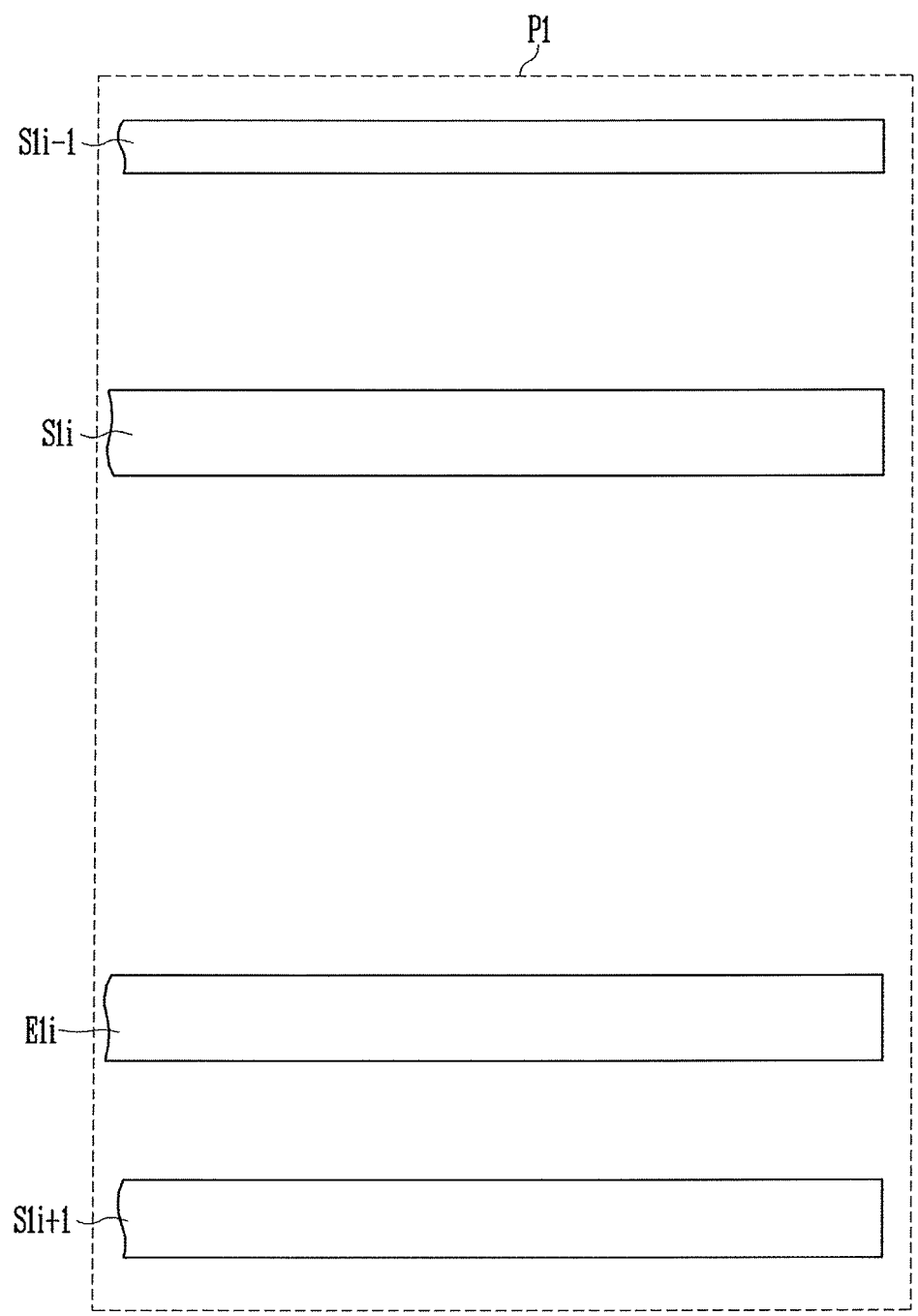
FIG. 15A is a plan view illustrating an area PI of FIG. 14 in accordance with an exemplary embodiment of the present invention.
Figure 15B:
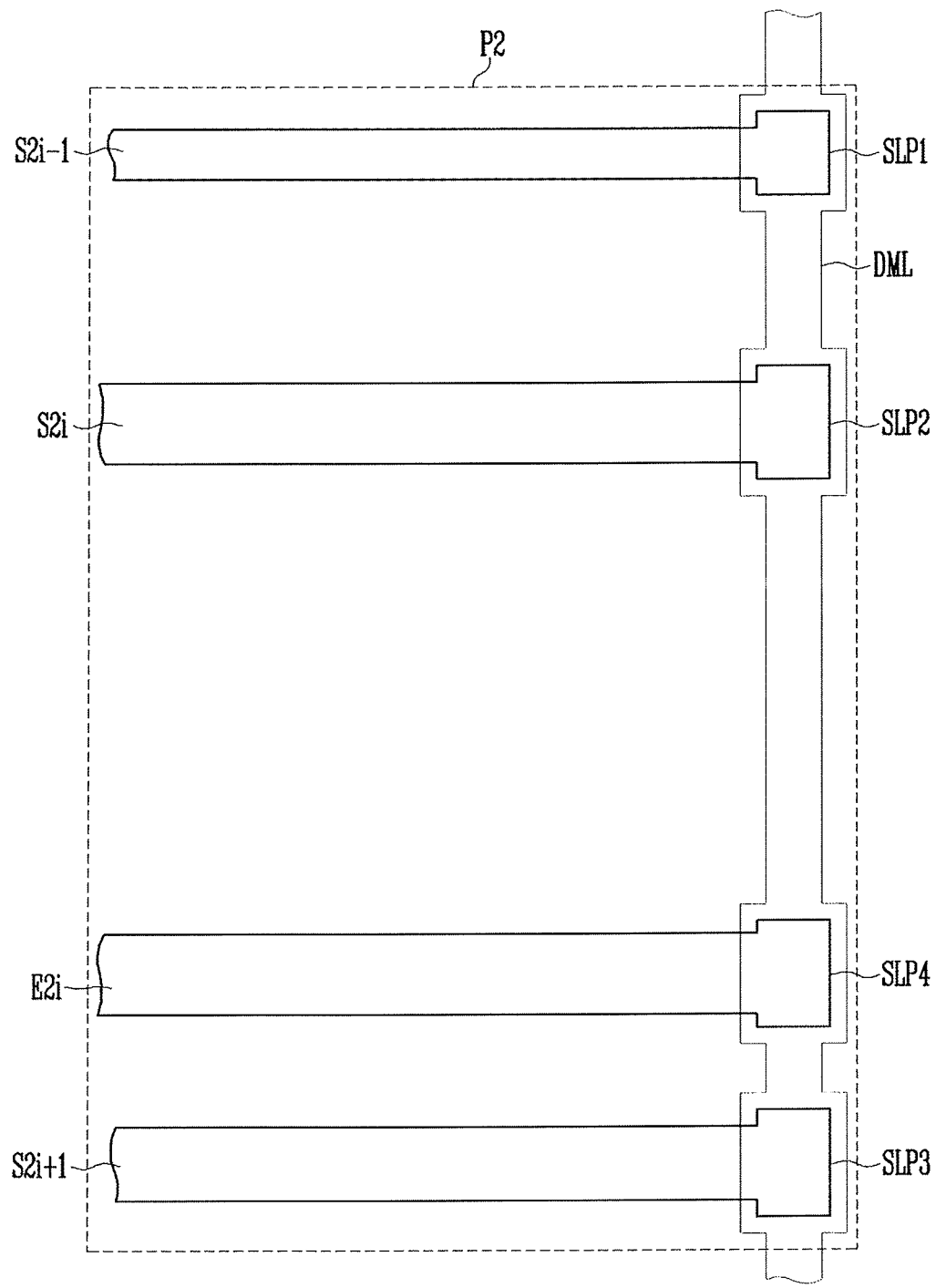
FIG. 15B is a plan view illustrating an area P2 of FIG. 14 in accordance with an exemplary embodiment of the present invention.

FIG. 14 is a plan view illustrating a display device in accordance with an exemplary embodiment of the present invention. The display device may include a peripheral regions PPA and a dummy unit DMP. FIG. 15A is a plan view illustrating an area PI of FIG. 14 in accordance with an exemplary embodiment of the present invention. FIG. 15B is a plan view illustrating an area P2 of FIG. 14 in accordance with an exemplary embodiment of the present invention. The areas P1 and P2 of FIGS. 15A and 15B may illustrate the scan lines corresponding to the pixels PXL.

Referring to FIGS. 14, 15A, and 15B, a structure for achieving parasitic capacitance may be employed by including the dummy unit DMP, when needed, in the peripheral region PPA corresponding to each pixel region PXA to compensate for the difference of the load values in each pixel region PXA. For example, the dummy unit DMP may be not provided in a first peripheral region PPA1 corresponding to the pixel region PXA1 to compensate the difference between the load values of the first scan lines S11 to S1$n$ in the first pixel region PXA1, but the dummy unit DMP may be provided in a second peripheral region PPA2 corresponding to the second pixel region PXA2.

In an exemplary embodiment of the present invention, the end portions of the first scan lines S1$i$−1, S1$i$ and S1$i$+1 and the first light emitting control line E1$i$ may be provided in the first peripheral region PPA1, and the end portions of the second scan lines S2i−1, S2i and S2i+1 and the second light emitting control line E2i may be provided in the second peripheral region PPA2. The dummy unit DMP may be not provided in the end portions of the first scan lines S1i−1, S1i and S1i+1 and the first light emitting control line E1i, but it may be provided in an area corresponding to end portions of the second scan lines S2i−1, S2i, and S2i+1 and the second light emitting control line E2i.

The dummy unit DMP may include a dummy line DML that overlaps the end portions of the second scan lines S2i−1, S2i and S2i+1 and the second light emitting control line E2i. A fixed voltage may be applied to the dummy line DML. Accordingly, the dummy line DML may be overlapped with the second scan lines S2i−1, S2i and S2i+1 and the second light emitting control line E2i, thereby forming a parasitic capacitor.

A voltage applied to the dummy line DML may have a fixed predetermined level, but the type of voltage is not limited. For example, the fixed voltage applied to the dummy line DML may be the first power supply ELVDD, the second power supply ELVSS, or a gate-on high-voltage Vgh.

The dummy line DML may overlap the second scan lines S2i−1, S2i and S2i+1 and the second light emitting control line E2i, thereby forming a parasitic capacitance. The formation position or the material of the dummy line DML may be not limited. In an exemplary embodiment of the present invention, the dummy unit DMP may be formed by using the same process with the same material as the power line PL. Accordingly, the dummy unit DMP may be formed in the same layer as the power line PL with the same material as the power line PL. The dummy line DML may overlap the (i−1)th second scan line S2i−1, the ith second scan line S2i, the (i+1)th second scan line S2i+1 and the second light emitting control line E2i, thereby forming the parasitic capacitance between the (i−1)th second scan line S2i−1, the ith second scan line S2i, the (i+1)th second scan line S2i+1 and the second light emitting control line E2i.

The parasitic capacitance may vary depending on an overlapping area of the dummy line DM1, and the (i−1)th second scan line S2i−1, the ith second scan line S2i, the (i+1)th second scan line S2i+1 and the second light emitting control line E2i. Therefore, to increase the parasitic capacitance, an (i−1)th second scan line pad SLP1, an ith second scan line pad SLP2, an (i+1)th second scan line pad SLP3 and an ith second light emitting control line pad SLP4 may be provided at each portion of the (i−1)th second scan line S2i−1, the ith second scan line S2i, the (i+1)th second scan line S2i+1 and the second light emitting control line E2i.

The (i−1)th second scan line pad SLP1, the ith second scan line pad SLP2, the (i+1)th second scan line pad SLP3 and the ith second light emitting control line pad SLP4 may have a greater width than the (i−1)th second scan line S2i−1, the ith second scan line S2i, the (i−1)th second scan line S2i+1 and the second light emitting control line E2i, respectively. Accordingly, an area of overlap between the dummy line DML and the (i−1)th second scan line pad SLP1, the ith second scan line pad SLP2, the (i+1)th second scan line pad SLP3 and the ith second light emitting control line pad SLP4 may be increased. The dummy line DML may be formed to be wide enough to cover the (i−1)th second scan line pad SLP1, the ith second scan line pad SLP2, the (i+1)th second scan line pad SLP3 and the ith second light emitting control line pad SLP4.

Accordingly, the additional load generated by the parasitic capacitance of the dummy unit DMP provided in the second peripheral region PPA2 may increase the load value of the second scan lines S2i−1, S2i and S2i+1 and the second light emitting control line E2i. Accordingly, the load values of the second scan lines S2i−1, S2i and S2i+1 and the second light emitting control line E2i in the second pixel region PXA2 may be compensated. As a result, the load values of the second scan lines S2i−1, S2i and S2i+1 and the second light emitting control line E2i and the first scan lines S1i−1, S1i and S1i+1 and the second light emitting control line E1i may be the same or substantially the same as each other.

In an exemplary embodiment of the present invention, for convenience of explanation, the first pixel PXL1 in the ith row of the first pixel region PXA1, the second pixel PXA2i in the ith row of the second pixel region PXA2, and the second pixel PXL2p in the pth row of the second pixel region PXL2 are described, but the present invention is not limited thereto. For example, the parasitic capacitance may vary depending on an area of the dummy unit overlapped with the second scan lines S21 to S2n and the second light emitting control lines E21 to E2n connected to the second pixels PXL2 in the kth (k≠i) row of the second pixel region PXA2 and the second pixels PXL2 in the pth row of the second pixel region PXA2.

In an exemplary embodiment of the present invention, when the lengths of the second scan lines S21 to S2n and the second light emitting control lines E32 to E2n in the second pixel region PXA2 are the same as each other, the load value compensated by the dummy unit DMP may be the same. In addition, when the lengths of the second lines S21 to S2n and the second light emitting control lines E21 to E2n in the second pixel region PXA2 are different from each other, the load value compensated by the dummy unit may be different from each other.

In an exemplary embodiment of the present invention, the dummy unit DMP may not be provided in the first peripheral region PPA1 corresponding to the first pixel region PXA1 to compensate the difference of the load values of the scan lines and the light emitting lines in the first pixel region PXA1 and the third pixel region PXA3. In addition, the dummy unit DMP may be not provided in the third peripheral region PPA3 corresponding to the third pixel region PXA3.

246 In an exemplary embodiment of the present invention, the end portions of the first scan lines S1i−1, S1i and S1i+1 and the first light emitting control line E1i may be extended to the first peripheral region PPA, but the present invention is not limited thereto. For example, unlike the second scan lines S2i−1, S2i and S2i+1, the second light emitting control line E2i or the third scan lines, the end portions of the first scan lines S1i−1, S1i, and S1i+1 and the first light emitting control line E1i may not be provided in the first peripheral region PPA1 because the parasitic capacitance may not need to be formed in the first scan lines S1i−1, S1i and S1i+1.

Further, according to an exemplary embodiment of the present invention, each dummy unit DMT may be implemented in a shape in which the parasitic capacitance is formed in three of scan lines provided for each pixel PXL, but the number of scan lines is not limited thereto. Depending on the structure of the pixel implemented in accordance with the display device, the number of scan lines in which the dummy unit DMT is provided may be set differently.

In addition, according to an exemplary embodiment of the present invention, although each dummy unit is implemented in the shape in which the dummy line DML forms the parasitic capacitance by overlapping the scan lines, the present invention is not limited thereto. For example, the dummy unit may be implemented in the shape in which the first power supply ELVDD line or the second power supply ELVSS line illustrated in FIGS. 4 to 6 overlap the scan lines.

Figure 16:
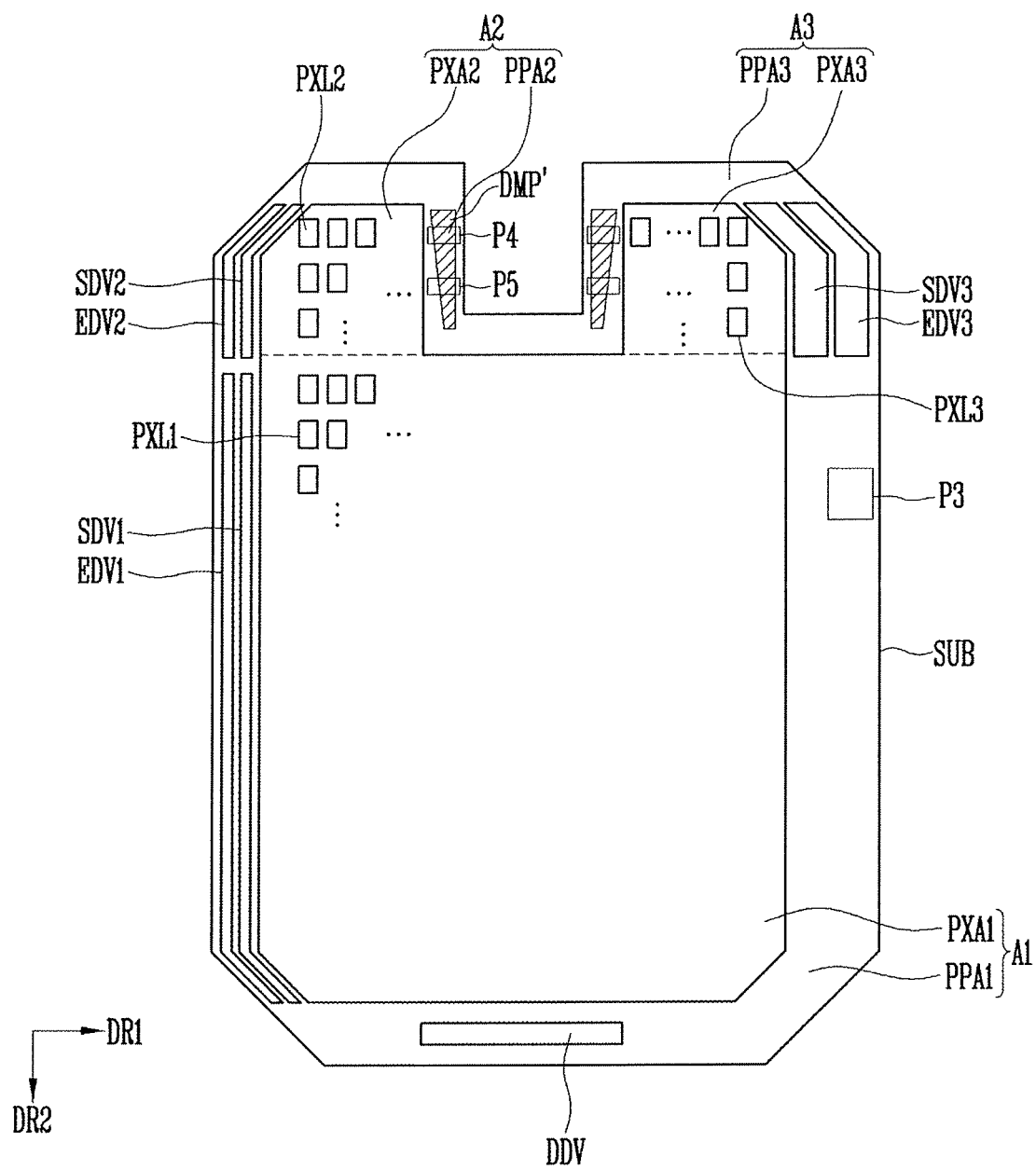
FIG. 16 is a plan view illustrating a display device in accordance with an exemplary embodiment of the present invention.
Figure 17:
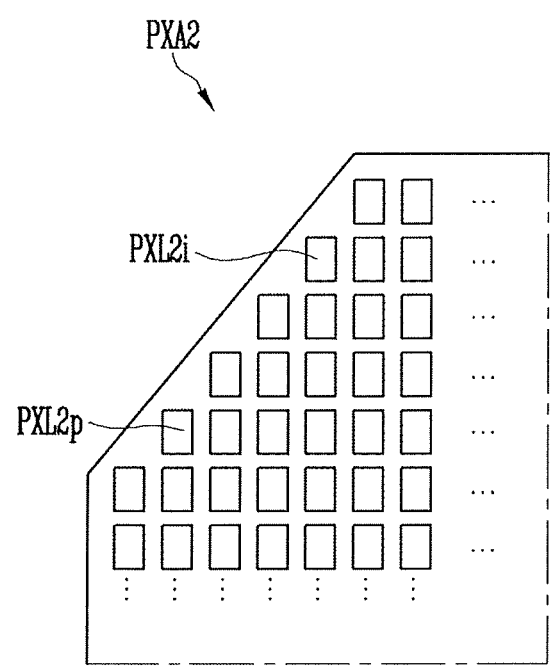
FIG. 17 is a plan view illustrating arrangement of second pixels in an oblique edge region of a second region of FIG. 16, in accordance with an exemplary embodiment of the present invention.
Figure 18A:
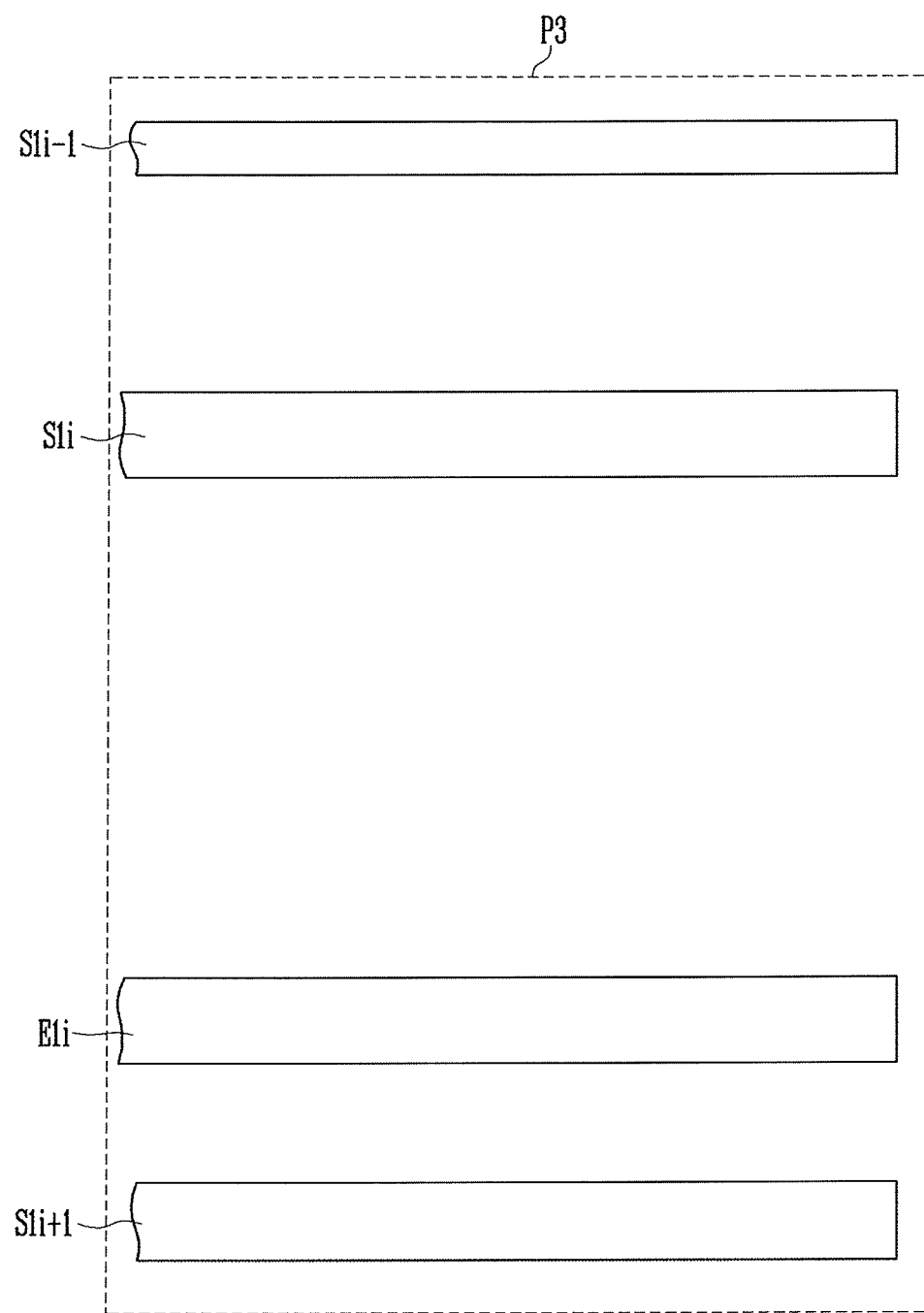
FIG. 18A is a plan view of an area P3 of FIG. 16 in accordance with an exemplary embodiment of the present invention.
Figure 18B:
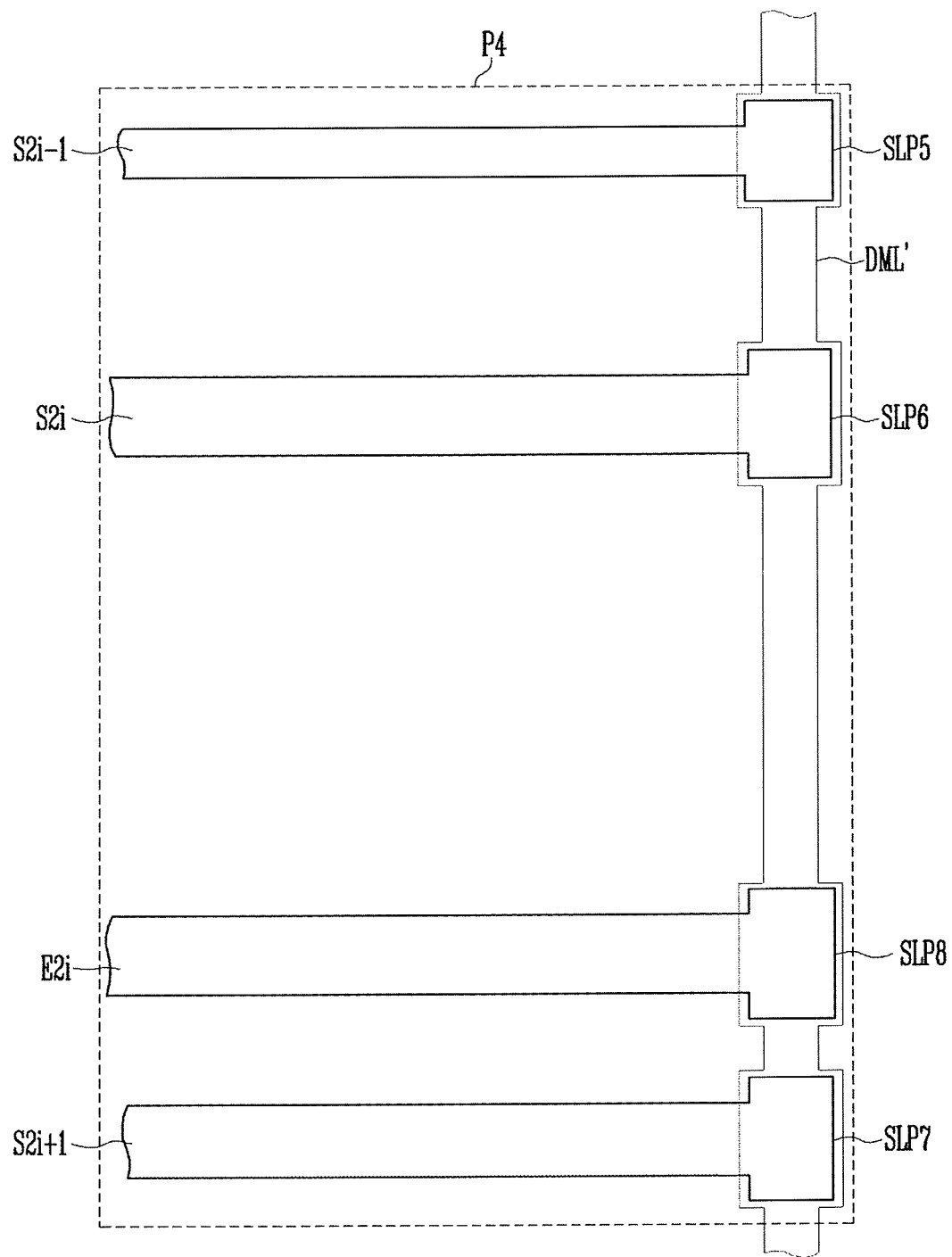
FIG. 18B is a plan view of an area P4 of FIG. 16 in accordance with an exemplary embodiment of the present invention.
Figure 18C:
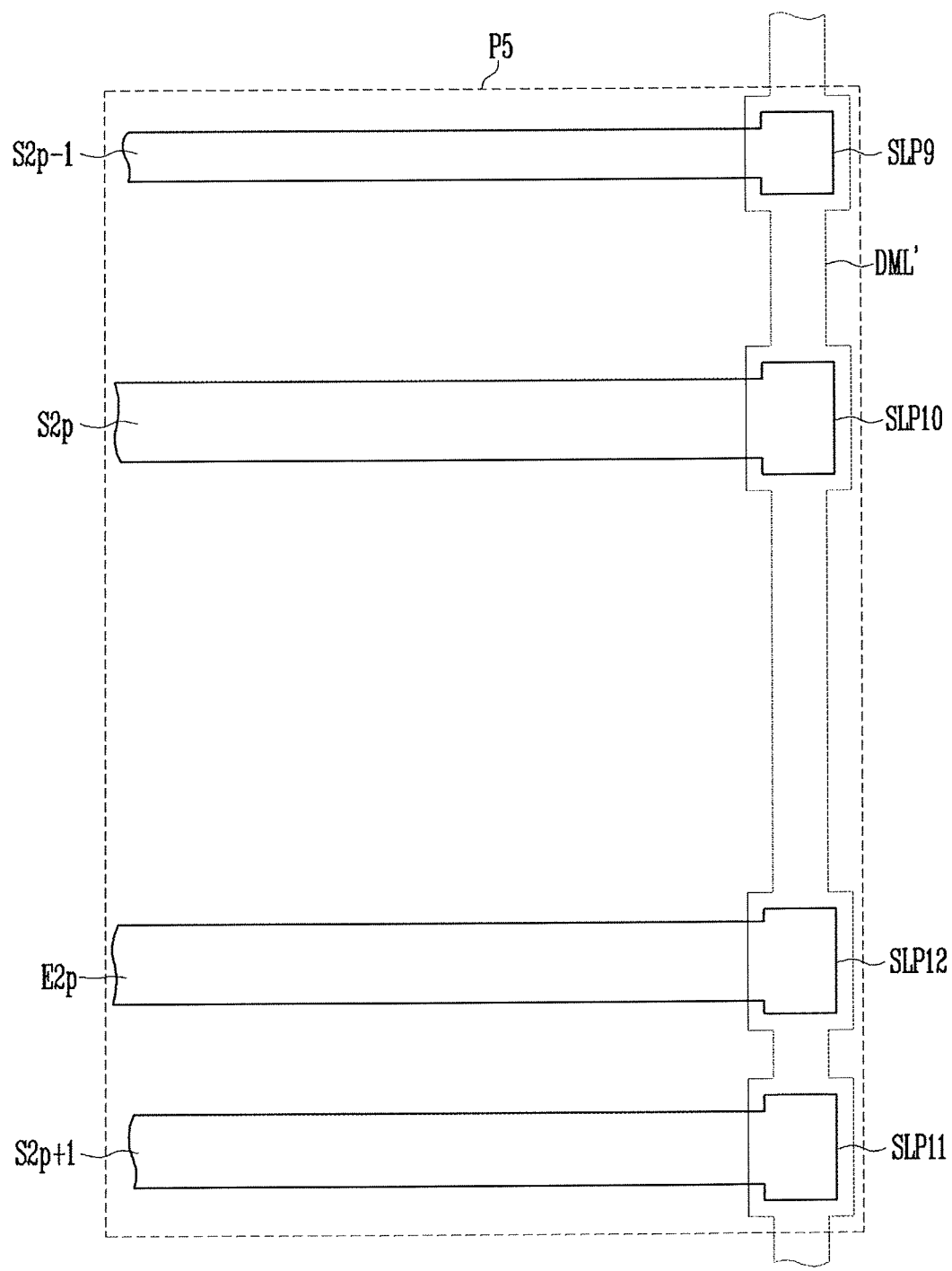
FIG. 18C is a plan view of an area P5 of FIG. 16 in accordance with an exemplary embodiment of the present invention.

FIG. 16 is a plan view illustrating a display device in accordance with an exemplary embodiment of the present invention. The display device of FIG. 16 may include a dummy unit in a peripheral region PPA. FIG. 17 is a plan view illustrating arrangement of second pixels PXL2 in an oblique edge region of the second region A2 of FIG. 16, in accordance with an exemplary embodiment of the present invention. FIG. 18A is a plan view of an area P3 of FIG. 16 in accordance with an exemplary embodiment of the present invention. FIG. 18B is a plan view of an area P4 of FIG. 16 in accordance with an exemplary embodiment of the present invention. FIG. 18C is a plan view of an area P5 of FIG. 16 in accordance with an exemplary embodiment of the present invention. The areas P3 to P5 illustrate scan lines connected to pixels PXL.

Referring to FIGS. 16, 17 and 18A to 18C, a structure for achieving parasitic capacitance may be employed by including the dummy unit DMP', when needed, in the peripheral region PPA corresponding to each pixel region PXA to compensate for the difference of the load values in each pixel region PXA. For example, the dummy unit DMP' may be not provided in a first peripheral region PPA1 corresponding to the pixel region PXA1 to compensate the difference between the load values of the first scan lines S11 to S n in the first pixel region PXA1, but the dummy unit DMP' may be provided in a second peripheral region PPA2 corresponding to the second pixel region PXA2.

In an exemplary embodiment of the present invention, the end portions of the scan lines S1$i$−1, S1$i$ and S1$i$+1 may be provided in the first peripheral region PPA1, the end portions of the second scan lines S2$i$ 1, S2$i$, S2$i$+1, S2$p$−1, S2$p$ and S2$p$+1 and the second light emitting control lines E2$i$ and E2$p$ may be provided in the second peripheral region PPA2. The dummy unit DMP' may be not provided in the end portions of the first scan lines S1$i$−1, S1$i$ and S1$i$+1 and the first light emitting control line E1$i$, but it may be provided in the regions corresponding to the end portions of the second scan lines S2$i$−1, S2$i$, S2$i$+1, S2$p$−1, S2$p$ and S$^2$p+1 and the second light emitting control lines E2$i$ and E2$p$.

The dummy unit DMP' may include the dummy line DML' that overlaps the end portions of the second scan lines S2$i$−1, S2$i$, S2$i$+1, S2$p$−1, S2$p$ and S2$p$+1 and the second light emitting control lines E2$i$ and E2$p$. A fixed voltage may be applied to the dummy line DML', to form a parasitic capacitor.

The dummy line DML' may generate a parasitic capacitance by overlapping the second scanning lines S2$i$−1, S2$i$, S2$i$+1, S2$p$−1, S2$p$ and S2$p$+1 and the second light emitting control lines E2$i$ and E2$p$. However, the formation position and the materials included in the dummy line DML' are not limited. In an exemplary embodiment of the present invention, the dummy unit DMP' may be formed by using the same process with the same material as the power line PL. Accordingly, the dummy unit DMP' may be formed in the same layer as the power line PL, and include the same material as the power line PL. The dummy unit DMP may overlap the (i−1)th second scan line S2$i$−1, the ith second scan line S2$i$, the (i+1)th second scan line S2$i$+1, the ith second light emitting control line E2$i$, the (p−1)th second scan line S2$p$−1, the pth second scan line S2$p$, the (p+1)th second scan line S2$p$+1, and the pth second light emitting control line E2$p$. Thus, the parasitic capacitor may be formed between the (i−1)th second scan line S2$i$−1, the ith second scan line S2$i$, the (i+1)th second scan line S2$i$+1, the ith second light emitting control line E2$i$, the (p−1)th second scan line S2$p$−1, the pth second scan line S2$p$, the (p+1)th second scan line S2$p$+1, the pth second light emitting control lines E2$i$ and E2$p$ and the dummy line DML'.

The parasitic capacitance may vary depending on the overlapping area in which the dummy line DML' overlaps the (i−1)th second scan line S2$i$−1, the ith second scan line S2$i$, the (i+1)th second scan line S2$i$+1, the (p−1)th second scan line S2$p$−1, the pth second scan line S2$p$, the (p+1)th second scan line S2$p$+1, the ith second light emitting control line E2$i$ and the pth second light emitting control line E2$p$. To increase the parasitic capacitance, an (i−1)th second scan line pad SLP5, an ith second scan line pad SLP6, an (i+1)th second scan line pad SLP7, an ith second light emitting control line pad SLP8, a (p−1)th second scan line pad SLP9, a pth second scan line pad SLP10, a (p+1)th second scan line pad SLP1 and a pth second light emitting control line pad SLP12 may be provided to the (i−1)th second scan line S2$i$−1, the ith second scan line S2$i$, the (i+1)th second scan line S2$i$+1, the (p−1)th second scan line S2$p$−1, the pth second scan line S2$p$, the (p+1)th second scan line S2$p$+1, and the second light emitting control lines E2$i$ and E2$p$.

The (i−1)th second scan line pad SLP5, the ith second scan line pad SLP6, the (i+1)th second scan line pad SLP7, the ith second light emitting control line pad SLP8, the (p−1)th second scan line pad SLP9, the pth second scan line pad SLP10, the (p+1)th second scan line pad SLP11 and the pth second light emitting control line pad SLP12 may have the greater width than the (i−1)th second scan line S2$i$−1, the ith second scan line S2$i$, the (i+1)th second scan line S2$i$+1, the (p−1)th second scan line S2$p$−1, the pth second scan line S2$p$, the (p+1)th second scan line S2$p$+1, respectively. Accordingly, an overlapping area of the (i−1)th second scan line S2$i$−1, the ith second scan line S2$i$, the (i+1)th second scan line S2$i$+1, the (p−1)th second scan line S2$p$−1, the pth second scan line S2$p$, the (p+1)th second scan line S2$p$+1 and the pth second light emitting control lines E2 and the dummy line DML' may be increased. The dummy line DML' may be formed to be wide enough to cover the (i−1)th second scan line pad SLP5, the ith second scan line pad SLP6, the (i+1)th second scan line pad SLP7, the ith second light emitting control line pad SLP8, the (p−1)th second scan line pad SLP9, the pth second scan line pad SLP10, the (p+1)th second scan line pad SLP11 and the pth second light emitting control line pad SLP12.

Accordingly, the load by the parasitic capacitance additionally generated by the dummy unit DMP' provided in the second peripheral region PPA2 may be increased in the second scan lines S2$i$−1, S2$i$, S2$i$+1, S2$p$−1, S2$p$ and S2$p$+1 and the second light emitting control lines E2$i$ and E2$p$. The load values of the second scan lines S2$i$−1, S2$i$, S2$i$+1, S2$p$−1, S2$p$ and S2$p$+1 and the second light emitting control lines E2$i$ and E2$p$ in the second pixel region PXA2 and the first scan lines S1$i$−1, S1$i$ and S1$i$+1 and the first light emitting control line E1$i$ in the first pixel region PXA1 may be same or substantially the same as each other.

The areas of the (i−1)th second scan line pad SLP5, the ith second scan line pad SLP6, the (i+1)th second scan line pad SLP7, the ith second light emitting control line pad SLP8 may be larger than the areas of the (p−1)th second scan line pad SLP9, the pth second scan line pad SLP10, the (p+1)th second scan line pad SLP11 and the pth second light emitting control line pad SLP12. This is because the second scan lines S2$i$−1, S2$i$ and S2$i$+1 and the second light emitting control line E2$i$ are shorter than the scan lines S2$i$−1, S2$i$, S2$i$+1 and S2$p$−1.

Therefore, the parasitic capacitance formed by the dummy line DML' and the (i−1)th second scan line pad SLP5, the ith second scan line pad SLP6, the (i+1)th second scan line pad SLP7, the ith second light emitting control line pad SLP8 may be larger than the parasitic capacitance formed by the dummy line DML' and the (p−1)th second scan line pad SLP9, the pth second scan line pad SLP10, the (p+1)th second scan line pad SLP111 and the pth second light emitting control line pad SLP12.

Accordingly, the load values of the shorter scan lines S2$i$−1, S2$i$, S2$i$+1 and the shorter second light emitting control lines E2$i$ may be equal or substantially equal to the load values of the longer second scan lines S2$p$−1, S2$p$ and S2$p$+1 and the second light emitting control line E2$p$.

In an exemplary embodiment of the present invention, for convenience of explanation, the first pixel PXL1 in the ith row of the first pixel region PXA1, the second pixel PXA2$i$ in the ith row of the second pixel region PXA2, and the second pixel PXL2$p$ in the pth row of the second pixel region PXL2 are described, but the present invention is not limited thereto. For example, the parasitic capacitance may vary depending on an area of the dummy unit overlapped with the second scan lines S21 to S2$n$ and the second light emitting control lines E21 to E2$n$ connected to the second pixels PXL2 in the kth (k≠i) row of the second pixel region PXA2 and the second pixels PXL2 in the pth row of the second pixel region PXA2.

In addition, the dummy unit DMP' may be not provided in the first peripheral region PPA1 corresponding to the first pixel region PXA1 to compensate the difference of the load values of the scan lines and the light emitting lines in the first pixel region PXA1 and the third pixel region PXA3. In addition, the dummy unit DMP' may be not provided in the third peripheral region PPA3 corresponding to the third pixel region PXA3.

In an exemplary embodiment of the invention, the end portions of the first scan lines S1$i$−1, S1$i$ and S1$i$+1 and the first light emitting control line E1$i$ may be extended to the first peripheral region PPA1 as described above, but the present invention is not limited thereto. For example, unlike the end portions of the second scan lines S2$i$−1, S2$i$, S2$i$+1, S2$p$−1, S2$p$ and S2$p$+1, the second light emitting control lines E2$i$ and E2$p$, and the third scan lines S31 to S3$n$, the end portions of the first scan lines S1$i$−1, S1$i$ and S1$i$+1 and the first light emitting line E1$i$ may be not provided in the first peripheral region PPA1 because the parasitic capacitance may not need to be formed in the first scan lines S1$i$−1, S1$i$ and S1$i$+1 and the first light emitting line E1$i$. In addition, according to an exemplary embodiment of the present invention, the dummy unit may be implemented in the shape in which the parasitic capacitance is formed in the three of the scan lines provided in each pixel, but the number of scan lines is not limited thereto. Depending on the structure of the pixel implemented in accordance with the display device, the number of scan lines provided with the dummy unit may be set differently.

In an exemplary embodiment of the present invention, the dummy unit for compensating the difference between the load values in accordance with the difference in length of the scan lines is disclosed, but the type of wire line is not limited thereto. According to an exemplary embodiment of the invention, in the case of the difference of the load values due to the difference in length of the wire lines included in the wire unit, and the dummy unit may be employed in wiring lines in the different areas of the substrate SUB. For example, when a portion of the first to third pixel regions PXA1 to PXA3 as shown in FIG. 2 have a diagonal side, the length difference of the scan lines in accordance with a width change in the pixel region PXA2 or PXA3 may occur in a pixel region corresponding to the diagonal side. In this case, the difference of the load value may be compensated by additionally forming the dummy unit for each pixel in accordance with the load value depending on the length of each scan line.

In an exemplary embodiment of the present invention, the dummy unit for compensating the difference of the load value in accordance with the length difference of the scan lines is individually described, but a plurality of dummy units may be combined with each other.

Figure 19:
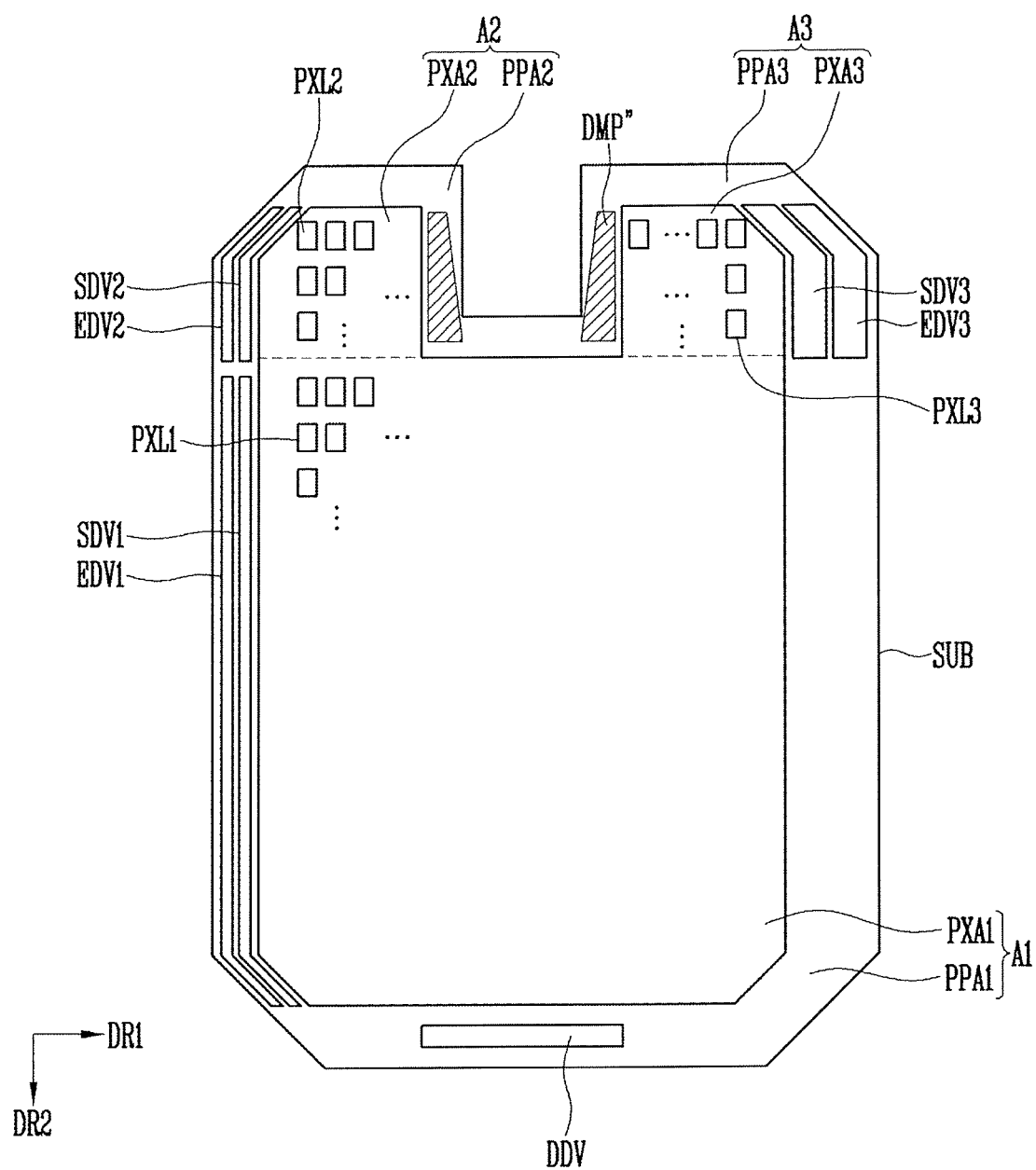
FIG. 19 is a plan view illustrating a display device in accordance with an exemplary embodiment of the present invention.
Figure 20:
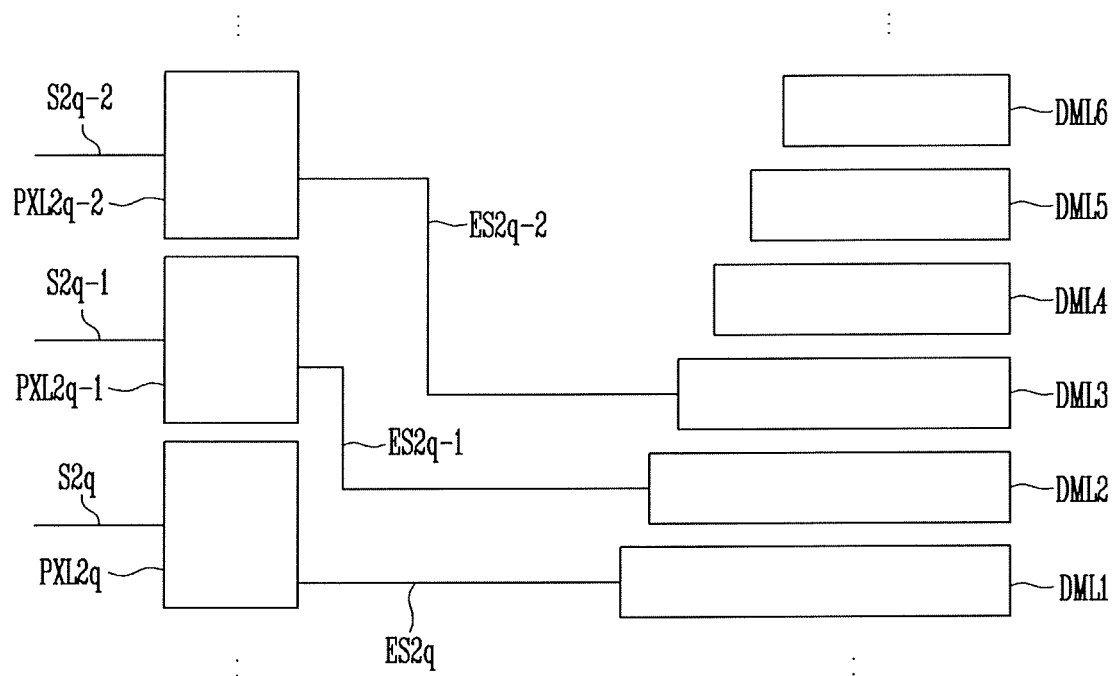
FIG. 20 is a view illustrating a dummy load connection scheme of second pixels arranged in a second pixel region in accordance with an exemplary embodiment of the present invention.

FIG. 19 is a plan view illustrating a display device in accordance with an exemplary embodiment of the present invention. The display device of FIG. 19 includes a dummy unit DMP''' in the peripheral region PPA. FIG. 20 is a view illustrating a dummy load connection scheme of second pixels PXL2 arranged in a second pixel region PXA2 in accordance with an exemplary embodiment of the present invention.

In FIG. 20, second pixels PXL2$q$, PXL2$q$−1 and PXL2$q$−2, second scan lines S2$q$, S2$q$−1 and S2$q$−2 which are arranged in the (q−1)th row and the (q−2)th column, the second scan lines S2$q$, S2$q$−1 and S2$q$−2, and a plurality of dummy loads DML1, DML2, DML3, DML4, DML5 and DML6 are illustrated. The qth row, among the qth, the (q−1)th and the (q−2)th row, may be most adjacent to the first region A1.

Referring to FIGS. 19 and 20, a structure for achieving parasitic capacitance may be employed by including the dummy unit DMP''' in the peripheral region PPA corresponding to each pixel region PXA to compensate for the difference of the load values in each pixel region PXA. For example, the dummy unit DMP''' may be not provided in a first peripheral region PPA1 corresponding to the pixel region PXA1 to compensate the difference between the load values of the first scan lines S11 to S1$n$ in the first pixel region PXA1, but the dummy unit DMP''' may be provided in a second peripheral region PPA2 corresponding to the second pixel region PXA2. The dummy unit DMP''' may include a plurality of dummy loads DML1, DML2, DML3, DML4, DML5 and DML6 with different load values, and the dummy loads DML1, DML2, DML3, DML4, DML5 and DML6 may be respectively connected to the second scan lines S2$q$, S2$q$−1, S2$q$−2, etc., thereby compensating the load values of the second scan lines S2$q$, S2$q$−1, S2$q$−2, etc.

Among the second scan lines S2$q$, S2$q$−1 and S2$q$−2, the load value of a dummy load connected to a second scan line of a longer length may be greater than the load value of a dummy load connected to a second scan line of a shorter length. Among the dummy loads DML1, DML2, DML3, DML4, DML5 and DML6, the load value of the first dummy load DML1 is the largest and the load values of the dummy loads DML1, DML2, DML3, DML4, DML5 and DML6 load value may be gradually reduced.

For example, a length of the second scan line S2$q$ connected to the second pixel PXL2$q$ in the qth row in the second pixel region PXA2 may be greater than a length of the second scan line S2$q$-1 connected to the second pixel PXL2$q$−1 in the (q−1)th row and a length of the second line S2$q$−1 connected to the second pixel PXL2$q$−2 in the (q−2)th row may be greater than a length of the second scan line S2$q$−2 connected to the second pixel PXL2$q$−2 in the (q−2)th row. In addition, the second scan line S2$q$ in the qth row may be connected to the first dummy load DML1, the second scan line S2$q$−1 in the (q−1)th row may be connected to the second dummy load DML2 having a smaller load value than the first dummy load DML1, and the second scan line S2$q$−2 in the (S2$q$−2)th row may be connected to the third dummy load DML3 having a smaller load value than the second dummy load DML2.

A length of an extending unit of the second scan line ES2$q$ connecting the second pixel PXL2$q$ in the qth row to the first dummy load DML1 in the second pixel region PXA2 may be shorter than a length of an extending unit of the second scan line ES2$q$-1 connecting the second pixel PXL2$q$-1 in the (q-1)th row to the second dummy load DML2. The length of an extending unit of the second scan line ES2$q$-1 connecting the second pixel PXL2$q$-1 in the (q-1)th row to the second dummy load DML2 may be shorter than a length of an extending unit of the second scan line ES2$q$-2 connecting the second pixel PXL2$q$-2 in the (q-2)th row to the third dummy load DML3. For example, the length of the second scan line connecting the second pixel connected to a longer second scan line to the dummy load may be smallest. As the length of the second scan lines become shorter, the length of the extending unit may gradually increase.

The above description has been provided as an example, but the present invention is not limited thereto. For example, the ith second scan line, the (i-1)th second scan line, the (i+1)th second scan line and the ith light emitting control line may be connected to other second pixels PXL2.

In an exemplary embodiment of the present invention, the parasitic capacitances of the lines of the second region A2 and the third region A3 may be gradually changed in accordance with a distance from the first region A1. A gradual change in the parasitic capacitance may change a charging rate between the first region A1 and the second region A2 or between the first region A1 and the third region A3.

A display device according to an exemplary embodiment of the present invention may be employed in various electronic devices. For example, the display device may be implemented to a television (TV) set, a laptop, a mobile phone, a smart phone, a smart pad, a PMP, a PDA, various types of wearable devices such as a smart watch, etc.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:
1. A display device, comprising:
a substrate;
a first pixel and a second pixel provided in the substrate;
a first scan line connected to the first pixel and a second scan line connected to the second pixel; and
a dummy unit overlapping the first scan line and the second scan line,
wherein the first scan line is shorter than the second scan line, and
wherein an overlapping area between the dummy unit and the first scan line is greater than an overlapping area between the dummy unit and the second scan line.
2. The display device of claim 1, further comprising a data line tbr providing the first pixel and the second pixel with a data signal,
wherein the first scan line provides a scan signal to the first pixel, and the second searr line provides the scan signal to the second pixel.
3. The display device of claim 2, further comprising a power line for providing the first pixel and the second pixel with power,
wherein the dummy unit is connected to the power line.
4. The display device of claim 3, wherein the dummy unit is provided on a same layer as the power line, and the dummy unit includes a same material as the power line.
5. The display device of claim 4, wherein the dummy writ protrudes from the power line and the dummy unit is integrally formed with the power line.
6. The display device of claim 2, wherein the second pixel comprises a transistor connected to the second scan line and the data line, wherein the transistor comprises:
an active pattern provided on the substrate;
a gate electrode provided on the active pattern;
a gate insulating layer interposed between the active pattern and the gate electrode; and
a source electrode and a drain electrode connected to the active pattern, wherein the dummy unit is provided on a same layer as the active pattern and includes a same material as the active pattern.
7. The display device of claim 6, wherein the dummy unit protrudes from the active pattern, and the dummy unit is integrally formed with the active pattern.
8. The display device of claim 2, wherein the substrate comprises a pixel region in which the first and second pixels are provided and a peripheral region bordering the pixel region, and
the dummy unit is provided in the peripheral region and includes a dummy line overlapped with an end portion of the first scan line and the second scan line.
9. The display device of claim 8, wherein a fixed voltage is applied to the dummy line.
10. The display device of claim 9, further comprising a power line for providing the first pixel and the second pixel with power,
wherein the dummy line receives a same voltage as the power line.
11. The display device of claim 8, further comprising:
a first scan line pad provided at the end portion of the first scan line,
a second scan line pad provided at the end portion of the second scan line,
wherein the dummy line covers the scan line pad.
12. The display device of claim 11, wherein an overlapping area between the dummy unit and the first scan line pad is greater than an overlapping area between the duntray unit and the second scan line pad.
13. The display device of claim 2, wherein the substrate comprises a pixel region in which the first and second pixels are provided and a peripheral region bordering the pixel region, and
wherein the dummy unit is provided in the peripheral region, and the dummy unit is configured to provide a plurality of dummy loads having different load values.
14. The display device of claim 13, wherein each of the first and second scan lines is electrically connected to the dummy unit to receive at least one of the plurality of dummy loads, and
a load value of a dummy load received by the first scan line is different than a load value of a dummy load received by the second scan line.
15. The display device of claim 14, wherein the load value of each of the plurality of dummy loads is reduced from the dummy load connected to the second scan line to the dummy load connected to the first scan line.
16. The display device of claim 1, wherein the substrate comprises:
a first pixel region; and a second pixel region having a smaller area than the first pixel region, the second pixel region being connected to the first pixel region;

wherein the first pixel and the second pixel are provided in the second pixel region.

17. The display device of claim 16, further comprising:
a third pixel provided in the first pixel region; and
a third scan line for providing the third pixel with a scan signal,
wherein the third scan line has a longer length than the first scan line and the second scan line, and
wherein the dummy unit does not overlap the third scan line.

18. The display device of claim 17, wherein the substrate further comprises a third pixel region spaced apart from the second pixel region and connected to the first pixel region.

19. The display device of claim 18, further comprising:
a fourth pixel provided in the third pixel region; and
a fourth scan line for providing the fourth pixel with a scan signal,
wherein the fourth scan line has a shorter length than at least one of the first to third scan lines.

20. The display device of claim 19, further comprising an additional dummy unit overlapping the fourth scan line.

* * * * *